United States Patent
Nakagawa et al.

[11] Patent Number: 6,111,833
[45] Date of Patent: Aug. 29, 2000

[54] DATA DECODER

[75] Inventors: Toshiyuki Nakagawa, Kanagawa; Hiroyuki Ino, Chiba; Shunji Yoshimura; Shinichi Kai, both of Tokyo, all of Japan

[73] Assignee: Sony Corporation, Tokyo, Japan

[21] Appl. No.: 08/930,162

[22] PCT Filed: Feb. 7, 1997

[86] PCT No.: PCT/JP97/00336

§ 371 Date: Oct. 3, 1997

§ 102(e) Date: Oct. 3, 1997

[87] PCT Pub. No.: WO97/29485

PCT Pub. Date: Aug. 14, 1997

[30] Foreign Application Priority Data

Feb. 8, 1996 [JP] Japan .................... P8-022530

[51] Int. Cl.⁷ .................................................. G11B 7/00
[52] U.S. Cl. ........................ 369/59; 369/48; 369/124
[58] Field of Search .............................. 369/59, 124, 47, 369/48; 360/39, 40, 45

[56] References Cited

U.S. PATENT DOCUMENTS

| | | | |
|---|---|---|---|
| 4,488,142 | 12/1984 | Franaszek | 369/59 |
| 4,685,098 | 8/1987 | Yoshida | 369/59 |
| 5,444,680 | 8/1995 | Umezawa et al. | 369/32 |
| 5,566,155 | 10/1996 | Hayashi | 369/59 |
| 5,606,540 | 2/1997 | Hayashi | 369/59 |
| 5,625,632 | 4/1997 | Ishida et al. | 714/769 |

FOREIGN PATENT DOCUMENTS

| | | |
|---|---|---|
| 0 836 186 | 4/1998 | European Pat. Off. . |
| 5-198100 | 8/1993 | Japan . |

*Primary Examiner*—Thang V. Tran
*Attorney, Agent, or Firm*—Frommer Lawrence & Haug, LLP; William S. Frommer

[57] ABSTRACT

In a data decoding apparatus of this invention, level of a reproduction RF signal 7a at the time of the binary level judgment of channel bit is temporarily stored into a RF signal level memory section 20. The portions which do not satisfy the conditions of the minimum run length and the maximum run length of the same symbols within the channel bit data train are respectively detected by a (d'−1) detecting section 16 and a (k'+1) detecting section 17. This data decoding apparatus comprises correction bit position detecting sections 18, 19 for outputting correction bit position designation signals on the basis of level of the RF signal at the time of the binary level judgment stored in the RF signal level memory section 20, and a bit data inversion correcting section 15 for inverting logic level of data at bit position designated on the basis of the correction bit position designation signals 18a, 18b, 19a, 19b. In the case where there exists any portion which does not satisfy the conditions of the minimum run length and/or the maximum run length of the same symbols within channel bit data obtained by binarizing a signal which has been read out from the recording medium, correction is implemented to the channel bit data, thereby making it possible to improve the bit error rate, and to ensure skew margin.

54 Claims, 25 Drawing Sheets

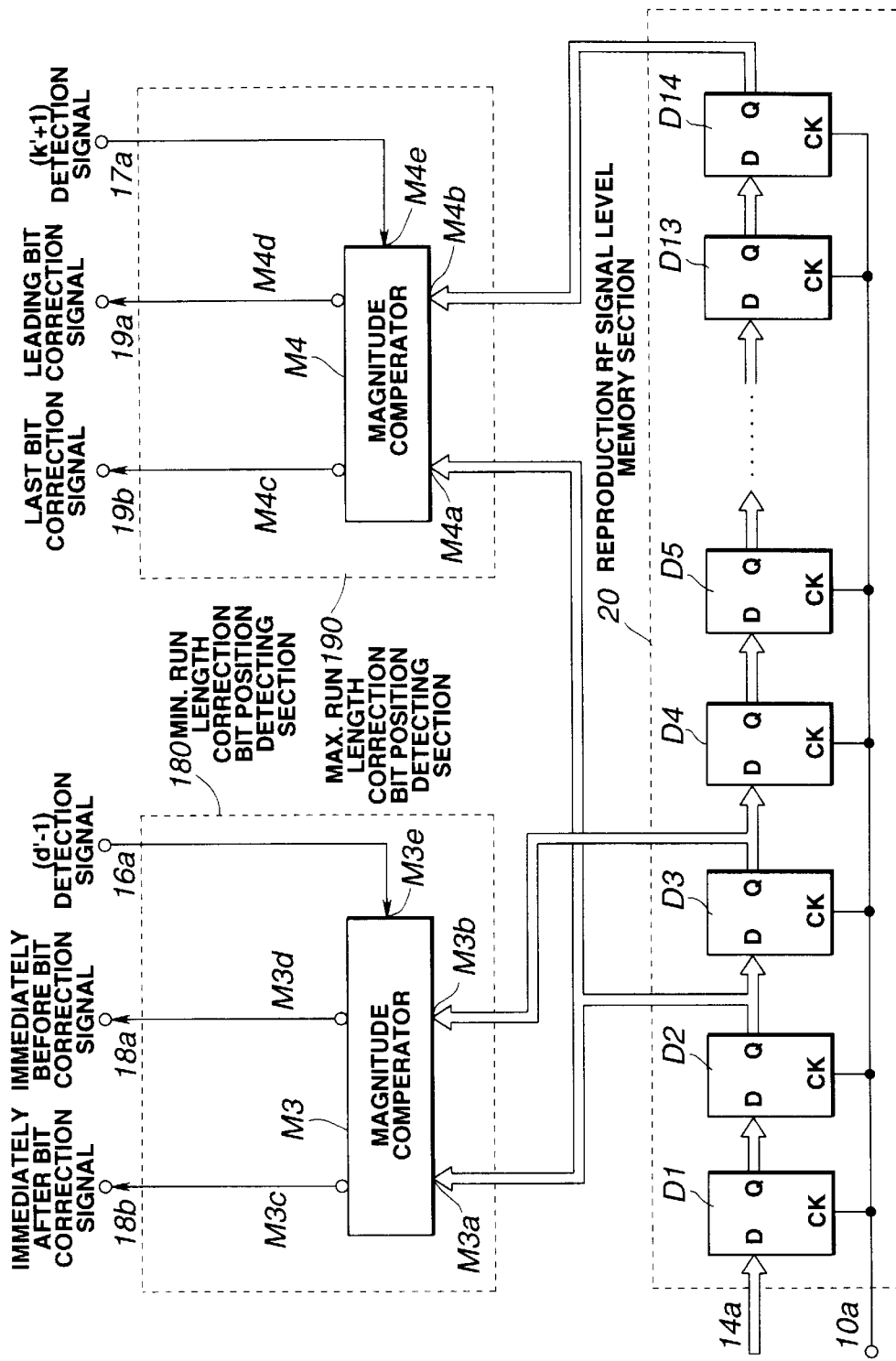

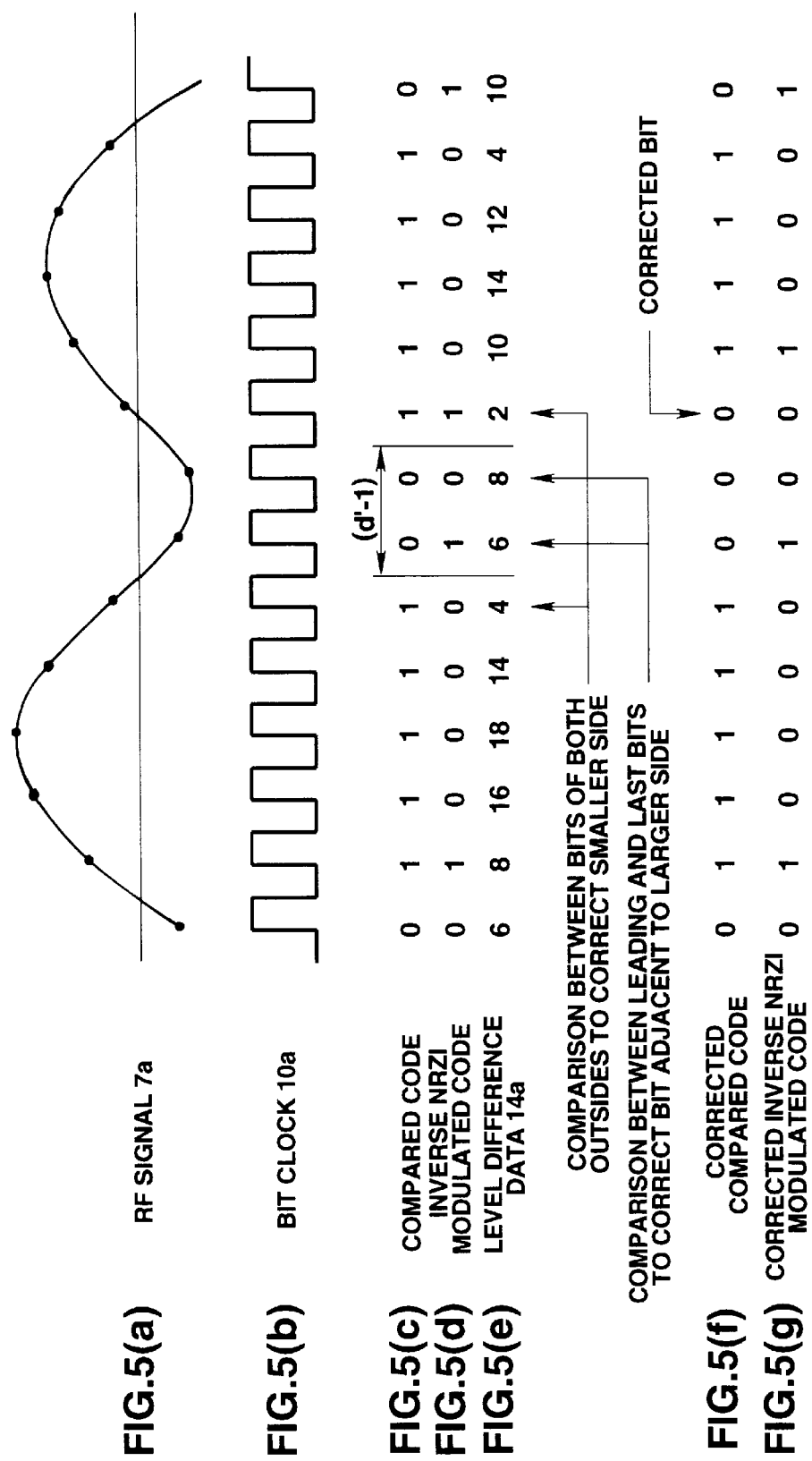

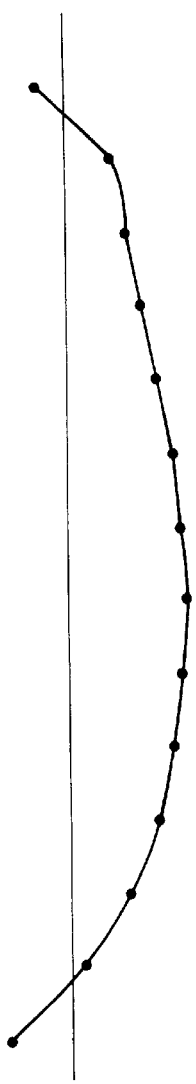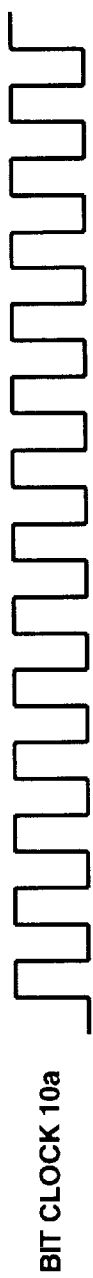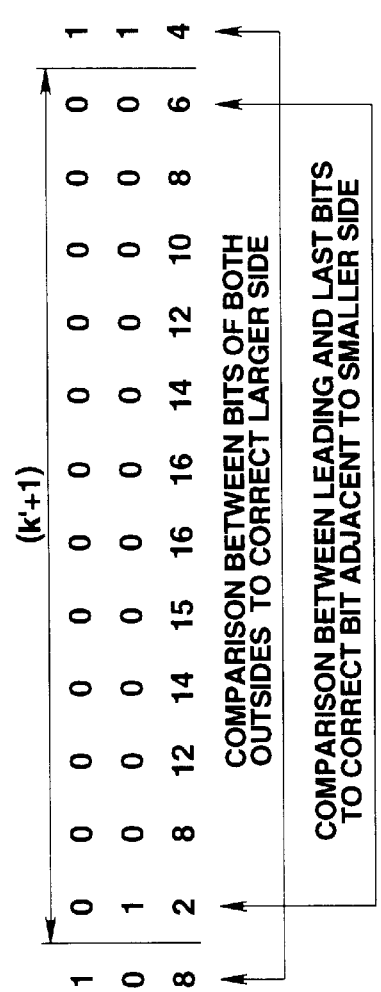
FIG.6(a) RF SIGNAL 7a
FIG.6(b) BIT CLOCK 10a
FIG.6(c) COMPARED CODE
FIG.6(d) INVERSE NRZI MODULATED CODE
FIG.6(e) LEVEL DIFFERENCE DATA 14a
FIG.6(f) CORRECTED COMPARED CODE
FIG.6(g) CORRECTED INVERSE NRZI MODULATED CODE

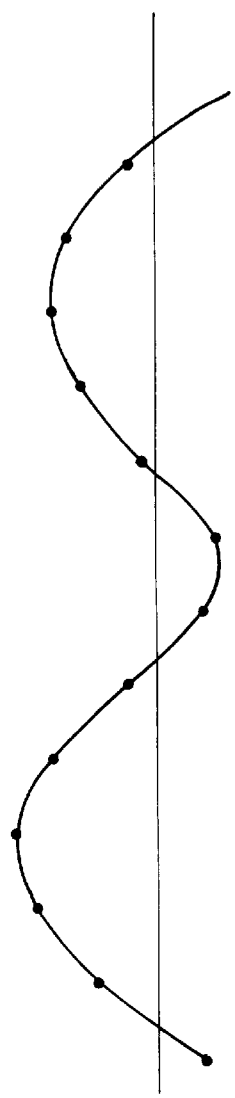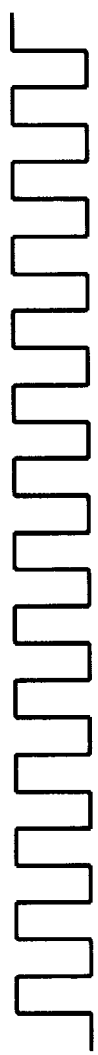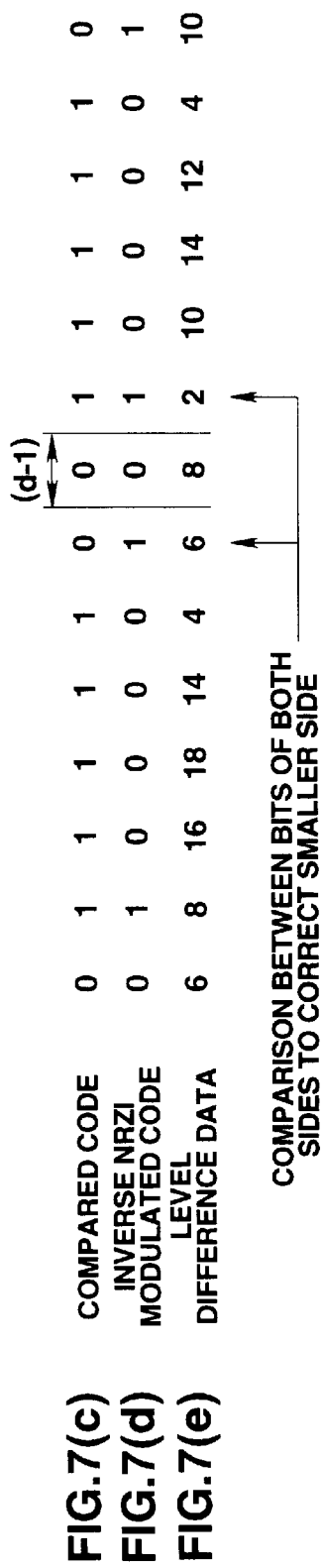

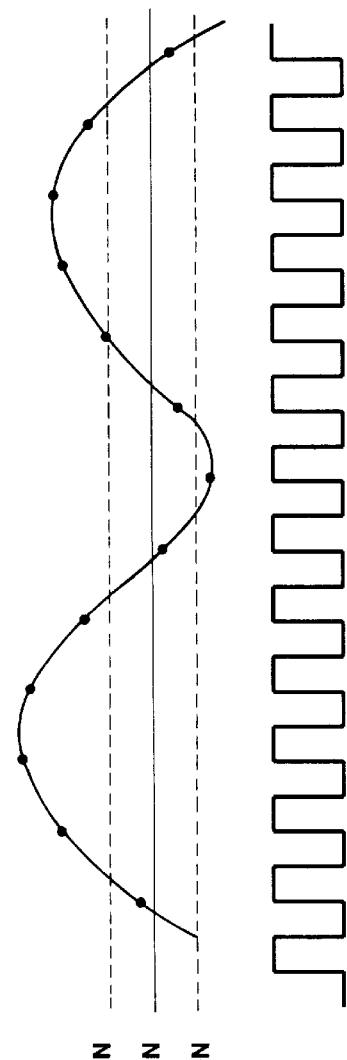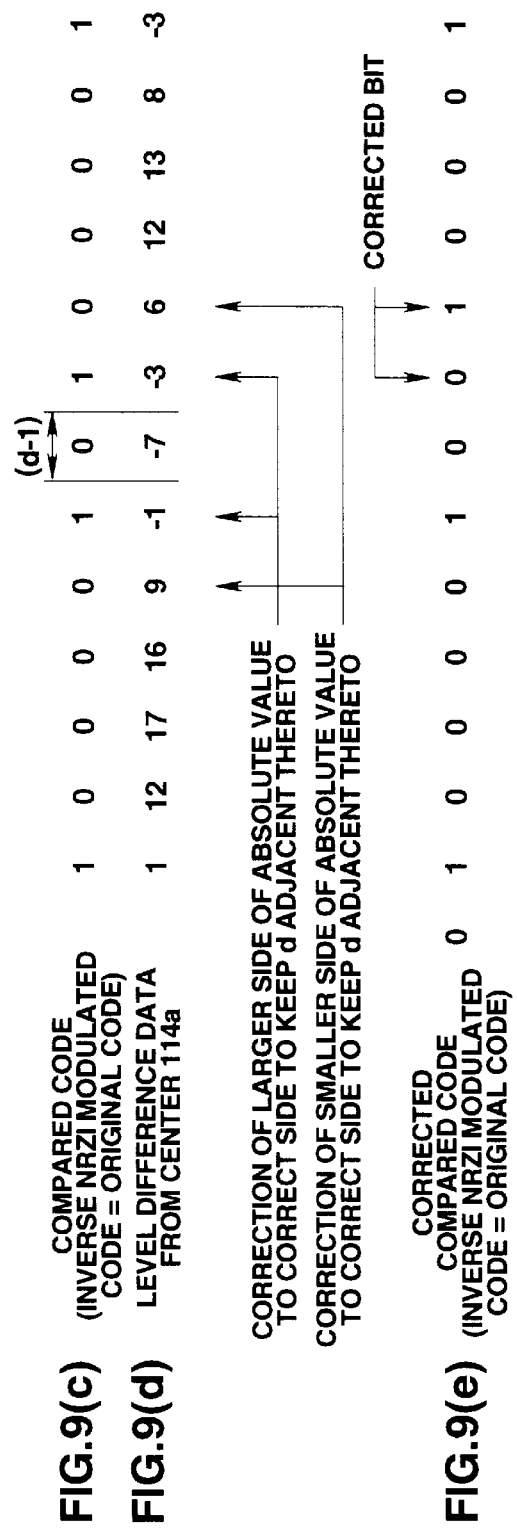

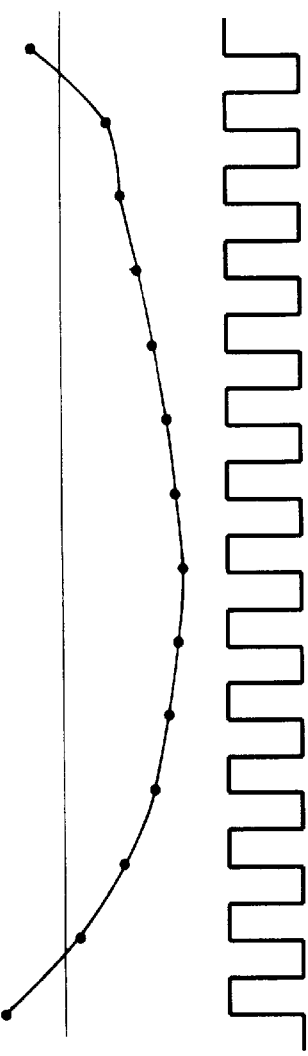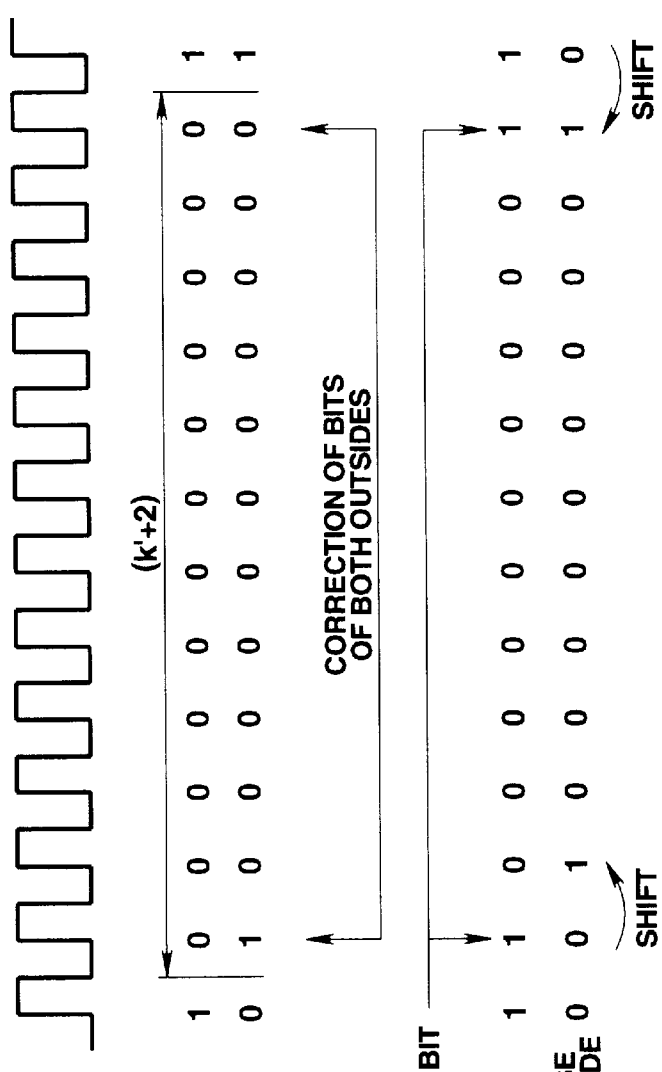
FIG.25(a) FIG.25(b) FIG.25(c) FIG.25(d) FIG.25(e) FIG.25(f)

DATA DECODER

TECHNICAL FIELD

This invention relates to a data decoding apparatus adapted for decoding, on the basis of at least one comparison level, a reproduction RF signal which has been read out from a recording medium on which information are recorded by using RLL (Run Length Limited) codes to output channel bit data, and more particularly to a data decoding apparatus such that in the case where any portion which does not satisfy the condition of the minimum run length or the maximum run length of the same symbols exists in channel bit data, bit of high probability considered to be bit error is selected on the basis of reproduction RF signal level when level judgment is carried out to correct the selected bit to output channel bit data which satisfies the conditions of the minimum run length and the maximum run length of the same symbols.

BACKGROUND ART

In transmitting data, or recording data onto a recording medium, e.g., magnetic disc, optical disc or magneto-optical disc, etc., modulation of data is carried out so as to become in conformity with transmission or recording. Block encoding is known as one of such modulation systems. This block encoding is adapted to block data train into units consisting of m×i bits (hereinafter referred to as data words) to convert such data words into code words consisting of n×i bits in accordance with the suitable code rule. In this case, when i is equal to 1, this code word is caused to be fixed length code, while when plural values can be selected as i, i.e., i is equal to 2 or more and conversion is made by i max=r which is the maximum i, that code word is caused to be variable length code. This block encoded code is generally represented as variable length code (d, k; m, n; r). In this expression, i is constraint length and r is the maximum constraint length. In addition, d and k respectively denote the minimum successive number of "0" and the maximum successive number of "0" falling (assigned) between successive "1" within the code series.

The modulation system used in the Compact Disc (CD) system as a more practical example will now be explained. In the compact disc system, EFM (Eight to Fourteen Modulation) system is used. Data words of 8 bits are subjected to pattern conversion into code words (channel bit data) of 14 bits thereafter to add respective margin bits of 3 bits for the purpose of reducing d.c. component (DSV) after undergone EFM to record, onto the disc, code words to which the margin bits are respectively added after undergone NRZI modulation. In this case, in order to satisfy the condition where the minimum successive number of logic "0" levels is 2 and the maximum successive number of logic "0" level is 10, conversion from 8 bits into 14 bits and addition of margin bits are carried out. Accordingly, the parameter of this modulation system is (2, 10; 8, 17; 1). When bit interval of the channel bit data train (recording waveform train) is assumed to be T, the minimum inverting (inversion) interval $T_{min}$ is 3(=2+1)T. Further, the maximum inverting interval $T_{max}$ is 11(=10+1)T. In addition, the detection window width $T_w$ is expressed as (m/n)xT, and its value is 0.47 (=8/17) T in the above-mentioned example.

Moreover, the minimum run length d' of the same symbols after undergone NRZI modulation is 3(=d+1=2+1), and the maximum run length k' of the same symbols is 11(=k+1=10+1).

In the above-described compact disc system, if pits on the optical disc are reduced in the linear velocity direction, the recording density can be caused to be high. In this case, the minimum pit length corresponding to the minimum inverting interval $T_{min}$ is reduced. When this minimum pit length is too smaller than the spot size of laser beam, detection of pits becomes difficult. This constitutes the cause of occurrence of error.

Further, in reproduction of the disc, when skew is applied to the reproduction surface of the disc, the error rate is deteriorated. The skew (angle) of the disc is gradient (inclined angle) that the disc and the optical axis form, and is classified into the skew (component) in the tangential direction which is the gradient that the pit train direction of the disc and the optical axis form, and the skew (component) in the radial direction which is the gradient that the direction perpendicular to the pit train of the disc and the optical axis form. With respect to the skew (component) in the tangential direction of these skew components, the error rate is deteriorated in a relatively short time. Such deterioration of the error rate results in decrease in the margin in designing the system.

Further, as the result of the fact that distribution of errors with respect to length of running (continuity) of the same symbols is examined with respect to respective directions of the skew, error with respect to the skew in the tangential direction mainly takes place in the case where the run length of the same symbols is short. In more practical sense, it has been found that since length of $T_{min}$(d') is decoded into length of $T_{min-1}$ (d'-1), the error rate is deteriorated. Namely, it has been found that, in the above-described EFM system, in the case where skew takes place in the tangential direction, when the bit interval of the recording waveform train is assumed to be T, error resulting from the fact that 3T which is the minimum inverting interval $T_{min}$ is decoded into 2T takes place to much degree.

Further, it has been found that such an error takes place to some degree also by perturbation such as the skew in the radial direction and/or defocus, i.e., shift (deviation) in the focal point, etc. Further, it has been found that in the case where perturbation such as skew or shift (deviation) in the focal point, etc. is enormously large, error resulting from the fact that 3T which is the minimum inverting interval $T_{min}$ is decoded into 1T also takes place.

On the other hand, in the optical disc, margin is allowed (tolerable) to some degree with respect to asymmetry of the disc in the production thereof. It is necessary that the case where reproduction waveform is asymmetrical in upper and lower directions with respect to the center level is also taken into consideration in reproduction.

Hitherto, as a method of correction by the signal processing with respect to deterioration of the error rate, there was the Viterbi decoding method. The Viterbi decoding method is one of the maximum likelihood decoding methods of allowing the code error to be small to search the shortest path of the geometrical distance, and is a method of ejecting the path of low possibility to thereby simplify search of probable value to carry out decoding. Further, in the Viterbi decoding method, algorithm for compensating the minimum inverting interval $T_{min}$ can be inclusively added.

However, the Viterbi decoding method has the drawbacks that the circuit therefor is complicated and the scale of the hardware becomes large. In addition, the Viterbi decoding method is required to remove the influence of asymmetry. In the system where asymmetry is allowed (tolerable) like the optical disc, optimization with respect to asymmetry becomes necessary. As a result, the circuit is further complicated.

As stated above, in the recording medium, e.g., optical disc, etc., there may take place the case where ensuring of the skew margin becomes difficult. Particularly, with respect to the tangential direction, there results less skew margin.

In addition, in the recording medium, e.g., optical disc caused to have high density, etc., since stable reproduction of the minimum inverting interval $T_{min}$ becomes difficult, the error rate is deteriorated.

DISCLOSURE OF THE INVENTION

This invention has been made in order to solve problems as described above, and its object is to provide a data decoding apparatus adapted so that in the case where a portion which does not satisfy the condition of the minimum run length or the maximum run length of the same symbols exists in channel bit data obtained by binarizing a signal which has been read out from a recording medium, correction is implemented to the channel bit data to output channel bit data which satisfies the conditions of the minimum run length and the maximum run length of the same symbols, thereby making it possible to improve the bit error rate, and to ensure the skew margin.

This invention is directed to a data decoding apparatus in a data reproducing equipment for a recording medium on which there are recorded recording codes in which the minimum run length of the same symbols after recording codes in which the minimum run length of "0" falling (assigned) between successive "1" within code series is d are subjected to NRZI modulation is expressed as d'=d+1, the apparatus comprising: a (d'−1) detecting section for detecting channel bit data in which run length of the same symbols is (d'−1); a correction bit position detecting section for outputting a correction bit position designation signal to designate correction position of the channel bit data in which the run length of the same symbols is (d'−1) detected by the (d'−1) detecting section; and a data correcting section for carrying out, on the basis of the correction bit position designation signal from the correction bit position detecting section, correction processing of the channel bit data in which the run length of the same symbols is (d'−1) detected by the (d'−1) detecting section so that the run length of the same symbols becomes equal to d'.

In the data decoding apparatus according to this invention, e.g., reproduction RF signal which has been read out from the recording medium is decoded by at least one comparison level to output channel bit data.

Moreover, in the data decoding apparatus according to this invention, the correction bit position detecting section outputs, e.g., a correction bit position designation signal to designate correction bit position selected on the basis of the magnitude relationship between channel bit data immediately before the (d'−1) period and channel bit data immediately after the (d'−1) period when (d'−1)≧1.

Further, in the data decoding apparatus according to this invention, the correction bit position detecting section outputs, e.g., a correction bit position designation signal to designate, as correction bit position, smaller side of difference between reproduction RF signal level and comparison level at the time of level judgment of channel bit data immediately before the (d'−1) period and difference between reproduction RF signal level and the comparison level at the time of level judgment of channel bit data immediately after the (d'−1) period when (d'−1)≧1.

Further, in the data decoding apparatus according to this invention, the correction bit position detecting section outputs a correction bit position designation signal to designate correction bit position selected on the basis of the magnitude relationship between reproduction RF signal level at the time of level judgment of channel bit data immediately before the (d'−1) period and reproduction RF signal level at the time of level judgment of channel bit data immediately after the (d'−1) period when (d'−1)≧1.

Further, in the data decoding apparatus according to this invention, the correction bit position detecting section outputs, e.g., a correction bit position designation signal to designate correction bit position selected on the basis of the magnitude relationship between the leading channel bit data within the (d'−1) period and the last channel bit data within the (d'−1) period when (d'−1)≧2.

Further, in the data decoding apparatus according to this invention, the correction bit position detecting section outputs, e.g., a correction bit position designation signal to designate, as correction bit position, larger side of difference between reproduction RF signal level and comparison level at the time of level judgment of the leading channel bit data within the (d'−1) period and difference between reproduction RF signal level and the comparison level at the time of level judgment of the last channel bit data within the (d'−1) period when (d'−1)≧2.

Further, in the data decoding apparatus according to this invention, the correction bit position detecting section outputs, e.g., a correction bit position designation signal to designate correction bit position selected on the basis of the magnitude relationship between reproduction RF signal level at the time of level judgment of the leading channel bit data within the (d'−1) period and reproduction RF signal level at the time of level judgment of the last channel bit data within the (d'−1) period when (d'−1)≧2.

Further, in the data decoding apparatus according to this invention, the data correcting section is operative to, e.g., invert logic level of data at bit position designated by the correction bit position designation signal from the correction bit position detecting section to thereby carry out correction processing.

Further, this invention is directed to a data decoding apparatus in a data reproducing equipment for a recording medium on which there are recorded recording codes in which the minimum run length of the same symbols after recording codes in which the minimum run length of "0" falling (assigned) between successive "1" within code series is d are subjected to NRZI modulation is expressed as d'=d+1, the apparatus comprising: a (d−1) detecting section for detecting channel bit data in which run length of "0" after undergone inverse NRZI modulation is (d−1); a correction bit position detecting section for outputting a correction bit position designation signal to designate correction position of the channel bit data in which the run length of "0" is (d−1) detected by the (d−1) detecting section; and a data correcting section for carrying out, on the basis of the correction bit position designation signal from the correction bit position detecting section, correction processing of the channel bit data in which the run length of "0" is (d−1) detected by the (d−1) detecting section so that the run length of "0" becomes equal to d.

In the data decoding apparatus according to this invention, e.g., reproduction RF signal which has been read out from the recording medium is decoded by at least one comparison level to output channel bit data in which the minimum run length of "0" falling (assigned) between successive "1" within the code series is d.

In the data decoding apparatus according to this invention, the correction bit position detecting section outputs, e.g., a correction bit position designation signal to designate correction bit position selected on the basis of the magnitude relationship between channel bit data immediately before the (d−1) period and channel bit data immediately after the (d−1) period when (d−1)≧0.

Moreover, in the data decoding apparatus according to this invention, the correction bit position detecting section outputs, e.g., a correction bit position designation signal to designate, as correction bit position, smaller side of difference between reproduction RF signal level and comparison level at the time of level judgment of channel bit data immediately before the (d−1) period and difference between reproduction RF signal level and the comparison level at the time of level judgment of channel bit data immediately after the (d−1) period when (d−1)≧0.

Further, in the data decoding apparatus according to this invention, the correction bit position detecting section outputs, e.g., a correction bit position designation signal to designate correction bit position selected on the basis of the magnitude relationship between reproduction RF signal level at the time of level judgment of channel bit data immediately before the (d−1) period and reproduction RF signal level at the time of level judgment of channel bit data immediately after the (d−1) period when (d−1)≧0.

Further, in the data decoding apparatus according to this invention, the correction bit position detecting section outputs a correction bit position designation signal to designate correction bit position selected on the basis of the magnitude relationship between the leading channel bit data within the (d−1) period and the last channel bit data within the (d−1) period when (d−1)≧2.

Further, in the data decoding apparatus according to this invention, the correction bit position detecting section outputs a correction bit position designation signal to designate, as correction bit position, larger side of difference between reproduction RF signal level and comparison level at the time of level judgment of the leading channel bit data within the (d−1) period and difference between reproduction RF signal level and the comparison level at the time of level judgment of the last channel bit data within the (d−1) period when (d−1)≧2.

Further, in the data decoding apparatus according to this invention, the correction bit position detecting section outputs, e.g., a correction bit position designation signal to designate correction bit position selected on the basis of the magnitude relationship between reproduction RF signal level at the time of level judgment of the leading channel bit data within the (d−1) period and reproduction RF signal level at the time of level judgment of the last channel bit data within the (d−1) period when (d−1)≧2.

Further, in the data decoding apparatus according to this invention, the data correcting section is operative to, e.g., invert logic level of data at bit position designated on the basis of correction bit position designation signal from the correction bit position detecting section to further invert logic level of data at bit position at the outside of the (d−1) period at the designated bit position to thereby carry out correction processing.

Further, in the data decoding apparatus according to this invention, the data correcting section is operative to, e.g., shift data of "1" at bit position designated on the basis of the correction bit position designation signal from the correction bit position detecting section to data at the outside of the (d−1) period to thereby carry out correction processing.

Further, this invention is directed to a data decoding apparatus in a data reproducing equipment for a recording medium on which there are recorded recording codes in which the maximum run length of the same symbols after recording codes in which the maximum run length of "0" falling (assigned) between successive "1" within code series is k are subjected to NRZI modulation is expressed as k'=k+1, the apparatus comprising: a (k'+1) detecting section for detecting channel bit data in which run length of the same symbols is (k'+1); a correction bit position detecting section for outputting a correction bit position designation signal to designate correction position of the channel bit data in which the run length of the same symbols is (k'+1) detected by the (k'+1) detecting section; and a data correcting section for carrying out, on the basis of the correction bit position designation signal from the correction bit position detecting section, correction processing of the channel bit data in which the run length of the same symbols is (k'+1) detected by the (k'+1) detecting section so that the run length of the same symbols becomes equal to k'.

In the data decoding apparatus according to this invention, e.g., reproduction RF signal which has been read out from the recording medium is decoded by at least one comparison level to output channel bit data.

In the data decoding apparatus according to this invention, the correction bit position detecting section outputs, e.g., a correction bit position designation signal to designate correction bit position selected on the basis of the magnitude relationship between channel bit data immediately before the (k'+1) period and channel bit data immediately after the (k'+1) period.

In the data decoding apparatus according to this invention, the correction bit position detecting section outputs, e.g., a correction bit position designation signal to designate, as correction bit position, larger side of difference between reproduction RF signal level and comparison level at the time of level judgment of channel bit data immediately before the (k'+1) period and difference between reproduction RF signal level and the comparison level at the time of level judgment of channel bit data immediately after the (k'+1).

Moreover, in the data decoding apparatus according to this invention, the correction bit position detecting section outputs, e.g., a correction bit position designation signal to designate correction bit position selected on the basis of the magnitude relationship between reproduction RF signal level at the time of level judgment of channel bit data immediately before the (k'+1) period and reproduction RF signal level at the time of level judgment of channel bit data immediately after the (k'+1) period.

Further, in the data decoding apparatus according to this invention, the correction bit position detecting section outputs, e.g., a correction bit position designation signal to designate correction bit position selected on the basis of the magnitude relationship between the leading channel bit data within the (k'+1) period and the last channel bit data within the (k'+1) period.

Further, in the data decoding apparatus according to this invention, the correction bit position detecting section outputs, e.g., a correction bit position designation signal to designate, as correction bit position, smaller side of difference between reproduction RF signal level and comparison level at the time of level judgment of the leading channel bit data within the (k'+1) period and difference between reproduction RF signal level and the comparison level at the time of level judgment of the last channel bit data within the (k'+1) period.

Further, in the data decoding apparatus according to this invention, the correction bit position detecting section outputs, e.g., a correction bit position designation signal to designate correction bit position selected on the basis of the magnitude relationship between reproduction RF signal level at the time of level judgment of the leading channel bit data within the (k'+1) period and reproduction RF signal level at the time of level judgment of the last channel bit data within the (k'+1) period.

Further, in the data decoding apparatus according to this invention, the data correcting section inverts logic level of data at bit position designated on the basis of correction bit position designation signal from the correction bit position detecting section to thereby carry out correction processing.

Further, this invention is directed to a data decoding apparatus in a data reproducing equipment for a recording medium on which there are recorded recording codes in which the maximum run length of the same symbols after the maximum run length of "0" falling (assigned) between successive "1" within code series is k are subjected to NRZI modulation is expressed as k'=k+1, the apparatus comprising: a (k+1) detecting section for detecting channel bit data in which run length of "0" after undergone inverse NRZI modulation is (k+1); a correction bit position detecting section for outputting a correction bit position designation signal to designate correction position of the channel bit data in which the run length of "0" is (k+1) detected by the (k+1) detecting section; and a data correcting section for carrying out, on the basis of the correction bit position designation signal from the correction bit position detecting section, correction processing of the channel bit data in which the run length of "0" is (k+1) detected by the (k+1) detecting section so that the run length of "0" becomes equal to k.

In the data decoding apparatus according to this invention, e.g., reproduction RF signal which has been read out from the recording medium is decoded by at least one comparison level to output channel bit data in which the maximum run length of "0" falling (assigned) between successive "1" within the code series is k.

In the data decoding apparatus according to this invention, the correction bit position detecting section outputs, e.g., a correction bit position designation signal to designate correction bit position selected on the basis of the magnitude relationship between channel bit data immediately before the (k+1) period and channel bit data immediately after the (k+1) period.

Moreover, in the data decoding apparatus according to this invention, the correction bit position detecting section outputs, e.g., a correction bit position designation signal to designate, as correction bit position, larger side of difference between reproduction RF signal level and comparison level at the time of level judgment of channel bit data immediately before the (k+1) period and difference between reproduction RF signal level and the comparison level at the time of level judgment of channel bit data immediately after the (k+1) period.

Further, in the data decoding apparatus according to this invention, the correction bit position detecting section outputs, e.g., a correction bit position designation signal to designate correction bit position selected on the basis of the magnitude relationship between reproduction RF signal level at the time of level judgment of channel bit data immediately before the (k+1) period and reproduction RF signal level at the time of level judgment of channel bit data immediately after the (k+1) period.

Further, in the data decoding apparatus according to this invention, the correction bit position detecting section outputs, e.g., a correction bit position designation signal to designate correction bit position selected on the basis of the magnitude relationship between the leading channel bit data within the (k+1) period and the last channel bit data within the (k+1) period when (k+1)≧2.

Further, in the data decoding apparatus according to this invention, the correction bit position detecting section outputs, e.g., a correction bit position designation signal to designate, as correction bit position, smaller side of difference between reproduction RF signal level and comparison level at the time of level judgment of the leading channel bit data within the (k+1) period and difference between reproduction RF signal level and the comparison level at the time of level judgment of the last channel bit data within the (k+1) period when (k+1)≧2.

Further, in the data decoding apparatus according to this invention, the correction bit position detecting section outputs, e.g., a correction bit position designation signal to designate correction bit position selected on the basis of the magnitude relationship between reproduction RF signal level at the time of level judgment of the leading channel bit data within the (k+1) period and reproduction RF signal level at the time of level judgment of the last channel bit data within the (k+1) period when (k+1)≧2.

Further, in the data decoding apparatus according to this invention, the data correcting section is operative to, e.g., invert logic level of data at bit position designated on the basis of correction bit position designation signal from the correction bit position detecting section to further invert logic level of data at bit position at the outside of the (k+1) period at the designated bit position to thereby carry out correction processing.

Further, in the data decoding apparatus according to this invention, the data correcting section is operative to, e.g., shift data of "1" at bit position designated on the basis of correction bit position designation signal from the correction bit position detecting section to data at the outside of the (k+1) period to thereby carry out correction processing.

Further, this invention is directed to a data decoding apparatus in a data reproducing equipment for a recording medium on which there are recorded recording codes in which the minimum run length of the same symbols after recording codes which satisfies d≧2 of recording codes in which the minimum run length of "0" falling (assigned) between successive "1" within code series is d are subjected to NRZI modulation is expressed as d'=d+1, the apparatus comprising: a (d'−2) detecting section for detecting channel bit data in which run length of the same symbols is (d'−2); a correction bit position detecting section for outputting a correction bit position designation signal to designate correction position of the channel bit data in which the run length of the same symbols is (d'−2) detected by the (d'−2) detecting section; and a data correcting section for carrying out, on the basis of the correction bit position designation signal from the correction bit position detecting section, correction processing of the channel bit data in which the run length of the same symbols detected is (d'−2) by the (d'−2) detecting section so that the run length of the same symbols becomes equal to d'.

In the data decoding apparatus according to this invention, e.g., reproduction RF signal which has been read out from the recording medium is decoded by at least one comparison level to output channel bit data.

Further, in the data decoding apparatus according to this invention, the correction bit position detecting section outputs, e.g., a correction bit position designation signal to designate, as correction bit position, bit immediately before the (d'−2) period and bit immediately after the (d'−2) period.

Further, in the data decoding apparatus according to this invention, the data correcting section carries out, e.g., correction processing to invert logic level of bit.

Further, this invention is directed to a data decoding apparatus in a data reproducing equipment for a recording medium on which there are recorded recording codes in which the minimum run length of the same symbols after recording codes which satisfy $d \geq 2$ of recording codes in which the minimum run length of "0" falling (assigned) between successive "1" within code series is d are subjected to NRZI modulation is expressed as d'=d+1, the apparatus comprising: a (d−2) detecting section for detecting channel bit data in which run length of "0" after undergone inverse NRZI modulation is (d−2); a correction bit position detecting section for outputting a correction bit position designation signal to designate correction position of the channel bit data in which the run length of "0" is (d−2) detected by the (d−2) detecting section; and a data correcting section for carrying out, on the basis of the correction bit position designation signal from the correction bit position detecting section, correction processing of the channel bit data in which the run length of "0" is (d−2) detected by the (d−2) detecting section so that the run length of "0" becomes equal to d.

In the data decoding apparatus according to this invention, e.g., reproduction RF signal which has been read out from the recording medium is decoded by at least one comparison level to output channel bit data.

Further, in the data decoding apparatus according to this invention, the correction bit position detecting section outputs, e.g., a correction bit position designation signal to designate, as correction bit position, bits immediately before and immediately after the (d−2) period.

Further, in the data decoding apparatus according to this invention, the data correcting section is operative to, e.g., invert logic level of bit that the correction bit position detecting section designates to further invert logic level of bits at both sides adjacent thereto.

Further, this invention is directed to a data decoding apparatus in a data reproducing equipment for a recording medium on which there are recorded recording codes in which the maximum run length of the same symbols after recording codes in which the maximum run length of "0" falling (assigned) between successive "1" within code series is k are subjected to NRZI modulation is expressed as k'=k+1, the apparatus comprising: a (k'+2) detecting section for detecting channel bit data in which run length of the same symbols is (k'+2); a correction bit position detecting section for outputting a correction bit position designation signal to designate correction position of the channel bit data in which the run length of the same symbols is (k'+2) detected by the (k'+2) detecting section; and a data correcting section for carrying out, on the basis of the correction bit position designation signal from the correction bit position detecting section, correction processing of the channel bit data in which the run length of the same symbols is (k'+2) detected by the (k'+2) detecting section so that the run length of the same symbols becomes equal to k'.

In the data decoding apparatus according to this invention, e.g., reproduction RF signal which has been read out from the recording medium is decoded by at least one comparison level to output channel bit data.

Moreover, in the data decoding apparatus according to this invention, the correction bit position detecting section outputs, e.g., a correction bit position designation signal to designate, as correction bit position, the leading bit and the last bit of the (k'+2) period.

Further, in the data decoding apparatus according to this invention, the data correcting section is operative to, e.g., invert logic level of bit that the correction bit position detecting section designates.

Further, this invention is directed to a data decoding apparatus in a data reproducing equipment for a recording medium on which there are recorded recording codes in which the maximum run length of the same symbols after recording codes in which the maximum run length of "0" falling (assigned) between successive "1" within code series is k are subjected to NRZI modulation is expressed as k'=k+1, the apparatus comprising: a (k+2) detecting section for detecting channel bit data in which run length of "0" after undergone inverse NRZI modulation is (k+2); a correction bit position detecting section for outputting a correction bit position designation signal to designate correction position of the channel bit data in which the run length of "0" is (k+2) detected by the (k+2) detecting section; and a data correcting section for carrying out, on the basis of the correction bit position designation signal from the correction bit position detecting section, correction processing of the channel bit data in which the run length of "0" is (k+2) detected by the (k+2) detecting section so that the run length of "0" becomes equal to k.

In the data decoding apparatus according to this invention, e.g., reproduction RF signal which has been read out from the recording medium is decoded by at least one comparison level to output channel bit data.

Further, in the data decoding apparatus according to this invention, the correction bit position detecting section outputs, e.g., a correction bit position designation signal to designate, as correction bit position, the leading bit and the last bit of the (k+2) period.

In addition, in the data decoding apparatus according to this invention, the data correcting section is operative to, e.g., invert logic level of bit that the correction bit position detecting section designates to further invert logic levels of bits at the both sides thereof.

BRIEF DESCRIPTION OF THE DRAWINGS

FIG. 4 is a circuit diagram showing another configuration of the correction bit position detecting section.

FIGS. 5a–5g are timing charts for explaining the correcting operation in the case where the condition of the minimum run length is not satisfied in the data decoding apparatus shown in FIG. 1.

FIGS. 6a–6g are timing charts for explaining correcting operation in the case where the condition of the maximum run length is not satisfied in the data decoding apparatus shown in FIG. 1.

FIGS. 7a–7f timing charts for explaining another correcting operation in the case where the condition of the minimum run length is not satisfied in the data decoding apparatus shown in FIG. 1.

FIGS. 9a–9e are timing charts for explaining the correcting operation in the data decoding apparatus shown in FIG. 8.

FIGS. 25a–25f are timing charts for explaining the operation of the bit data inversion correcting section in the data decoding apparatus shown in FIG. 21.

BEST MODE FOR CARRYING OUT THE INVENTION

Preferred embodiments of this invention will now be described in detail with reference to the attached drawings.

The embodiments of this invention will be described by taking, as the representative example, an apparatus adapted for reproducing NRZI modulated channel bit data train from an optical disc used as a recording medium on which (d, k) recording codes of binary level used as the recording code are recorded by NRZI modulation, the (d,k) recording codes of the binary level being such that the minimum run length (successive number) d of the same symbols is 2 and the maximum run length (successive number) k of the same symbols is 10. In this case, the (d, k) recording code is code indicating edge, and channel bit data train after undergone NRZI modulation (NRZI modulated channel bit data train) are codes indicating levels corresponding to the shape of pits. Moreover, the minimum run length d' of the same symbols after undergone NRZI modulation is 3(=d+1=2+1), and the maximum run length k' of the same symbols after undergone NRZI modulation is 11(=k+1=10+1).

Figure 1:
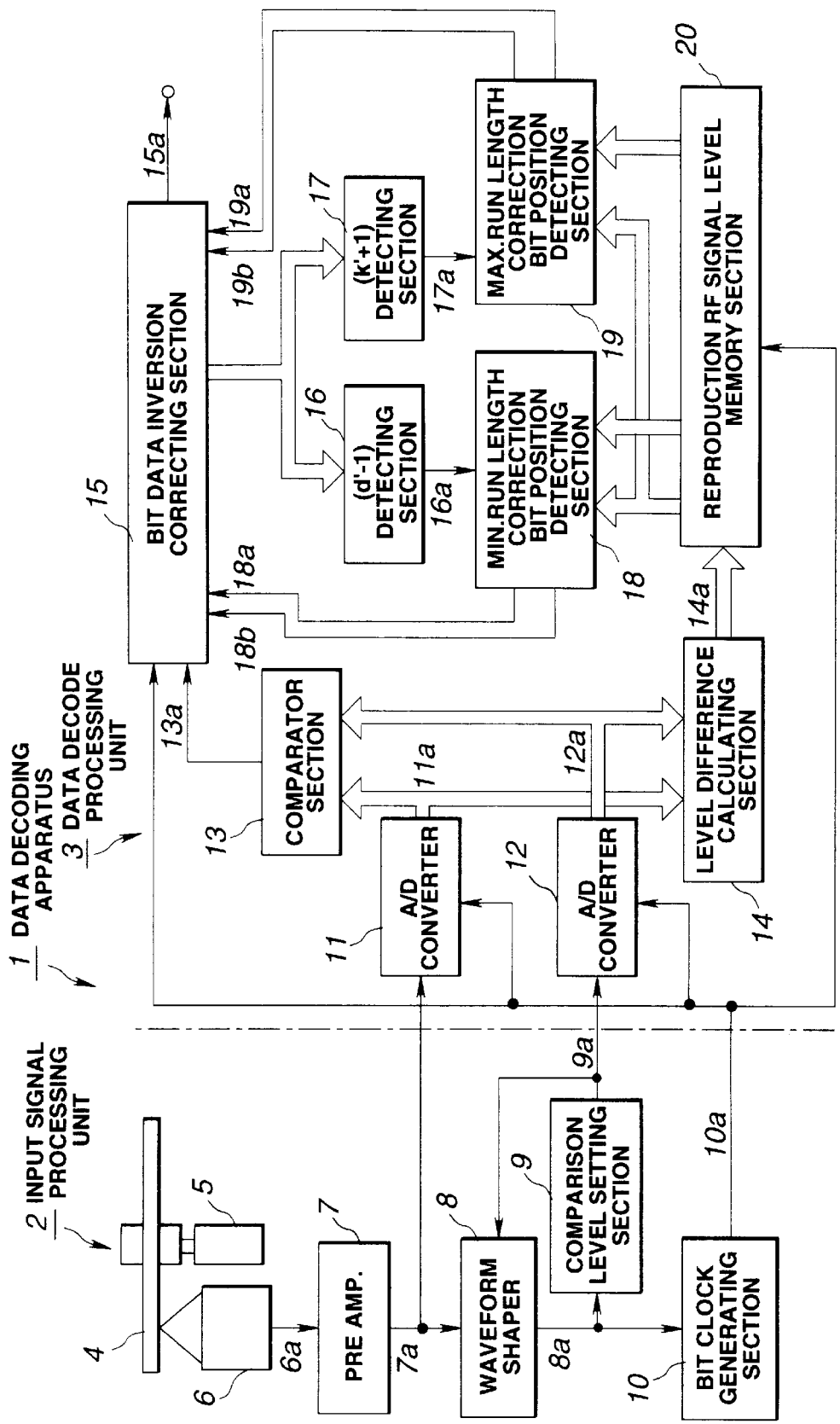
FIG. 1 is a block diagram showing the configuration of a data decoding apparatus to which this invention is applied.

FIG. 1 is a block diagram showing the configuration of a data decoding apparatus according to this invention. This data decoding apparatus 1 is roughly comprised of an input signal processing unit 2 and a data decode processing unit 3. In the FIG. 1 mentioned above, servo circuit, etc. which does not directly participate in the operation of the data decoding apparatus is omitted.

The input signal processing unit 2 comprises a spindle motor 5 for rotationally driving an optical disc 4, an optical pick-up 6 for irradiating laser beams onto the signal recording surface of the optical disc 4 through object lens (objective) and adapted for receiving reflected light from the optical disc 4 to output a reproduction signal 6a, a pre-amplifier 7 for amplifying the reproduction signal 6a outputted from the optical pick-up 6, a waveform shaping element (shaper) 8 for allowing a reproduction RF signal 7a outputted from the pre-amplifier 7 to undergo waveform shaping thereafter to output a binarized pulse signal 8a on the basis of comparison level 9a, a comparison level setting section 9 for comparing d.c. voltage obtained by integrating the pulse signal 8a outputted from the waveform shaper 8 and reference voltage to carry out negative feed-back control of the comparison level 9a, and a bit clock generating section 10 of the PLL system for generating bit clock 10a on the basis of the pulse signal 8a outputted from the waveform shaper 8 to output the bit clock 10a.

The data decode processing unit 3 comprises an A/D converter 11 for reproduction RF signal, which samples the reproduction RF signal 7a on the basis of bit clock 10a to quantize the sampled reproduction RF signal to output reproduction RF signal level data 11a, an A/D converter 12 for comparison level, which samples the comparison level 9a on the basis of bit clock 10a to quantize the sampled comparison level to output comparison level data 12a, comparator section 13 for comparing the reproduction RF signal level data 11a and the comparison level data 12a, whereby when the reproduction RF signal level is equal to the comparison level or more, it outputs channel bit data of logic "1" level (binary signal) 13a, while when the reproduction RF signal level is less than the comparison level, it outputs channel bit data of logic "0" level (binary signal) 13a, a level difference calculating section 14 supplied with the reproduction RF signal level data 11a and the comparison level data 12a to calculate absolute value of difference between the reproduction RF signal level and the comparison level to output level difference data 14a, a bit data inversion correcting section 15, a (d'-1) detecting section 16, a (k'+1) detecting section 17, a minimum run length correction bit position detecting section 18, a maximum run length correction bit position detecting section 19, and a reproduction RF signal level memory section 20.

It is to be noted that in the case where the comparison level 9a is not caused to undergo negative feedback control, i.e., in the case where waveform shaping and binarization judgment of channel bit data are carried out by fixed comparison level set in advance, the A/D converter 12 for comparison level is unnecessary. In this case, in place of comparison level data 12a which is output of the A/D converter 12 for comparison level, comparison level data corresponding to the fixed comparison level set in advance is delivered.

Moreover, while the data decode processing section 3 is of a structure to compare, at the comparator section 13, reproduction RF signal level data 11a obtained by allowing reproduction RF signal 7a to undergo A/D conversion at the A/D converter 11 and comparison level data 12a to obtain channel bit data (binary signal) 13a, there may be employed a configuration to latch pulse signal 8a outputted from the waveform shaper 8 on the basis of bit clock 10a generated at the bit clock generating section 10 to thereby obtain binary signal (channel bit data) to deliver, to the bit data inversion correcting section 15, binary signal (channel bit data) obtained by latch on the basis of bit clock 10a.

Further, while there is employed the configuration in which the level difference calculating section 14 calculates absolute value of difference between reproduction RF signal level and comparison level to output level difference data 14a, and the reproduction RF signal level memory section 20 stores level difference data 14a outputted from the level difference calculating section 14, there may be employed a configuration in which reproduction RF signal level data 11a and comparison level data 12a are caused to be stored in order of time series in the reproduction RF signal level memory section 20 to determine, in the correction bit position detection, absolute value of difference between reproduction RF signal level data 11a and comparison level data 12a. It is to be noted that, in the case where the comparison level is fixed, it is unnecessary to store the comparison level data 12a.

Figure 2:
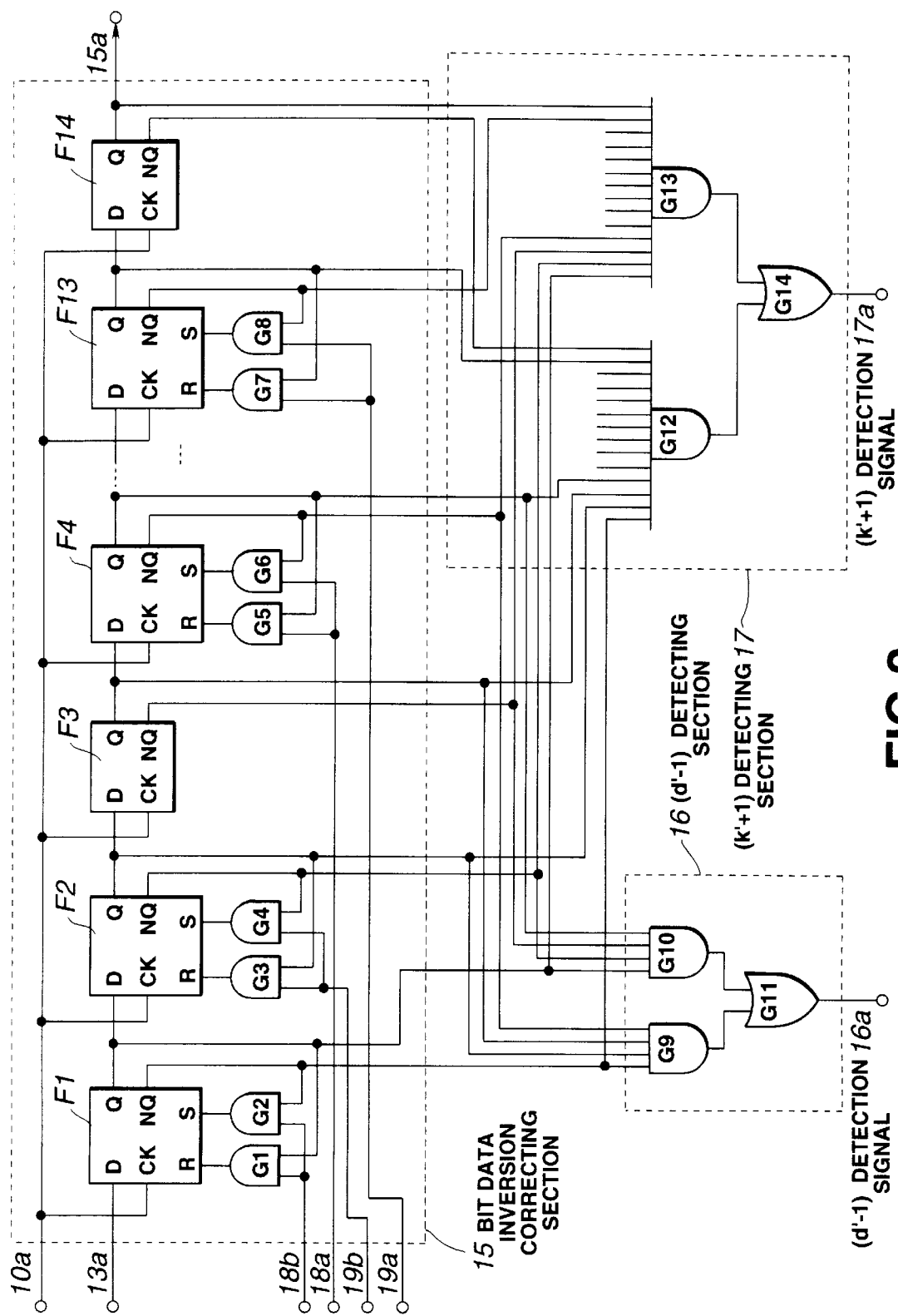
FIG. 2 is a circuit diagram showing the configuration of bit data inversion correcting section, (d'−1) detecting section and (k'+1) detecting section in the data decoding apparatus shown in FIG. 1.

FIG. 2 is a circuit diagram showing more practical configuration of the bit data inversion correcting section 15, the (d'-1) detecting section 16 and the (k'+1) detecting section 17. The bit data inversion correcting section 15 comprises a shift register of a structure in which 14 stages of D-type flip-flops F1~F14 are cascade-connected, and 2(two)-input AND gates G1~G8 for inverting channel bit data temporarily stored in the first, the second, the fourth and the thirteenth stages of D-type flip-flops F1, F2, F4, F13.

Clock input terminals CK of the respective D-type flip-flops F1~F14 are supplied with bit clock 10a. Data input terminal D of the D-type flip-flop F1 of the first stage is supplied with channel bit data (binary signal) 13a outputted from the comparator section 13. The data output terminals Q of the D-type flip-flops F1~F13 of respective stages are connected to the data input terminals D of the D-type flip-flops F2~F14 of the respective next stages. In addition, decoded channel bit data 15a is outputted from the data output terminal Q of the D-type flip-flop F14 of the fourteenth stage.

The D-type flip-flops F1, F2, F4, F13 of the first stage, the second stage, the fourth stage and the thirteenth stage are D-type flip-flops having set/reset function, each provided with set input terminal S and reset input terminal R.

The reset input terminal R of the D-type flip-flop F1 of the first stage is supplied with output signal of the first AND gate G1. The set input terminal S of the D-type flip-flop F1 of the first stage is supplied with output signal of the second AND gate G2. One input terminal of the first AND gate G1 is supplied with correction bit position designation signal 18b outputted from the minimum run length correction bit position detecting section 18. The other input terminal of the first AND gate G1 is connected to the data output terminal Q of the D-type flip-flop F1 of the first stage. One input terminal of the second AND gate G2 is supplied with the correction bit position designation signal 18b outputted from the minimum run length correction bit position detecting section 18. The other input terminal of the second AND gate G2 is connected to the inverting data output terminal NQ of the D-type flip-flop F1 of the first stage.

When the correction bit position designation signal 18b is delivered in the state where the Q output of the D-type flip-flop F1 of the first stage is at logic "1" level, output of the first AND gate G1 is caused to be at logic "1" level. As a result, the output of logic "1" level is delivered to the reset input terminal R of the D-type flip-flop F1 of the first stage. Accordingly, Q output of the D-type flip-flop F1 of the first stage is inverted so that Q output of logic "0" level is provided.

When the correction bit position designation signal 18b is delivered in the state where Q output of the D-type flip-flop F1 of the first stage is logic "0" level, i.e., the NQ output is at logic "1" level, output of the second AND gate G2 is caused to be at logic "1" level. Since the output of logic "1" level is delivered to the set input terminal S of the D-type flip-flop F1 of the first stage, Q output of the D-type flip-flop F1 of the first stage is inverted so as to take logic "1" level.

At the D-type flip-flops F2, F4, F13 of the second stage, the fourth stage and the thirteenth stage, circuits similar to respective AND gates G1, G2 of the first stage are provided. Further, in the case where correction bit position designation signal 18a is delivered from the minimum run length correction bit position detecting section 18, output data of the D-type flip-flop F4 of the fourth stage is inverted through the AND gate G5 or the AND gate G6. Similarly, in the case where correction bit position designation signal 19b is delivered from the maximum run length correction bit position detecting section 19, output data of the D-type flip-flop F2 of the second stage is inverted through the AND gate G3 or the AND gate G4. Moreover, in the case where correction bit position designation signal 19a is delivered from the maximum run length correction bit position detecting section 19, output data of the D-type flip-flop F13 of the thirteenth stage is inverted through the AND gate G7 or the AND gate G8.

The (d'-1) detecting section 16 comprises two 4(four)-input AND gates G9, G10, and a 2(two)-input OR gate G11 supplied with respective outputs of the 4-input AND gates G9, G10. The 4-input AND gate G9 produces logical product output of logic "1" level in the case where logic levels of Q outputs of the D-type flip-flops F1 to F4 of the first stage to the fourth stage are respectively 0, 1, 1, 0, i.e., in the case where the run length of the logic "1" levels is 2 in the NRZI modulated channel bit data train. The 4-input AND gate G10 produces logical product output of logic "1" level in the case where logic levels of Q outputs of the D-type flip-flops F1 to F4 of the first stage to the fourth stage are respectively 1, 0, 0, 1, i.e., in the case where the run length of logic "0" levels is 2 in the NRZI modulated channel bit data train. Further, this (d'-1) detecting section 16 outputs a (d'-1) detection signal 16a indicating that channel bit data train of (d'-1) has been detected with respect to the minimum run length d=2 through the 2-input OR gate G11 in both the case where the run length of logic "1" levels is 2 and the case where the run length of logic "0" levels is 2.

It is to be noted that the (d'-1) detecting section 16 may be of a structure in which two 4-input AND gates G9, G10 are replaced by two Exclusive OR gates and 2-input OR gate G11 is replaced by 2-input AND gate to obtain a (d'−1) detection signal 16a as logical product output of exclusive logical sum output of respective Q outputs of the D-type flip-flops F1, F2 of the first stage and the second stage and exclusive logical sum output of respective Q outputs of the D-type flip-flops F3, F4 of the third stage and the fourth stage.

While, in this embodiment, since such an approach is employed to discriminate whether or not the condition of the minimum run length is satisfied by the NRZI modulated channel bit data train, there is disclosed the configuration for judging the portion where run length of the same symbols is expressed as (d'−1) by the fact that the run length of logic "0" level or logic "1" level is 2, there may be employed a configuration in which NRZI modulated channel bit data is subjected to inverse NRZI modulation thereafter to judge the (d'−1) portion by the fact that the run length of the same symbols is 1.

The (k'+1) detecting section 17 comprises two 14 (fourteen)-input AND gates G12, G13, and a 2 (two)-input OR gate G14 supplied with respective outputs of the 14(fourteen)-input AND gates G12, G13. The 14 input AND gate G12 produces logical product output of logic "1" level in the case where Q outputs of the D-type flip-flops F1, F14 of the first stage and the fourteenth stage are both at logic "0" level, and Q outputs of the D-type flip-flops F2 to F13 of the second stage to the thirteenth stage are all at logic "1" level, i.e., in the case where the run length of logic "1" levels is 12 in the NRZI modulated channel bit data train. The 14 input AND gate G13 produces logical product output of logic "1" level in the case where Q outputs of the D-type flip-flops F1, F14 of the first stage and the fourteenth stage are both at logic "1" level and Q outputs of the D-type flip-flops F2 to F13 of the second stage to the thirteenth stage are all at logic "0" level, i.e., in the case where the run length of logic "0" levels is 12 in the NRZI modulated channel bit data train. Further, this (k'+1) detecting section 17 outputs a (k'+1) detection signal 17a indicating that channel bit data train of (k'+1) has been detected with respect to the maximum run length k=10 through the 2-input OR gate G14 in both the case where the run length of logic "1" levels is 12 and the case where the run length of logic "0" levels is 12.

While, in this embodiment, since such an approach is employed to discriminate whether or not the condition of the maximum run length is satisfied by the NRZI modulated channel bit data train, there has been disclosed the configuration for judging the portion where run length of the same symbols is expressed as (k'+1) by the fact that the run length of logic "0" level or logic "1" levels is 12, there may be employed a configuration adapted for allowing NRZI modulated channel bit data to undergo inverse NRZI modulation thereafter to judge the (k'+1) portion by the fact that the run length of the same symbols is 11.

It is to be noted that while there is disclosed in FIG. 2, as the more practical circuit example of the (d'−1) detecting section 16 and the (k'+1) detecting section 17, the circuit configuration in which shift register of 14 stages constituting the bit data inversion correcting section 15 is utilized to decode outputs of respective stages of the shift register to thereby detect (d'−1) and (k'+1), the (d'−1) detecting section 16 and the (k'+1) detecting section 17 may be adapted to count the successive number of the same symbols (the same logic levels) by using counter caused to be of structure to be reset every time logic level of channel bit data (binary signal) 13a outputted from the comparator section 13 is inverted, whereby when the counter is reset by the successive number of the same symbols of 2, it outputs (d'−1) detection signal 16a, and when the successive number of the same symbols reaches 12, it outputs (k'+1) detection signal 17a. In addition, the bit data inversion correcting section 15 may be constituted by using, e.g., random access memory (RAM) and read/write control circuit therefor.

Figure 3:
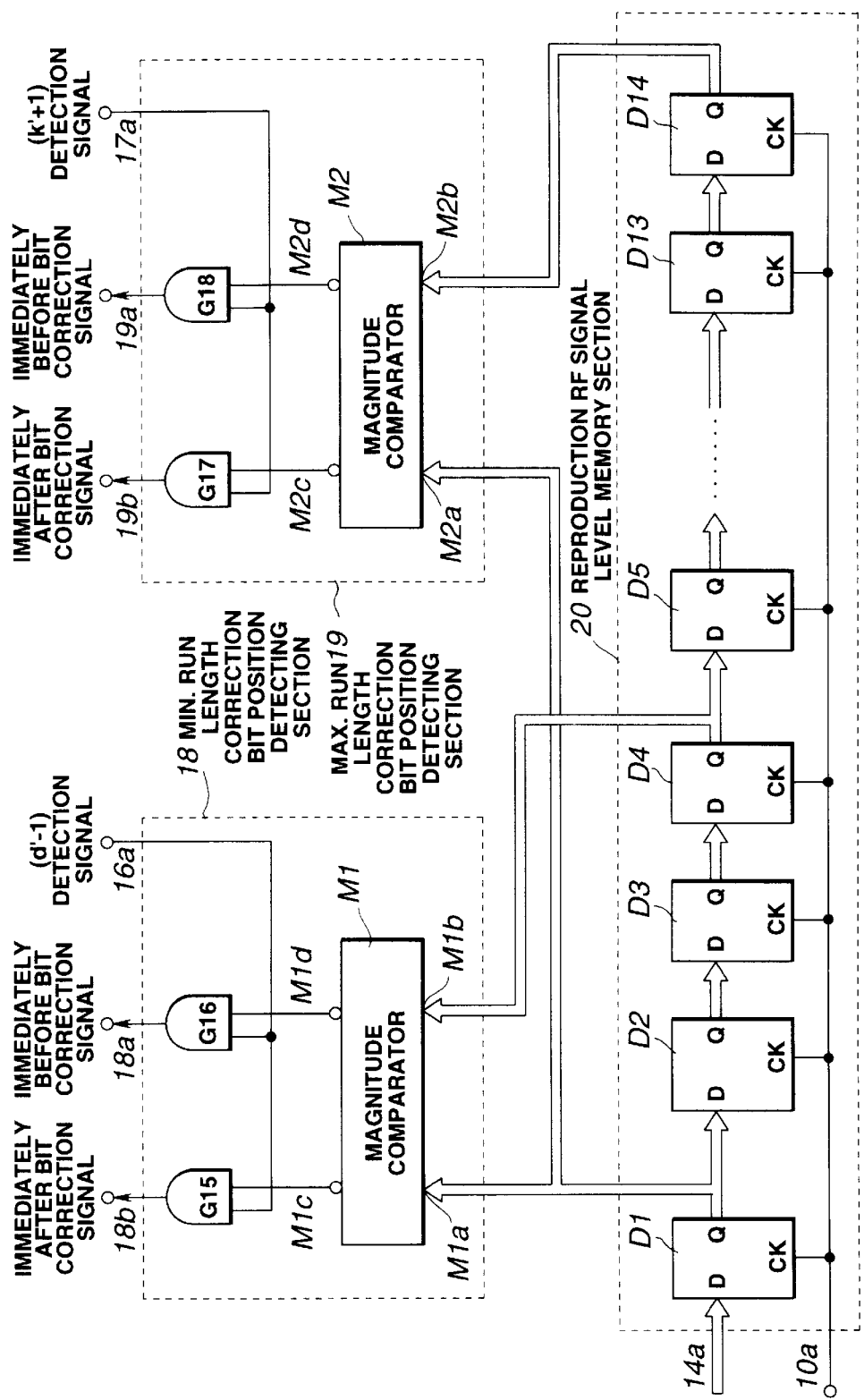
FIG. 3 is a circuit diagram showing the configuration of reproduction RF signal level memory section and respective correction bit position detecting sections in the data decoding apparatus shown in FIG. 1.

FIG. 3 is a circuit diagram showing the configuration of the reproduction RF signal level memory section 20 and the respective correction bit position detecting sections 18, 19. The reproduction RF signal level memory section 20 is caused to be of configuration of the shift register of the bit parallel input—bit parallel output type, which is composed of 14 stages of data latch circuits D1 to D14 cascade-connected. Clock input terminals CK of the respective data latch circuits D1 to D14 are supplied with bit clock 10a. Data input terminal D of the data latch circuit D1 of the first stage is supplied with level difference data 14a (absolute value of difference between reproduction RF signal level and comparison level) calculated at the level difference calculating section 14. Data output terminals Q of the data latch circuits D1 to D13 of respective stages are connected to data input terminals D of the data latch circuits D2 to D14 of the respective next stages.

The respective D-type flip-flops F1 to F14 within the bit data inversion correcting section 15 shown in FIG. 2 temporarily store channel bit data (binary signal) of 14 bits in order of time series. The respective data latch circuits D1 to D14 within the reproduction RF signal level memory section 20 shown in FIG. 3 temporarily store, in order of time series, absolute values of differences between reproduction RF signal level (values) and comparison level when binarization judgments of channel bit data (binary signal) stored in the respective D-type flip-flops F1 to F14 are carried out. In the state where, e.g., data of logic "1" level is stored in the D-type flip-flop F1, absolute value of difference between reproduction RF signal level and comparison level when judgment of logic "1" level is carried out is stored in the data latch circuit D1.

The minimum run length correction bit position detecting section 18 comprises a magnitude comparator M1 and two AND gates G15, G16. One input terminal group M1a of the magnitude comparator M1 is supplied with Q output of the data latch circuit D1 of the first stage. The other input terminal group M1b of the magnitude comparator M1 is supplied with Q output of the data latch circuit D4 of the fourth stage. This magnitude comparator M1 judges the magnitude relationship between data delivered to the input terminal group M1a and data delivered to the input terminal group M1b, whereby in the case where data delivered to the input terminal group M1a is smaller than data delivered to the input terminal group M1b, it outputs first judgment result M1c, while in the case where data delivered to the input terminal group M1b is smaller than data delivered to the input terminal group M1a, it outputs second judgment result M1d.

Moreover, when first judgment result M1c is delivered to one input terminal of the AND gate G15, and (d'−1) detection signal 16a is delivered to the other input terminal of the AND gate G15, the first judgment result M1c is outputted as correction bit position designation signal 18b. Further, when second judgment result M1d is delivered to one input terminal of the AND gate G16, and (d'−1) detection signal 16a is delivered to the other input terminal of the AND gate G16, the second judgment result M1d is outputted as correction bit position designation signal 18a. In this case, bit immediately before the (d'−1) period is designated as correction bit by the correction bit position designation signal 18a, and bit immediately after the (d'−1) period is designated as correction bit by the correction bit position designation signal 18b.

In the case where the period in which the run length of the same symbols is 2 is detected in NRZI modulated channel bit data train by the (d'−1) detecting section 16, if either bit immediately before or immediately after that period is corrected (its logic level is inverted), the condition of the minimum run length d' can be satisfied. The minimum run length correction bit position detecting section 18 shown in FIG. 3 compares level difference data (absolute values of differences between reproduction RF signal level (values) and comparison level) when bits immediately before and immediately after the period of (d'−1) are caused to undergo binarization judgment to designate, as bit position to be corrected, bit position in which its level difference data is smaller.

The maximum run length correction bit position detecting section 19 comprises a magnitude comparator M2, and two AND gates G17, G18. One input terminal group M2a of the magnitude comparator M2 is supplied with Q output of the data latch circuit D1 of the first stage. The other input terminal group M2b of the magnitude comparator M2 is supplied with Q output of the data latch circuit D14 of the fourteenth stage. This magnitude comparator M2 judges the magnitude relationship between data delivered to the input terminal group M2a and data delivered to the input terminal group 2b, whereby in the case where data delivered to the input terminal group M2a is larger than data delivered to the input terminal group M2b, it outputs first judgment result M2c, while in the case where data delivered to the input terminal group M2b is larger than data delivered to the input terminal group M2a, it outputs second judgment result M2d.

Moreover, when the first judgment result M2c is delivered to one input terminal of the AND gate G17, and (k'+1) detection signal 17a is delivered to the other input terminal of the AND gate G17, the first judgment result M2c is outputted as correction bit position designation signal 19b. Further, when the second judgment result M2d is delivered to one input terminal of the AND gate G18, and (k'+1) detection signal 17a is delivered to the other input terminal of the AND gate G18, the second judgment result M2d is outputted as correction bit position designation signal 19a. In this case, the bit immediately before the (k'+1) period is designated as correction bit by the correction bit position designation signal 19a, and the bit immediately after the (k'+1) period is designated as correction bit by the correction bit position designation signal 19b.

In the case where the period where the run length of the same symbols is 12 is detected in NRZI modulated channel bit data train by the (k' +1) detecting section 17, if either bit immediately before or immediately after that period is corrected (logic level is inverted), the condition of the maximum run length k' can be satisfied. The maximum run length correction bit position detecting section 19 shown in FIG. 3 compares level difference data (absolute values of differences between reproduction RF signal level (values) and comparison level) when bits immediately before and immediately after the period of (k'+1) are caused to undergo binarization judgment to designate, as bit position to be corrected, bit position adjacent to bit position of larger one of the level difference data.

As described above, there was disclosed in FIG. 3 the configuration in which in the case where the conditions of the minimum run length and the maximum run length are not satisfied, bit position to be corrected is selected by utilizing level difference data at the time of binarization judgment of bits of both outsides of the periods where those conditions are not satisfied. On the contrary, position to be corrected may be selected on the basis of level difference data at the time of binarization judgment of the leading bit and the last bit of the period where the conditions of the minimum run length and the maximum run length are not satisfied.

FIG. 4 is a circuit diagram showing the configuration of another embodiment of the minimum run length correction bit position detecting section and the maximum run length correction bit position detecting section. A minimum run length correction bit position detecting section 180 shown in FIG. 4 uses magnitude comparator M3 caused to be of a structure to output comparison results M3c, M3d in the case where (d'−1) detection signal 16a is delivered to an output control terminal M3e. One input terminal group M3a of the magnitude comparator M3 is supplied with output of data latch circuit D2 of the second stage. The other input terminal group M3b of the magnitude comparator M3 is supplied with output of data latch circuit D3 of the third stage.

This magnitude comparator M3 is operative so that in the case where data delivered to the input terminal group M3a, i.e., output of the data latch circuit D2 is larger than data delivered to the input terminal group M3b, i.e., output of the data latch circuit D3, and output of the comparison judgment result is allowed, it outputs first judgment result M3c of logic "1" level (H level).

Moreover, this magnitude comparator M3 is operative so that in the case where data delivered to the other input terminal group M3b, i.e., output of the data latch circuit D3 is larger than data delivered to one input terminal group M3a, i.e., output of the data latch circuit D2, and output of the comparison judgment result is allowed, it outputs second judgment result M3d of logic "1" level (H level). In addition, the minimum run length correction bit position detecting section 180 outputs the first judgment result M3c as correction bit position designation signal 18b, and outputs the second judgment result M3d as the correction bit position designation signal 18a.

A maximum run length correction bit position detecting section 190 uses magnitude comparator M4 caused to be of structure to output comparison results M4c, M4d in the case where an output control terminal M4e is supplied with (k'+1) detection signal 17a. One input terminal group M4a of the magnitude comparator M4 is supplied with output of the data latch circuit D2 of the second stage. The other input terminal group M4b of the magnitude comparator M4 is supplied with output of the data latch circuit D14 of the fourteenth stage.

This magnitude comparator M4 is operative so that in the case where data delivered to the input terminal group M4a, i.e., output of the data latch circuit D2 is smaller than data delivered to the input terminal group M4b, i.e., output of the data latch circuit D14, and output of the comparison judgment result is allowed, it outputs first judgment result M4c of logic "1" level (H level).

Moreover, this magnitude comparator M4 is operative so that in the case where data delivered to the input terminal group M4b, i.e., output of the data latch circuit D14 is smaller than data delivered to the input terminal group M4a, i.e., output of the data latch circuit D2, and output of the comparison judgment result is allowed, it outputs second judgment result M4d of logic "1" level (H level). In addition, this maximum run length correction bit position detecting section 190 outputs the first judgment result M4c as correction bit position designation signal 19b, and outputs the second judgment result M4d as correction bit position designation signal 19a.

Accordingly, the minimum run length correction bit position detecting section 180 compares the magnitude relationship between level difference data when binarization judgment of the leading bit is carried out with respect to the period where the run length of the same symbols is 2 in NRZI modulated channel bit data train, i.e., output of the data latch circuit D3 and level difference data when binarization judgment of the last bit of the period where the run length of the same symbols is 2, i.e., output of the data latch circuit D2, whereby in the case where level difference data when binarization judgment of the leading bit is carried out, i.e., output of the data latch circuit D3 is larger, it outputs correction bit position designation signal 18a to correct bit immediately before that leading bit. Moreover, this minimum run length correction bit position detecting section 180 is operative so that in the case where level difference data when binarization judgment of the last bit of the period where the run length of the same symbols is 2, i.e., output of the data latch circuit D2 is larger, it outputs correction bit position designation signal 18b to correct bit immediately after that last bit.

The maximum run length correction bit position detecting section 190 compares the magnitude relationship between level difference data when binarization judgment of the leading bit is carried out with respect to the period where the run length of the same symbols is 12 in NRZI modulated channel bit data train, i.e., output of the data latch circuit D14 and level difference data when binarization judgment of the last bit of the period where the run length of the same symbols is 12 is carried out, i.e., output of the data latch circuit D2, whereby in the case where level difference data when binarization judgment of the leading bit is carried out, i.e., output of the data latch circuit D14 is smaller, it outputs correction bit position designation signal 19a to correct the leading bit position thereof. Moreover, this maximum run length correction bit position detecting section 190 is operative so that in the case where level difference data when binarization judgment of the last bit of the period where the run length of the same symbols is 12 is carried out, i.e., output of the data latch circuit D2 is smaller, it outputs correction bit position designation signal 19b to correct that last bit.

It is to be noted that while there is shown in FIG. 1 the configuration adapted for temporarily storing, at reproduction RF signal level memory section 20, level difference data 14a between reproduction RF signal level data 11a obtained by converting reproduction RF signal 7a at A/D converter 11 and comparison level data 12a, there may be employed a configuration in which plural sets of sample-hold circuits of the charge storage type are used without using the A/D converter to store signal level of reproduction RF signal 7a when judgment of channel bit data is carried out. Moreover, there may be also employed a configuration in which charge transfer devices (elements) such as CCD, etc. are used to store signal level of reproduction RF signal 7a when judgment of channel bit data is carried out. Similarly, also with respect to the comparison level 9a, there may be employed a configuration to temporarily store signal level as mentioned above by utilizing the sample-hold circuit of the charge storage type or the charge transfer device (element) such as CCD, etc.

The operation of the data decoding apparatus according to this invention will now be described. Reproduction signal 6a which has been read out by the optical pick-up 6 from the optical disc 4 shown in FIG. 1 is amplified at the pre-amplifier 7. The signal thus amplified is waveform-shaped at the waveform shaper 8. The waveform-shaped signal thus obtained is then converted into pulse signal 8a of binary level. Thus, bit clock 10a synchronized with this pulse signal 8a is generated at the bit clock generating section 10. The bit clock thus obtained is outputted therefrom.

The respective A/D converters 11, 12 within the data decode processing section 3 allow the reproduction RF signal 7a and comparison level 9a to undergo A/D conversion on the basis of the bit clock 10a to output reproduction RF signal level data 11a and comparison level data 12a, respectively. The comparator section 13 compares the reproduction RF signal level data 11a and the comparison level data 12a, whereby in the case where the reproduction RF signal level data 11a is equal to the comparison level data 12a or more, it outputs binary signal of logic "1" level (H level) as channel bit data 13a, while in the case where the reproduction RF signal level data 11a is less than the comparison level data 12a, it outputs binary signal of logic "0" level (L level) as channel bit data 13a.

The channel bit data (binary signal) 13a outputted in synchronism with the bit clock 10a from the comparison section 13 is outputted through the 14-stage shift register within the bit data inversion correcting section 15, and is delivered to signal processing unit, etc. (not shown).

The level difference calculating section 14 calculates absolute value of difference between the reproduction RF signal level data 11a and the comparison level data 12a to output the absolute value thus obtained as level difference data 14a. The reproduction RF signal level memory section 20 temporarily stores the level difference data 14a in order of time series.

As shown in FIG. 2, the (d'−1) detecting section 16 is operative so that when it detects on the basis of outputs of the D-type flip-flops F1 to F4 of the first to fourth stages within the bit data inversion correcting section 15 that the run length of the same symbols is 2, it outputs (d'−1) detection signal 16a to the minimum run length correction bit position detecting section 18.

As shown in FIG. 3, the minimum run length correction bit position detecting section 18 compares level difference data of bit immediately before the (d'−1) period and level difference data of bit immediately after the (d'−1) period, whereby in the case where level difference data of bit immediately before (that period) is smaller, it outputs correction bit position designation signal 18a to the bit data inversion correcting section 15. Moreover, the minimum run length correction bit position detecting section 18 is operative so that in the case where level difference data of bit immediately after the (d'−1) period is smaller, it outputs correction bit position designation signal 18b to the bit data inversion correcting section 15.

The bit data inversion correcting section 15 shown in FIG. 2 is operative so that when correction bit position designation signal 18a is delivered thereto, it inverts logic level of the D-type flip-flop F4 of the fourth stage (logic level of bit immediately before). Moreover, the bit data inversion correcting section 15 is operative so that when correction bit position designation signal 18b is delivered thereto, it inverts logic level of the D-type flip-flop F1 of the first stage (logic level of bit immediately after). Thus, correction is made so that the period where the run length d' of the same symbols is 2 satisfies the condition of the minimum run length d'=3.

As shown in FIG. 2, the (k'+1) detecting section 17 is operative so that when it detects on the basis of outputs of the D-type flip-flops F1 to F14 of the first to fourteenth stages within the bit data inversion correcting section 15 that the run length of the same symbols is 12, it outputs (k'+1) detection signal 17a to the maximum run length correction bit position detecting section 19.

As shown in FIG. 3, the maximum run length correction bit position detecting section 19 compares level difference data of bit immediately before the (k'+1) period and level difference data of bit immediately after the (k'+1) period, whereby in the case where level difference data of bit immediately before is larger, it outputs correction bit position designation signal 19a to the bit data inversion correcting section 15. Moreover, the maximum run length correction bit position detecting section 19 is operative so that in the case where level difference data of bit immediately after the (k'+1) period is larger, it outputs correction bit position designation signal 19b to the bit data inversion correcting section 15.

The bit data inversion correcting section 15 shown in FIG. 2 is operative so that when the correction bit position designation signal 19a is delivered thereto, it inverts logic level of the D-type flip-flop F14 of the fourteenth stage (logic level of the leading bit). Moreover, the bit data inversion correcting section 15 is operative so that when the correction bit position designation signal 19b is delivered thereto, it inverts logic level of the D-type flip-flop F2 of the second stage (logical level of the last bit). Thus, correction is made such that the period where the run length k' of the same symbols is 12 satisfies the condition of the maximum run length k'=11.

It is to be noted that while, in FIG. 3, attention is drawn to bits at both outsides of the period where the condition of the minimum run length or the maximum run length is not satisfied to select bit position to be corrected on the basis of level difference (difference between reproduction RF signal level and comparison level) when binary levels of bits at those both sides are judged, attention may be drawn as shown in FIG. 4 to the leading bit and the last bit of the period where the condition of the minimum run length or the maximum run length is not satisfied to select bit position to be corrected on the basis of level difference when binary levels of the leading bit and the last bit are judged, i.e., difference between reproduction RF signal level and comparison level.

In the data decoding apparatus 1 according to this invention, in the case where level difference when, with respect to channel bits which are considered to have been erroneous in judgment of the binary level like channel bits of both outsides of the period of (d'-1), (k'+1) and the leading or the last bit of the period of (d'+1), (k'+1), level difference when the binary level of that channel bit data is judged, i.e., difference between reproduction RF signal level and comparison level is small, there is high probability that judgment of the binary level may be erroneous. Accordingly, smaller one of the level differences, i.e., differences between reproduction RF signal (values) and comparison level is corrected, thereby making it possible to carry out higher accuracy correction.

Moreover, in the data decoding apparatus 1 according to this invention, when in the case where the (d'-1) period is detected and any one of bit data of both sides of that (d'-1) period is considered to be erroneous, e.g., level difference of the leading bit (difference between reproduction RF signal level and comparison level) of the (d'-1) period is larger than level difference of the last bit, i.e., difference between reproduction RF signal level and comparison level of the (d'-1) period, there is high probability that the logic level of bit data at the outside of the leading bit may be the same as that of the period of (d'-1). Accordingly, data at the bit position of that side where the probability is high is corrected, thereby making it possible to carry out high accuracy correction.

Further, in the data decoding apparatus 1 according to this invention, in the case where the (k'+1) period is detected and any one of the leading bit and the last bit of that (k'+1) period is considered to be erroneous, there is high probability that data in which level difference (difference between reproduction RF signal level and comparison level) is smaller is erroneous in the binarization judgment. Accordingly, data of that bit position of the side where the probability is high is corrected, thereby making it possible to carry out high accuracy correction.

FIG. 5 is a timing chart for explaining the correcting operation in the case where the condition of the minimum run length is not satisfied. Reproduction RF signal 7a shown in FIG. 5(a) is caused to undergo A/D conversion in synchronism with rising of bit clock 10a shown in FIG. 5(b). Then, reproduction RF signal level data 11a obtained after undergone A/D conversion and comparison level data 12a are compared with each other at the comparator section 13. Thus, channel bit data train shown in FIG. 5(c) is obtained. In this case, in the period of (d'-1), the run length, i.e., the successive number of logic "0" levels (the same symbols) is 2. In the case of the code after undergone inverse NRZI modulation, i.e., the original code shown in FIG. 5(d), the successive number of logic "0" levels put between logic "1" levels becomes equal to 1. As a result, the condition of the minimum run length d=2 is not satisfied.

In view of the above, in the case where attention is drawn to bits at both outsides of the period of (d'-1), since level difference data (numeric value 2) immediately after the period of (d'-1) is smaller than level difference data immediately before (numeric value 4), bit immediately after the period of (d'-1) is corrected.

Moreover, in the case where attention is drawn to the leading bit and the last bit within the period of (d'-1), since level difference data (numeric value 8) of the last bit is larger than level difference data (numeric value 6) of the leading bit, bit at the outside adjacent to larger one (numeric value 8) of level difference data is corrected.

As described above, such an approach is employed to select bit position to be corrected on the basis of level difference data 14a shown in FIG. 5(e), i.e., level difference data stored in the reproduction RF signal level memory section 20 to invert channel bit data at the selected bit position, thereby making it possible to obtain the corrected channel bit data 15a which satisfies the condition of the minimum run length. In addition, the corrected code is caused to undergo inverse NRZI modulation by inverse NRZI modulator (not shown), thus making it possible to obtain the inverse NRZI modulated corrected code shown in FIG. 5(g).

FIG. 6 is a timing chart for explaining the correcting operation in the case where the condition of the maximum run length is not satisfied. Reproduction RF signal 7a shown in FIG. 6(a) is caused to undergo A/D conversion in synchronism with rising of bit clock 10a shown in FIG. 6(b). Reproduction RF signal level data 11a obtained after undergone A/D conversion and comparison level data 12a are compared with each other at the comparator section 13. Thus, channel bit data train shown in FIG. 6(c) is decoded. In this case, in the period of (k'+1), the run length (successive number) of logic "0" levels (the same symbols) is 12. In the inverse NRZI modulated code, i.e., the original code shown in FIG. 6(d), the successive number of logic "0" levels put between logic "1" levels becomes equal to 11. This does not satisfy the condition of the maximum run length k=10.

In view of the above, in the case where attention is drawn to bits of both outsides of the period of (k'+1), since level difference data immediately before the period of (k'+1) (numeric value 8) is larger than the level difference data immediately after that period (numeric value 4), bit adjacent to larger one of level difference data, i.e., the next bit of the immediately before bit is corrected.

Moreover, in the case where attention is drawn to the leading bit and the last bit of the period of (k'+1), since level difference data of the leading bit (numeric value 2) is smaller than level difference data of the last bit (numeric value 6), bit of smaller one (numeric value 2) of level difference data, i.e., the leading bit is corrected.

As stated above, since such an approach is employed to select bit position to be corrected on the basis of level difference data 14a shown in FIG. 6(e), i.e., level difference data stored in the reproduction RF signal level memory section 20 to invert channel bit data at the selected bit position, thereby making it possible to obtain the corrected channel bit data 15a which has satisfied the condition of the maximum run length as shown in FIG. 6(f). In addition, the corrected code is caused to undergo inverse NRZI modulation by inverse NRZI modulator (not shown), thereby making it possible to obtain the inverse NRZI modulated corrected code shown in FIG. 6(g).

Level difference data necessary for determining the correction bit position in the case where the (d'−1), (k'+1) periods are detected, i.e., in the case where the conditions of the minimum run length and the maximum run length are not satisfied is level difference data between bits of both sides of the periods of (d'−1), (k'+1), or between the leading bit and the last bit of the periods of (d'−1), (k'+1). Accordingly, while there is shown, in FIGS. 3 and 4, the configuration capable of temporarily storing level difference data of 14 bits as the reproduction RF signal level memory section 20, it is unnecessary to temporarily store all of the level difference data of 14 bits. Namely, e.g., random accessible memory (RAM) and a circuit for carrying out write/read operation thereof may be used to constitute the reproduction RF signal level memory section 20 to temporarily store only two sets of level difference data of 2 bits before and after in which channel bit data is inverted in a manner caused to correspond to the time series.

It is to be noted that while explanation has been given in this embodiment in connection with the configuration for determining bit position to be corrected on the basis of difference between reproduction RF signal level and comparison level, bit position to be corrected may be also determined on the basis of only the magnitude relationship of the reproduction RF signal level. The reason thereof is as follows. Even in the case where comparison is made with respect to bits of both outsides of the period of (d'−1) and the period of (k'+1), and even in the case where comparison between the leading bit and the last bit of the period of (d'−1) and the period of (k'+1) is made, since logic levels of two bits to be compared are judged to be the same, when logic level of bit to be compared is 1, bit in which reproduction RF signal level is larger is judged to have large difference with respect to the comparison level. On the other hand, when logic level of bit to be compared is 0, bit in which the reproduction RF signal level is smaller is judged to have large difference with respect to the comparison level.

Moreover, while, in the above-described embodiment, such an approach is employed to detect, with respect to channel bit data train obtained at the comparator section 13, channel bit data in which the run length of the same symbols is (d'−1) by the (d'−1) detecting section 16 to carry out correction processing by the bit data inversion correcting section 15 so as to keep the minimum run length d, there may be employed an approach, as shown in FIG. 7, for example, to detect channel bit data in which the run length of "0" after undergone inverse NRZI modulation is (d−1) to invert channel bit data of smaller side on the basis of the magnitude relationship between reproduction RF signal level at the time of level judgment of channel bit data immediately before the (d−1) period and reproduction RF signal level at the time of level judgment of channel bit data immediately after the (d−1) period, thereby making it possible to carry out correction processing so as to keep the minimum run length d.

FIG. 7 corresponds to the FIG. 5 mentioned above, wherein reproduction RF signal is shown in (a), bit clock is shown in (b), channel bit data train is shown in (c), code after undergone inverse NRZI modulation, which is labeled INVERSE NRZI MODULATED CODE in the figure, (original code) is shown in (d), level difference data is shown in (e), and code after undergone inverse NRZI modulation which has been corrected so as to satisfy the condition of the minimum run length, which is labeled CORRECTED INVERSE NRZI MODULATED CODE in the figure, is shown in (f).

Moreover, while, in the above-described embodiment, reproduction RF signal level data 11a is compared with one comparison level data 12a at the comparator section 13 to thereby obtain binarized (binary) channel bit data, this invention is only required to decode reproduction RF signal which has been read out from the recording medium by at least one comparison level to output channel bit data, and can be therefore applied also to the case where channel bit data is generated from reproduction RF signal by the comparator section having two comparison levels or more.

Figure 8:
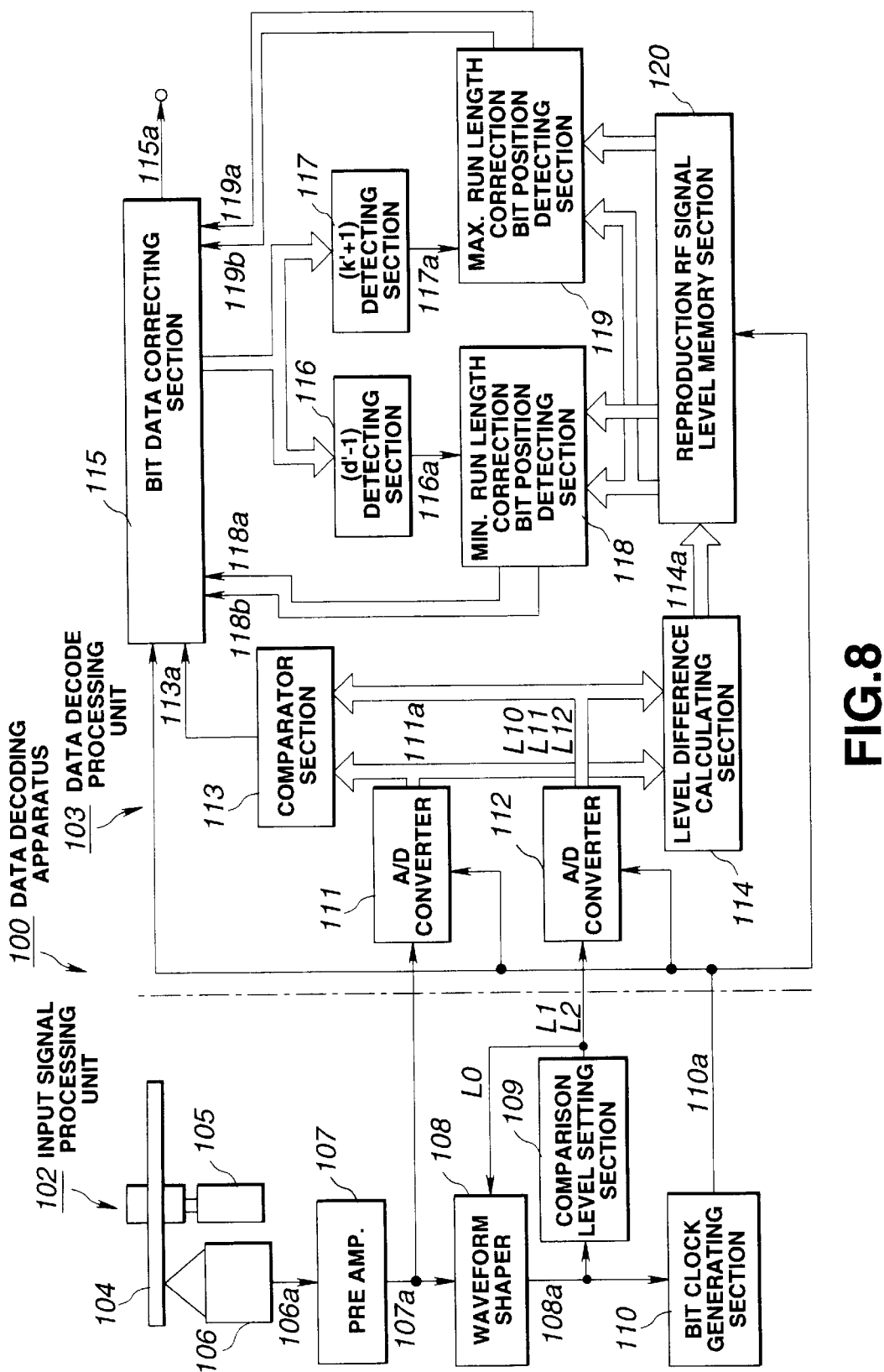
FIG. 8 is a block diagram showing another configuration of the data decoding apparatus to which this invention is applied.

FIG. 8 is a block diagram showing the configuration of a data decoding apparatus 100 according to the invention, which is adapted for generating channel bit data from reproduction RF signal by a comparator section 113 having two comparison levels L1, L2.

This data decoding apparatus 100 is roughly composed of an input signal processing unit 102 and a data decode processing unit 103. In FIG. 8, servo circuit, etc. which does not directly participate in the operation of the data decoding apparatus is omitted.

The input signal processing unit 102 comprises a spindle motor 105 for rotationally driving an optical disc 104, an optical pick-up 106 for irradiating laser beams onto the signal recording surface of the optical disc 104 through object lens (objective), and for receiving reflected light from the optical disc 104 to output a reproduction signal 106a, a pre-amplifier 107 for amplifying the reproduction signal 106a outputted from the optical pick-up 106, a waveform shaper 108 for waveform-shaping reproduction RF signal 107a as shown in FIG. 9(a), for example, thereafter to output a binarized pulse signal 108a on the basis of comparison level L0, a comparison level setting section 109 for comparing d.c. voltage obtained by integrating the pulse signal 108a outputted from the waveform shaper 108 and reference voltage to carry out negative feedback control of the comparison level L0, and a bit clock generating section 110 of the PLL system for generating bit clock 110*a* on the basis of the pulse signal 108*a* outputted from the waveform shaper 108 to output it. The comparison level setting section 109 delivers the comparison level L0 to the waveform shaper 108, and delivers, to the data decode processing section 103, two comparison levels L1, L2 set in upper and lower directions with the comparison level L0 being as the center level.

The data decode processing section 103 comprises an A/D converter 111 for reproduction RF signal, which samples reproduction RF signal 107*a* on the basis of bit clock 110*a* to quantize the sampled reproduction RF signal to output reproduction RF signal level data 111*a*, an A/D converter 112 for comparison level, which samples comparison levels L0, L1, L2 on the basis of bit clock 110*a* to quantize the sampled comparison levels to output comparison level data L10, L11, L12, a comparator section 113 for comparing the reproduction RF signal level data 111*a* and the comparison level data L1, L12 to output channel bit data (signal after undergone inverse NRZI modulation, i.e., original signal) 113*a*, a level difference calculating section 114 supplied with the reproduction RF signal level data 111*a* and the comparison level data L10 or the comparison level data L11, L12 to calculate absolute value of difference between the reproduction RF signal level and the comparison level L10, i.e., the center level to output level difference data 114*a*, a bit data correcting section 115, a (d−1) detecting section 116, a (k+1) detecting section 117, a minimum run length correction bit position detecting section 118, a maximum run length correction bit position detecting section 119, and a reproduction RF signal level memory section 120.

The operation of this data decoding apparatus will now be described. Reproduction signal 106*a* which has been read out through the pick-up 106 from the optical disc 104 shown in FIG. 8 is amplified at the pre-amplifier 107. The signal thus amplified is waveform-shaped at the waveform shaper 108. The waveform-shaped signal thus obtained is then outputted as pulse signal 108*a* of binary level. Thus, a bit clock 110*a* as shown in FIG. 9(*b*) synchronized with this pulse signal 108*a* is generated at the bit clock generating section 110, and is outputted therefrom.

In this example, the bit clock 110*a* at this time is shifted by 50% as compared to the bit clock shown in FIG. 7(*b*).

Figure 10:
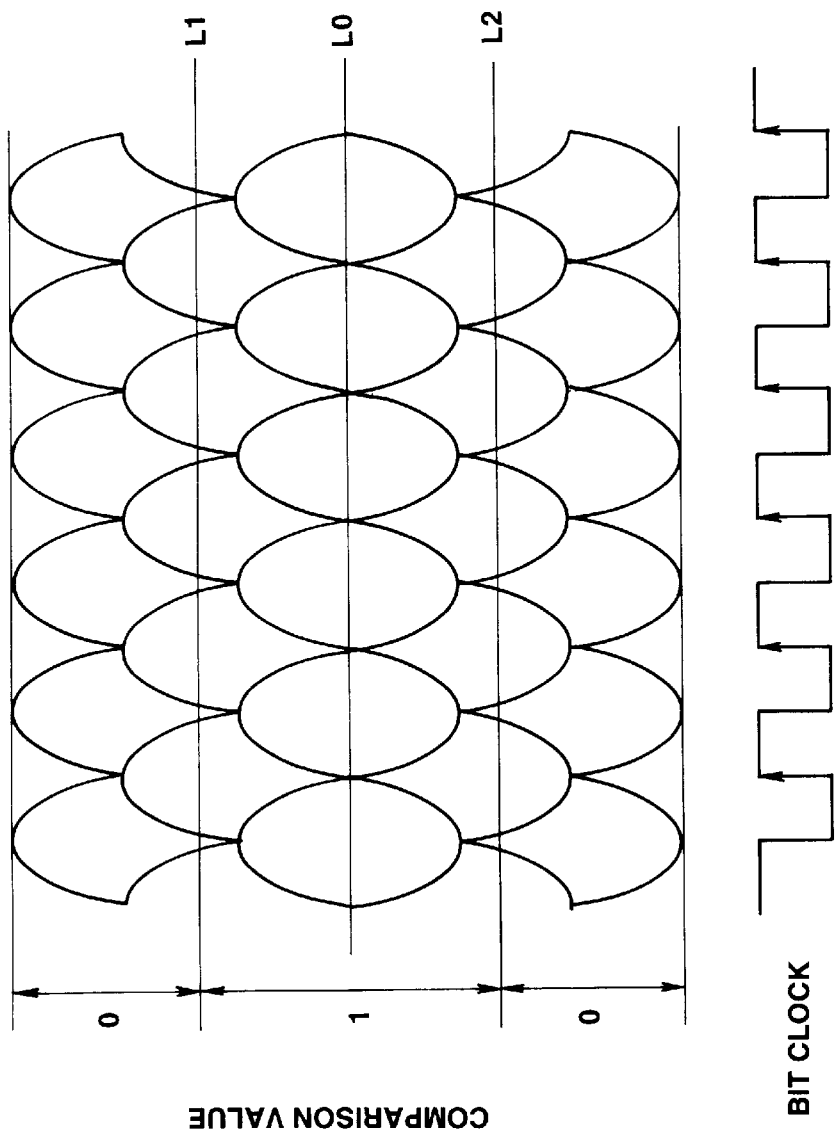
FIG. 10 is a view showing an eye pattern of reproduction RF signal in the data decoding apparatus shown in FIG. 8.

The A/D converters 111, 112 within the data decode processing section 103 respectively allow the reproduction RF signal 107*a* and the comparison levels L0, L1, L2 to undergo A/D conversion on the basis of the bit clock 110*a* to output reproduction RF signal level data 111*a*, and comparison level data L10, L11, L12. The comparator section 113 compares, with respect to reproduction RF signal having an eye pattern as shown in FIG. 10, its reproduction RF signal level data 111*a* and comparison levels L11, L12, whereby in the case where the reproduction RF signal level data 111*a* falls within the range between the comparison levels L11, L12, it outputs binary signal 113*a* of logic "1" level (H level) as channel bit data (signal after undergone inverse NRZI modulation, i.e., original signal), while in the case where the reproduction RF signal level data 111*a* does not fall within the range between the comparison levels L11, L12, it outputs binary signal 113*a* of logic "0" level (L level) as channel bit data.

The channel bit data (binary signal) 113*a* outputted in synchronism with bit clock 110*a* from the comparator section 113 is outputted through the bit data correcting section 115, and is then delivered to signal processing unit, etc. (not shown).

The level difference calculating section 114 calculates absolute value of difference between reproduction RF signal level and comparison level L10 to output the absolute value thus obtained as level difference data 114*a*. Alternatively, the level difference calculating section 114 may output absolute value of difference between reproduction RF signal level and comparison level L11 or L12 crossing or traversing therewith. The reproduction RF signal level memory section 120 temporarily stores the level difference data 114*a* in order of time series.

The (d−1) detecting section 116 is operative so that when it detects on the basis of output of the bit data correcting section 115 that the run length of the same symbols is 1, it outputs (d−1) detection signal 116*a* to the minimum run length correction bit position detecting section 118.

The minimum run length correction bit position detecting section 118 compares level difference data of bit of logic "0" level immediately before the (d−1) period and level difference data of the next bit of the bit of logic "0" level immediately after the (d−1) period to output, to the bit data correcting section 115, correction bit position designation signal 118*a* to designate the side where absolute value is smaller as the correction bit, and to designate 1 bit of the side to keep the minimum run length d adjacent thereto (bit positioned inside by 1 bit) as the correction bit. Alternatively, when level difference data is calculated on the basis of comparison levels L1, L2, the detecting section 118 outputs, to the bit data correcting section 115, correction bit position designation signal 118*a* to designate bit in which the absolute value is smaller as the correction bit, and to designate 1 bit of the side to keep the minimum run length d adjacent thereto (bit positioned inside by 1 bit) as the correction bit. Moreover, the minimum run length correction bit position detecting section 118 compares level difference data of the first bit of logic "1" level of the (d−1) period and level difference data of the subsequent bit of logic "1" level of the (d−1) period to output, to the bit data correcting section 115, correction bit position designation signal 118*b* to designate bit of the side where the absolute value is larger as the correction bit, and to designate 1 bit of the side to keep the minimum run length d adjacent thereto (bit positioned outside by 1 bit) as the correction bit.

The bit data correcting section 115 inverts logic levels of respective correction bits designated by the correction bit position designation signals 118*a*, 118*b*. Thus, correction is made such that the period where the run length d of logic "0" levels falling (assigned) between successive logic "1" levels within the code series is 1 satisfies the condition of the minimum run length d=2.

It is to be noted that, in the bit data correcting section 115, in place of inverting logic levels of respective correction bits designated by the correction bit position designation signals 118*a*, 118*b*, an approach may be employed to shift correction bit of logic "1" level to the outside of the (d−1) period to thereby to make a correction such that the period where the run length d of logic "0" levels falling (assigned) between successive logic "1" levels within the code series is 1 satisfies the condition of the minimum run length d=2.

As stated above, bit position to be corrected is selected on the basis of level difference data 114*a* shown in FIG. 9(*d*), i.e., level difference data stored in the reproduction RF signal level memory section 120 to invert channel bit data of the selected bit position, thereby making it possible to provide channel bit data (inverse NRZI modulated signal, i.e., original signal) 115*a* corrected so as to satisfy the condition of the minimum run length as shown in FIG. 9(*e*).

Moreover, the (k+1) detecting section 117 is operative so that when it detects on the basis of output of the bit data correcting section 115 that the run length of the same symbols is 11, it outputs (k+1) detection signal 117a to the maximum run length correction bit position detecting section 119.

The maximum run length correction bit position detecting section 119 outputs correction bit position designation signal 119a or correction bit position designation signal 119b to the bit data correcting section 115 by an operation similar to the minimum run length correction bit position detecting section 118. The bit data correcting section 115 inverts logic levels of respective correction bits designated by the correction bit position designation signals 119a, 119b. Thus, correction is made such that the period where the run length k of logic "0" levels falling (assigned) between successive logic "1" levels within the code series is 11 satisfies the condition of the maximum run length k=10.

As in the above-described embodiment, in carrying out data decode (decoding) by binary levels with the comparison level being as the boundary, in the case where decoding is made such that length of d' where the run length of the same symbols is minimum becomes equal to length of (d'−1), information of sample value immediately before and sample value immediately after between which the position crossing or traversing the comparison level is put are used, thereby making it possible to more probably make a correction such that length of (d'−1) becomes equal to length of d'. As a result, data decode (decoding) error in the vicinity of the minimum inverting interval $T_{min}$ can be decreased. Thus, the bit error rate can be improved.

However, when the skew angle in the tangential direction is caused to be further large, error takes place also at the shorter run length of the same symbols. Namely, in addition to the case where the length of $T_{min}$ (d') is erroneously decoded into length of $T_{min-1}$ (d'−1), it is conceivable that error rate is deteriorated resulting from the fact that length of $T_{min}$ (d') is decoded into length of $T_{min-2}$ (d'−2). For example, in the EFM system, in the case where skew takes place in the tangential direction, when bit interval of the recording waveform train is assumed to be T, occurrence of error resulting from the fact that 3T which is the minimum inverting interval $T_{min}$ is decoded into 2T or 1T was observed to much degree.

When the bit interval of the recording waveform train is assumed to be T, data in which 3T which is $T_{min}$ is erroneously decoded into 1T is corrected (modified) by 1 bit at both sides of the edge thereof, thereby making it possible to carry out more probable data decode (decoding) such that length of 1T becomes equal to length of 3T.

Namely, in the data decoding apparatus in the data reproducing equipment for the recording medium on which there are recorded recording codes where the minimum run length of the same symbols after recording codes which satisfy d≧2 of recording codes in which the minimum run length of "0" falling (assigned) between successive "1" within the code series is d are subjected to NRZI modulation is expressed as d'=d+1, correction processing is carried out with respect to channel bit data in which the run length of the same symbols is (d'−2) so that the run length of the same symbols becomes equal to d', thereby making it possible to reduce data decode (decoding) error in the vicinity of the minimum inverting interval $T_{min}$. Thus, the bit error rate can be improved. Alternatively, correction processing is carried out with respect to channel bit data in which the run length of "0" after undergone inverse NRZI modulation is (d−2) so that the run length of "0" becomes equal to d, thereby making it possible to reduce data decode (decoding) error in the vicinity of the minimum inverting interval $T_{min}$. Thus, the bit error rate can be improved.

Moreover, also in the case where the run length of the same symbols where occurrence time period of error is long, i.e., length of $T_{max}$ (k') is erroneously decoded into length of $T_{max+1}$ (k'+1), or $T_{max+2}$ (k'+2), similar correction can be applied.

Namely, in the data decoding apparatus in the data reproducing equipment for the recording medium on which there are recorded recording codes in which the maximum run length of the same symbols after recording codes in which the maximum run length of "0" falling (assigned) between successive "1" within the code series is k are subjected to NRZI modulation is expressed as k'=k+1, correction processing is carried out with respect to channel bit data in which the run length of the same symbols is (k'+2) so that the run length of the same symbols becomes equal to k', thereby making it possible to reduce data decode (decoding) error in the vicinity of the maximum inverting interval $T_{max}$. Thus, the bit error rate can be improved. Alternatively, correction processing is carried out with respect to channel bit data in which the run length of "0" after undergone inverse NRZI modulation is (k+2) so that the run length of "0" becomes equal to k, thereby making it possible to reduce data decode (decoding) error in the vicinity of the maximum inverting interval $T_{max}$. Thus, the bit error rate can be improved.

Figure 11:
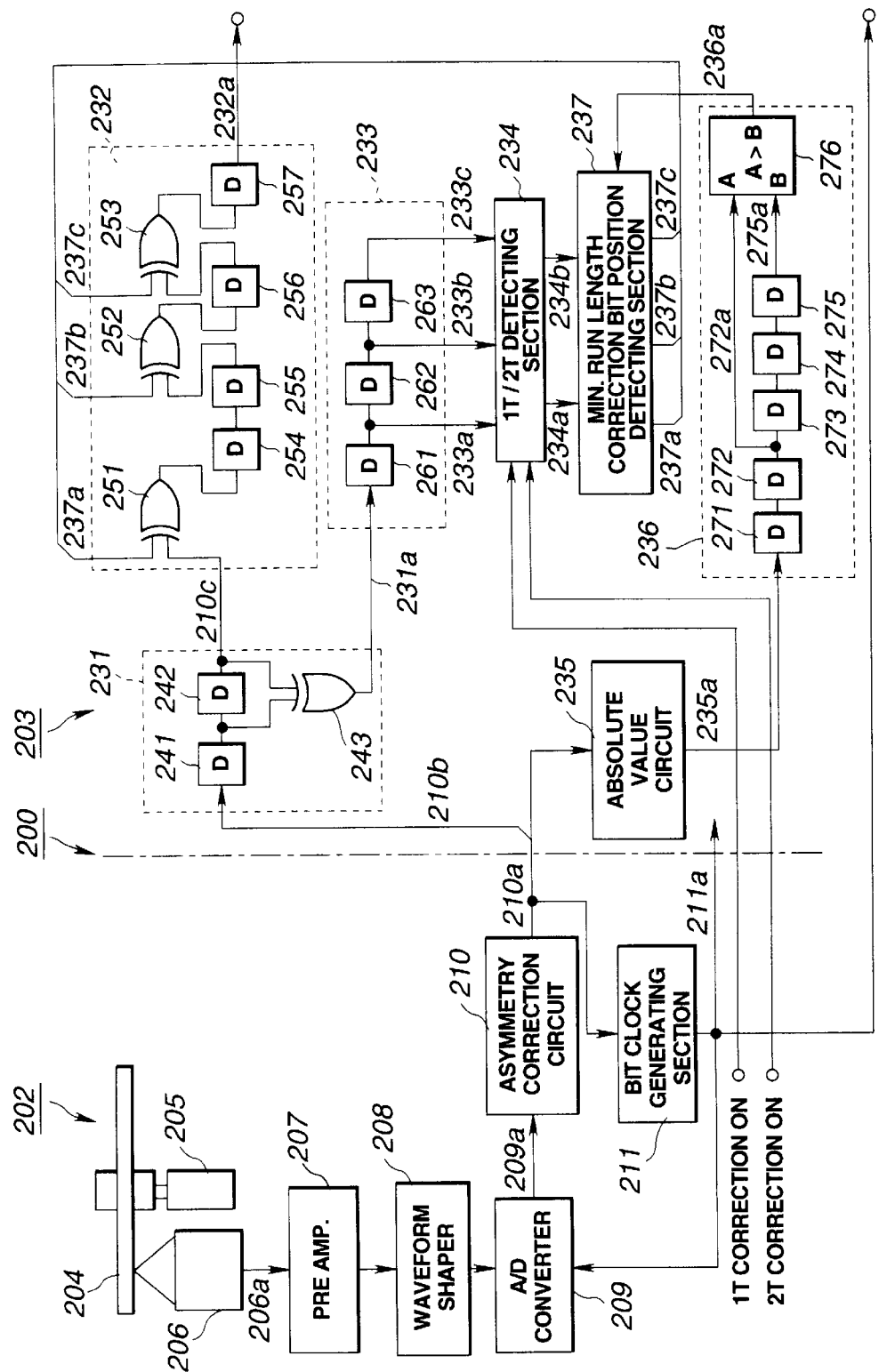
FIG. 11 is a block diagram showing a further configuration of the data decoding apparatus to which this invention is applied.

FIG. 11 is a block diagram showing the configuration of a further embodiment of the data decoding apparatus according to this invention. In this embodiment, only the function to correct signals of 1T and 2T so that 3T is provided is realized. This data decoding apparatus 200 is roughly composed of an input signal processing unit 202 and a data decode processing unit 203. In FIG. 11, servo circuit, etc. which does not directly participates in the operation of the data decoding apparatus is omitted.

The input signal processing unit 202 comprises a spindle motor 205 for rotationally driving an optical disc 204, an optical pick-up 206 for irradiating laser beams onto the signal recording surface of the optical disc 204 through object lens (objective), and for receiving reflected light from the optical disc 204 to output a reproduction signal 206a, a pre-amplifier 207 for amplifying the reproduction signal 206a outputted from the optical pick-up 206, a waveform equalizer 208 for carrying out waveform equalization of a signal outputted from the pre-amplifier 207, an A/D converter 209 for sampling the reproduction RF signal outputted from the waveform equalizer 208 by bit clock 211a which will be described later to quantize the sampled reproduction RF signal to output reproduction RF signal level data 209a, an asymmetry correction circuit 210 for correcting asymmetry of the reproduction RF signal correction level data 209a to output reproduction RF signal correction level data 210a, and a bit clock generating circuit 211 of the PLL system for generating bit clock 211a on the basis of the reproduction RF signal correction level data 210a to output it.

Figure 12:
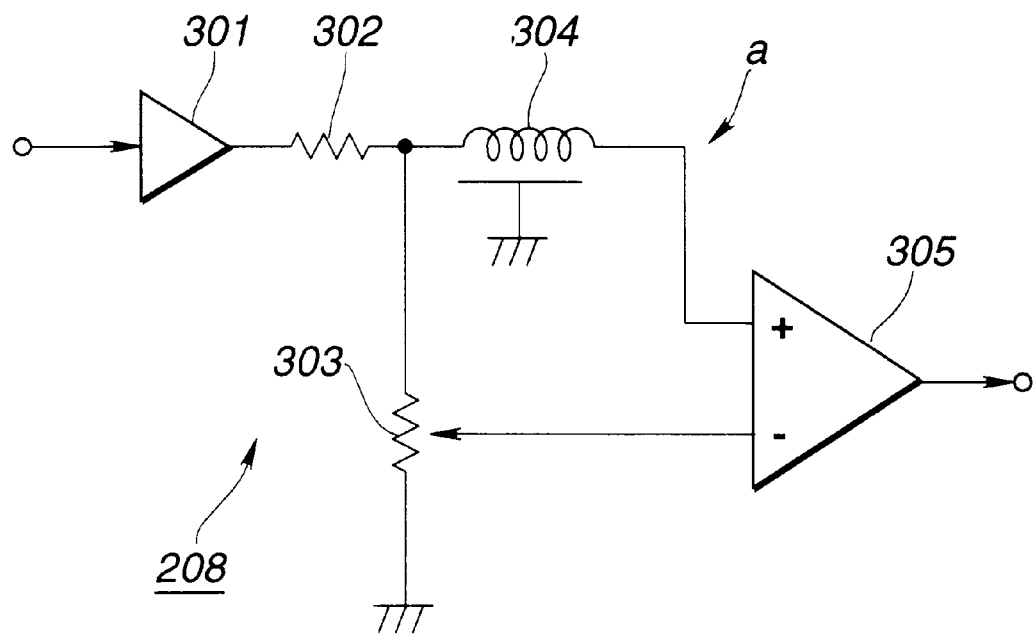
FIG. 12 is a circuit diagram showing the configuration of cosine equalizer used as waveform equalizer in the data decoding apparatus shown in FIG. 11.

As the waveform equalizer 208, high frequency raising filter of the linear phase type is used for the purpose of correcting lowering in the amplitude at high frequency determined by the optical frequency characteristic, for example. In more practical sense, e.g., cosine equalizer of a configuration as shown in FIG. 12 is conceivable. The cosine equalizer shown in the FIG. 12 mentioned above is composed of a buffer amplifier 301, a resistor 302, a variable resistor 303, a delay line 304, and a differential amplifier 305. In the delay line 304, it is assumed that the delay time is τ and the characteristic impedance is R0. Moreover, it is assumed that the resistance value of the resistor 302 is equal to R0, and the resistance value of the variable resistor 303 and the input impedance of the differential amplifier 305 are sufficiently larger than R0. In this case, total reflection takes place at the a end of the delay line 304. When the frequency response of the cosine equalizer is determined, the frequency response is expressed as follows.

$$H(\omega)=1-2k\cdot\cos \omega\tau$$

In the above expression, k is assumed to be attenuation ratio by the variable resistor 303. By suitably selecting the attenuation ratio k and the delay time τ, suitable waveform equalization can be carried out.

Figure 13:
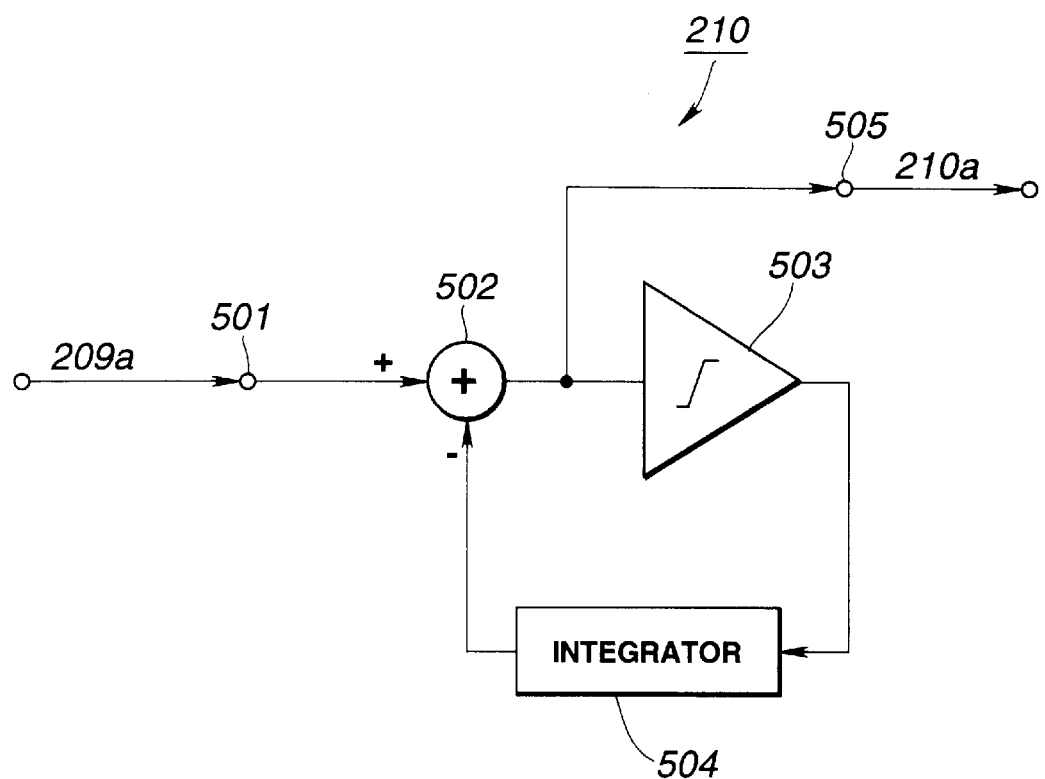
FIG. 13 is a circuit diagram showing the configuration of asymmetry correction circuit in the data decoding apparatus shown in FIG. 11.

While various configurations are conceivable as the configuration of the asymmetry correction circuit 210, e.g., an asymmetry correction circuit constituted as shown in FIG. 13 may be used. The asymmetry correction circuit 210 shown in the FIG. 13 mentioned above is the circuit according to the Japanese Patent Application No. 201412/1995 that the applicant of this application has already proposed, and is composed of a subtracter 502, an amplitude limiter 503, and an integrator 504. In this circuit, input terminal 501 is supplied with reproduction RF signal level data 209a which is output of the A/D converter 209. This reproduction RF signal level data 209a is sample train sampled by bit clock 211a. This reproduction RF signal level data 209a is caused to undergo a processing such that output of the integrator 504 is subtracted therefrom by the subtracter 502. Then, the reproduction RF signal level data 209a thus processed is delivered to the amplitude limiter 503, and is outputted from output terminal 505. The signal which has been amplitude-limited by the amplitude limiter 503 is integrated at the integrator 504. Then, integral output of this integrator 504 is delivered to the subtracter 502.

In the asymmetry correction circuit 210 of such a configuration, output of the subtracter is controlled so that the time that output signal of the amplitude limiter 503 takes value of positive level and the time that the output signal of the amplitude limiter 503 takes value of negative level are equal to each other. Namely, this means that the asymmetry of the reproduction RF signal level data 209a is corrected so that zero level of signal becomes equal to threshold for binarization. The signal which has been asymmetry-corrected in this way is obtained as output of the subtracter 502. Thus, output of this subtracter 502 is outputted from the output terminal 505 as reproduction RF signal correction level data 210a.

Figure 14:
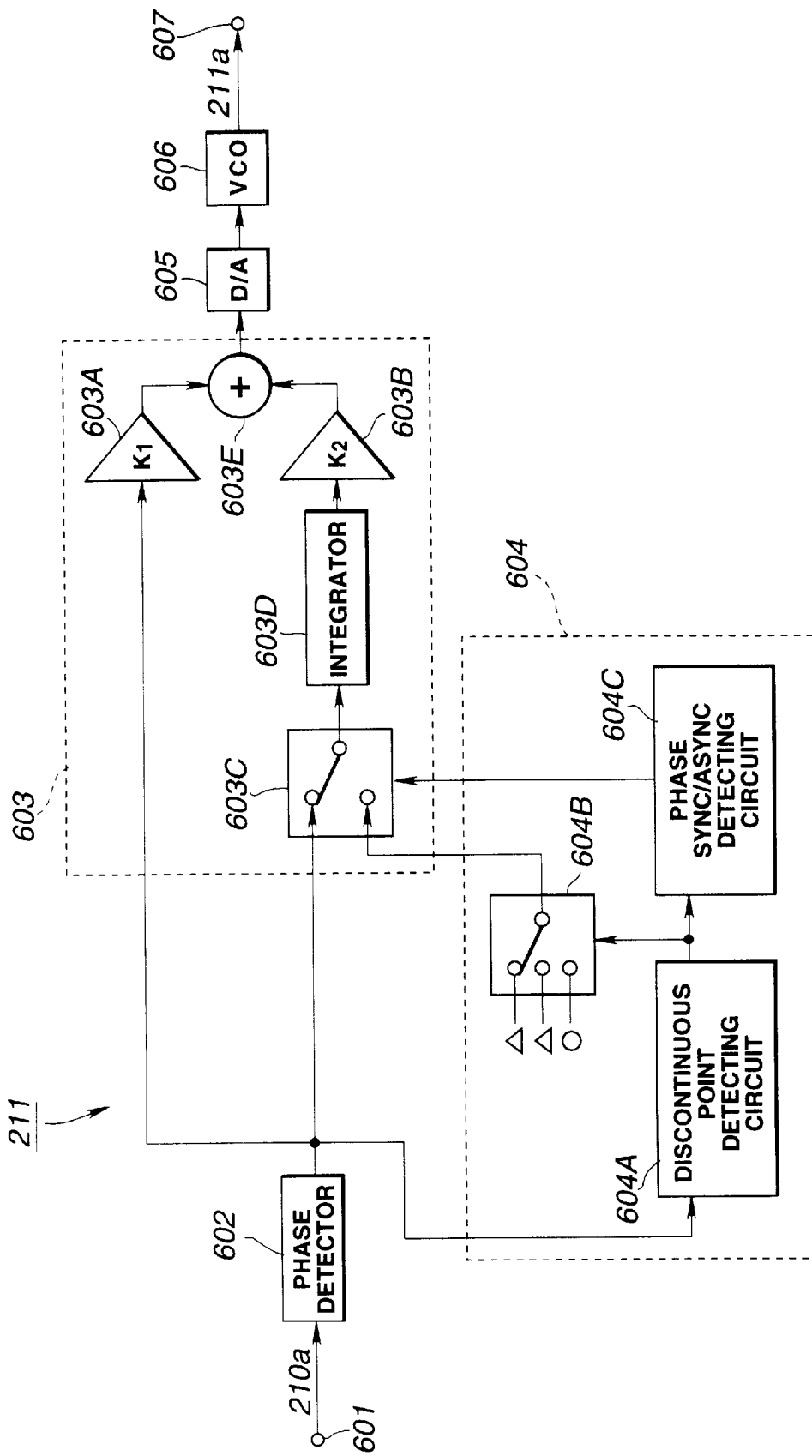
FIG. 14 is a circuit diagram showing the configuration of bit clock generating circuit in the data decoding apparatus shown in FIG. 11.

Moreover, while various configurations are conceivable as the configuration of the bit clock generating circuit 211, e.g., a bit clock generating circuit constituted as shown in FIG. 14 may be used. The bit clock generating circuit 211 shown in the FIG. 14 mentioned above is the circuit according to the Japanese Patent Application No. 312190/1994 that the applicant of this application has already proposed, and is composed of a phase detector 602, a loop filter 603, a frequency pulling-in circuit 604, a D/A converter 605, and a voltage controlled oscillator 606. In this circuit, input terminal 601 is supplied with reproduction RF signal correction level data 210a which is output of the asymmetry correction circuit 210.

This reproduction RF signal correction level data 210a is delivered to the phase detector 602 through the input terminal 601. This phase detector 602 calculates phase difference between bit clock 211a which is the sampling clock and reproduction RF signal from two sample values between which the zero level is put with respect to the reproduction RF signal correction level data 210a.

A phase difference signal outputted from the phase detector 602 is inputted to the loop filter 603 and the frequency pulling-in circuit 604.

The loop filter 603 is composed of a k1 gain amplifier 603A, a k2 gain amplifier 603B, an input switcher 603C, an integrator 603D, and an adder 603E, and has such a transfer characteristic that the secondary control loop can be constituted as a whole.

The frequency pulling-in circuit 604 is composed of a discontinuous point detecting circuit 604A, a coefficient switcher 604B, and a phase synchronization/asynchronization (sync/async) detecting circuit 604C, and is constituted so as to control the input switcher 603C of the loop filter 603 by detection output by the phase synchronization/asynchronization detecting circuit 604C while controlling the coefficient switcher 604B in dependency upon detection state of the discontinuous point of phase difference signal by the discontinuous point detecting circuit 604A. Namely, the frequency pulling-in circuit 604 utilizes that discontinuous point is caused to take place in the phase difference signal in the case where the bit clock 211a is pulled out (frequency deviates from a prescribed frequency) to manipulate (operate) output of the integral term of the loop filter 603 so that a desired frequency can be obtained. Output of the loop filter 603 is converted into an analog signal at the D/A converter 605. The analog signal thus obtained is then inputted to the voltage controlled oscillator 606 thus to control frequency of bit clock 211a outputted from output terminal 607. Thus, the bit clock 211a is brought into the state where synchronization with the zero cross point of the RF reproduction signal is taken.

It is to be noted that, in this example, the zero cross point of the reproduction RF signal and two rising edges of the bit clock have the phase difference relationship of 180 degrees therebetween, i.e., control is made such that the zero cross point of the reproduction RF signal is caused to fall at the middle point of two rising edges of the bit clock. This is realized, e.g., by calculating sum of sample values of two points between which the zero level of the reproduction RF signal correction level data 210a is put to use, as the phase difference signal, the signal of sum in the case where two points exist at the rising edges, and to use, as the phase difference signal, a signal obtained by inverting polarity of the signal of sum in the case where they exist at falling edges.

While various forms may be conceivable as the form of representation of the reproduction RF signal correction level data 210a, that form is assumed to be form of two's complement of 8 bits here. Values at two's complement of 8 bits with respect to actual numeric values are indicated by the following Table 1.

TABLE 1

| NUMERIC VALUE | TWO'S COMPLEMENT (DECIMAL NOTATION) | TWO'S COMPLEMENT (HEXADECIMAL NOTATION) | TOW'S COMPLEMENT (BINARY NOTATION) |
|---|---|---|---|
| −128 | 128 | 80 | 10000000 |
| −127 | 129 | 81 | 10000001 |
| −126 | 130 | 82 | 10000010 |
| . | . | . | . |
| . | . | . | . |

TABLE 1-continued

| NUMERIC VALUE | TWO'S COMPLEMENT (DECIMAL NOTATION) | TWO'S COMPLEMENT (HEXADECIMAL NOTATION) | TOW'S COMPLEMENT (BINARY NOTATION) |
|---|---|---|---|
| . | . | . | . |
| . | . | . | . |
| . | . | . | . |
| −2 | 254 | FE | 11111110 |
| −1 | 255 | FF | 11111111 |
| 0 | 0 | 0 | 00000000 |
| 1 | 1 | 1 | 00000001 |
| 2 | 2 | 2 | 00000010 |
| . | . | . | . |
| . | . | . | . |
| . | . | . | . |
| 126 | 126 | 7E | 01111110 |
| 127 | 127 | 7F | 01111111 |

The data decode processing section 203 is composed of an edge detecting circuit 231 for outputting edge pulse 231a which is caused to be at H level when code bit 210b of the reproduction RF signal correction level data 210a is inverted, a bit data inversion correcting section 232 for correcting channel bit data on the basis of correction bit position which will be described later with respect to delay code bit 210c obtained by delaying the code bit 210b by the edge detecting circuit 231 to output inversion corrected output 232a, a shift register 233 for delaying, in bit clock units, edge pulse 231a which is output of the edge detecting circuit 231, a 1T/2T detecting section 234 for detecting 1T and 2T patterns from outputs 233a to 233c of the first to third stages of the shift register 233 to output 1T detection pulse 234a and 2T detection pulse 234b, an absolute value circuit 235 for calculating absolute value of the reproduction RF signal correction level data 210a, an absolute value comparison section 236 for carrying out comparison in magnitude at two points caused to have difference by a predetermined time of reproduction RF signal absolute value data 235a obtained by the absolute value circuit 235 to output comparison result signal 236a, and a minimum run length correction bit position detecting section 237 for detecting position of the minimum run length correction bit on the basis of the 2T detection pulse 234a, the 2T detection pulse 234b and the comparison result signal 236a to output correction bit position signals 237a, 237b, 237c.

In this case, as the code bit 210b, in the case of the representation form of two's complement of 8 bits used in this embodiment, the most significant bit (MSB) corresponds to this code bit 210b as seen from the Table 1, and this code bit is caused to be at L level when the reproduction RF signal correction level data 210a takes positive value or zero value, and is caused to be at H level when it takes negative value.

Bit clock 211a is delivered to respective D-type flip-flops constituting the shift register and D-type flip-flops constituting other circuit components within the data decode processing section 203.

The 1T/2T detecting section 234 is also supplied with two control signals of 1T correction ON and 2T correction ON by system controller (not shown).

The edge detecting circuit 231 comprises D-type flip-flops 241, 242 for delaying code bit 210b inputted thereto, and an Exclusive logical sum circuit 243 for taking exclusive logical sum of outputs of the D-type flip-flops 241, 242.

The bit data inversion correcting section 232 comprises Exclusive logical sum circuits 251, 252, 253, and D-type flip-flops 254, 255, 256, 257.

The shift register 233 comprises D-type flip-flops 261, 262, 263.

Figure 15:
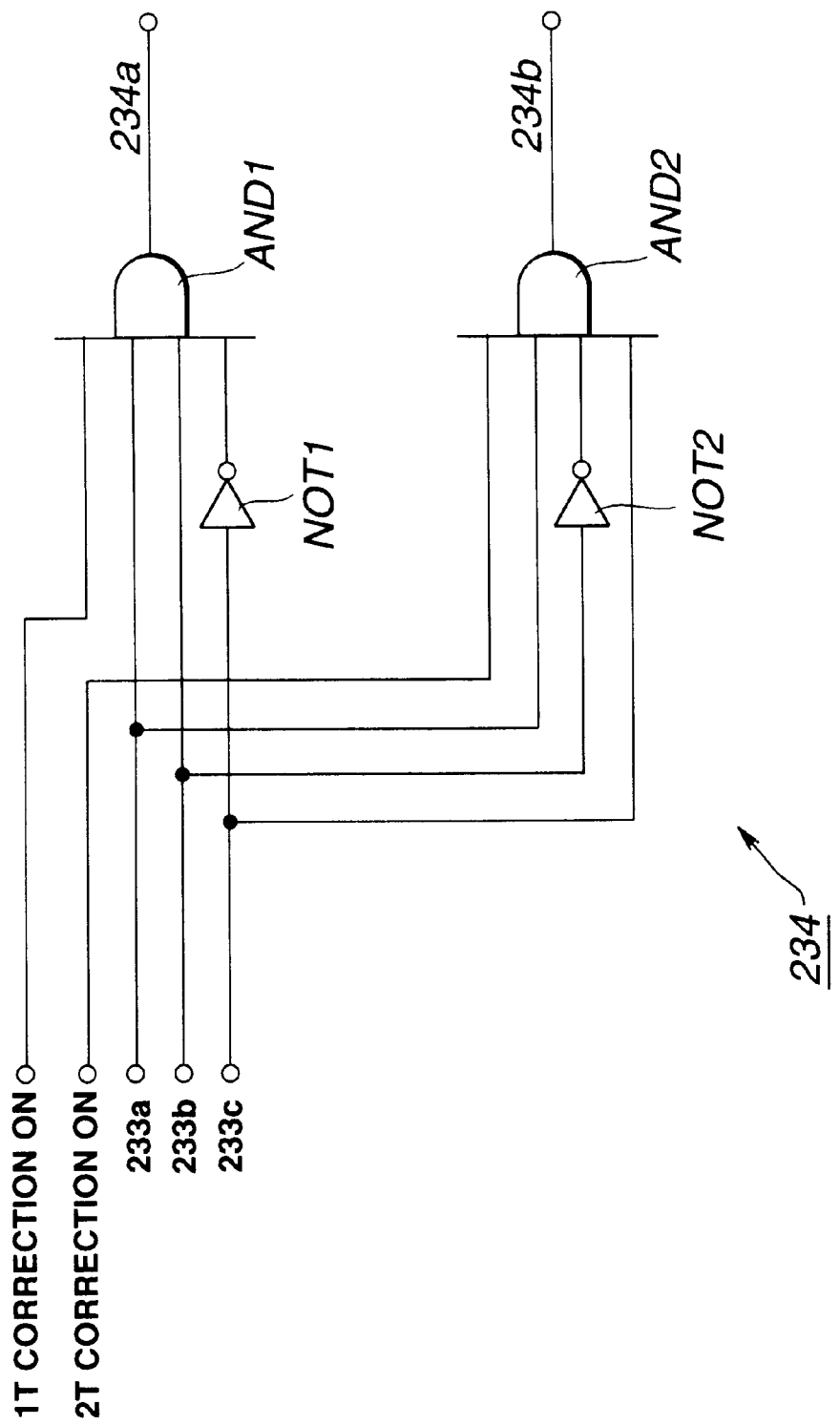
FIG. 15 is a circuit diagram showing the configuration of logic circuit used as 1T/2T detecting section in the data decoding apparatus shown in FIG. 11.

As the 1T/2T detecting section 234, there is used a logic circuit constituted by negative logic circuits NOT 1, NOT 2, and logical product circuits AND1, AND2 as shown in FIG. 15, for example. This logic circuit realizes logic of the Truth Table indicated by the following Table 2 by the negative logic circuits NOT1, NOT2 and the logical product circuits AND1, AND2.

TABLE 2

| 1T CORRECTION ON | 2T CORRECTION ON | DELAY OUTPUT 233a | DELAY OUTPUT 233b | DELAY OUTPUT 233c | DETECTION OUTPUT 234a | DETECTION OUTPUT 234b |
|---|---|---|---|---|---|---|
| L | L | X | X | X | L | L |
| X | X | L | X | X | L | L |
| X | X | H | L | L | L | L |
| X | L | H | L | H | L | L |
| X | H | H | L | H | L | H |
| L | X | H | H | L | L | L |
| H | X | H | H | L | H | L |

Figure 16:
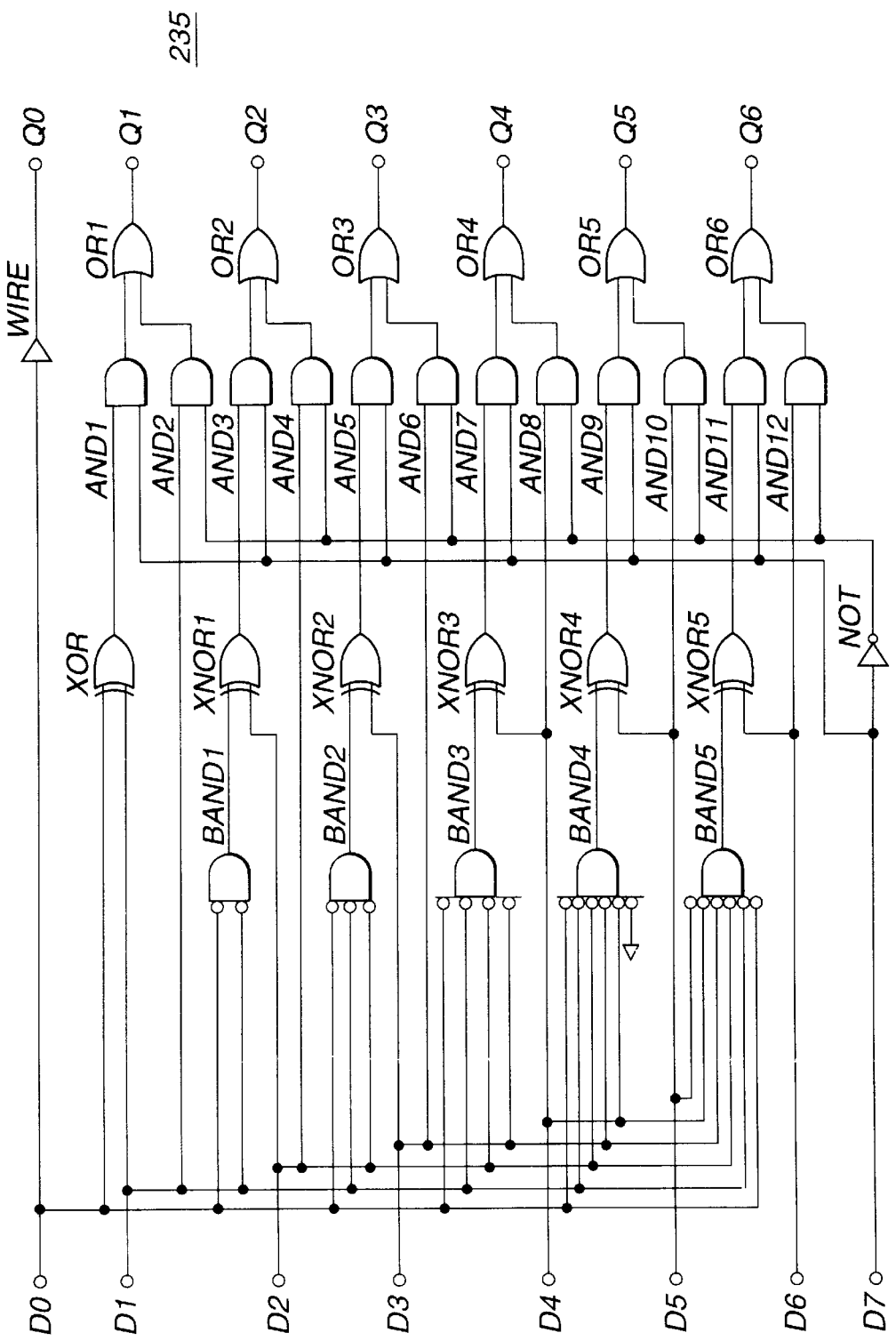
FIG. 16 is a circuit diagram showing the configuration of logic circuit used as absolute value circuit in the data decoding apparatus shown in FIG. 11.

As the absolute value circuit 235, there is used a logic circuit constituted by five negation (not) logical product circuits BAND1~BAND5, one Exclusive logical sum circuit XOR, five Exclusive negation (not) logical sum circuits XNOR1~XNOR5, one negative logic circuit NOT, twelve logical product circuits AND1~AND12, and six logical sum circuits OR1~OR6 as shown in FIG. 16, for example. In the case of this logic circuit, since output becomes equal to zero (0) when value of input becomes equal to −128, the range where computation is correctly carried out is −127 to 127. It is easy to carry out management so that the signal level falls within this range in this use purpose. This particularly does not constitute any problem. Output takes numeric value of 7 bits.

The absolute value comparison section 236 comprises D-type flip-flops 271, 272, 273, 274, 275 for delaying reproduction RF signal absolute value data 235a, and a comparator 276 for comparing magnitude (amplitude or level) between outputs 272a, 275a of the D-type flip-flop 272 and the D-type flip-flop 275, whereby when output 272a of the D-type flip-flop 272 is larger, it provides output of H level, while when otherwise, it provides output of L level.

Figure 17:
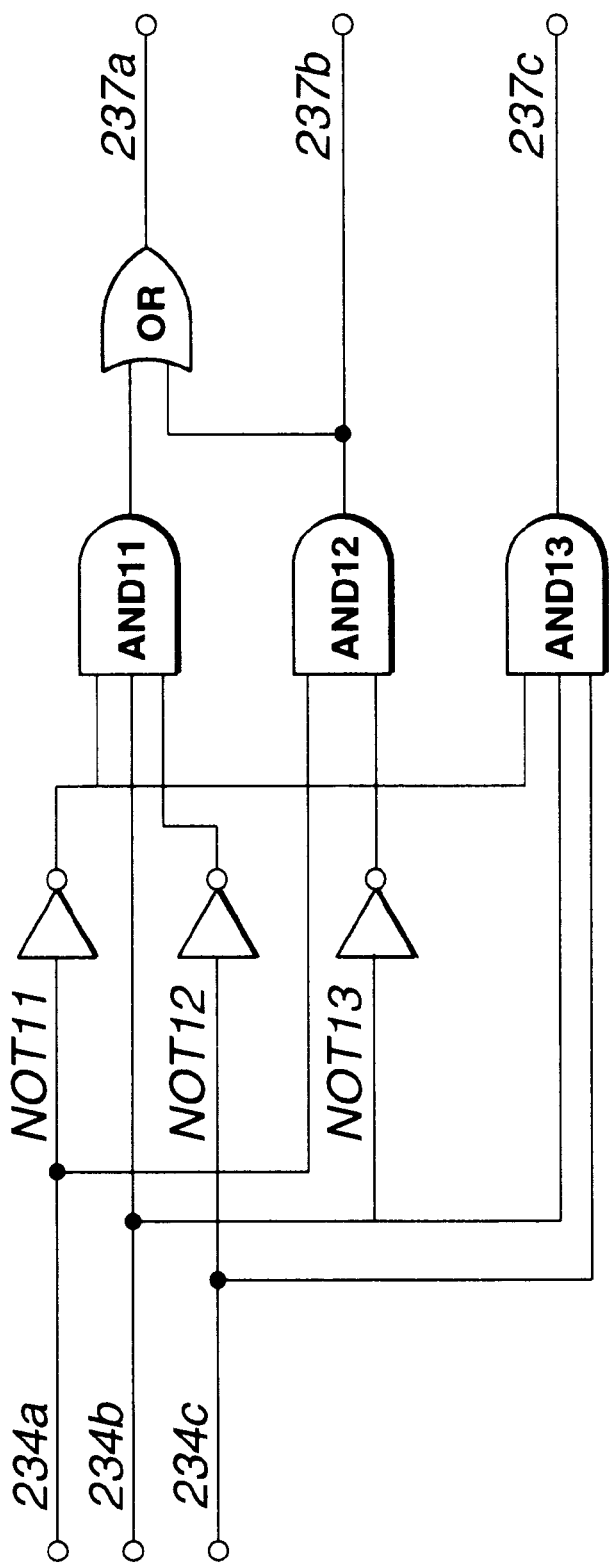
FIG. 17 is a circuit diagram showing the configuration of logic circuit used as minimum run length correction bit position detecting section in the data decoding apparatus shown in FIG. 11.

As the minimum run length correction bit position detecting section 237, there is used a logic circuit of a structure as shown in FIG. 17, for example. This logic circuit realizes logic of the Truth Table of the following Table 3 by negative logic circuits NOT 11, NOT 12, NOT 13, logical product circuits AND 11, AND 12, AND 13, and logical sum circuit OR.

TABLE 3

| DETECTION OUTPUT 234a | DETECTION OUTPUT 234b | COMPARISON RESULT 236a | CONTROL OUTPUT 237a | CONTROL OUTPUT 237b | CONTROL OUTPUT 237c |
|---|---|---|---|---|---|
| L | L | X | L | L | L |
| L | H | L | H | L | L |
| L | H | H | L | L | H |
| H | L | X | H | H | L |
| H | H | X | L | L | L |

In this case, correction bit position signals 237a, 237b, 237c are control signals for respectively inverting input of the bit data inversion correcting section 232, output of the D-type flip-flop 255 and output of the D-type flip-flop 256.

The operation of the data decode processing section 203 in the data decoding apparatus 200 will now be described.

When correction bit position signals 237a~237c outputted from the reproduction run length correction bit position detecting section 237 are caused to be all at L level, the code bit 210b is simply delayed by time corresponding to 6 bit clocks in total for a time period during which it is propagated through the edge detecting circuit 231 and the bit data inversion correcting section 232, and is outputted to the succeeding stage as reproduction RF binary signal.

The correction bit position signals 237a~237c are caused to be all at L level when the 1T detection signal 234a and the 2T detection signal 234b are caused to be both at L level as seen from the Truth Table of the Table 3. It is seen from the Truth Table of Table 2 that this corresponds to the state where corresponding correction is not caused to be ON, or the state where error to produce corresponding pattern does not take place.

Figure 18:
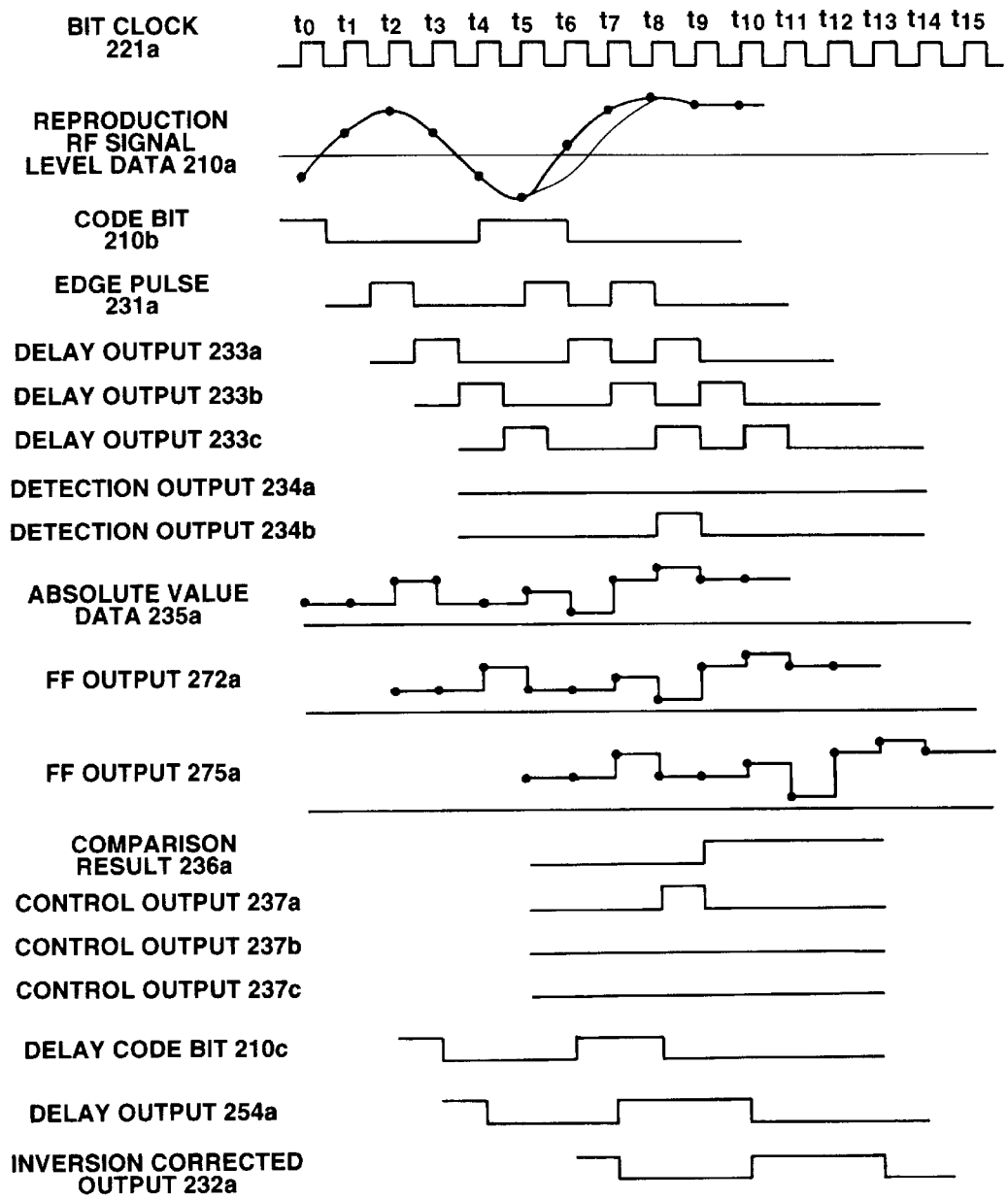
FIG. 18 is a timing chart showing the operation in the case where such a pattern to be discriminated as 2T is inputted with respect to reproduction RF signal correction level data in the data decoding apparatus shown in FIG. 11.

Let now consider the case where such a pattern to be discriminated as 2T is inputted with respect to the reproduction RF signal correction level data 210a. The timing chart of waveforms of respective portions in this case is shown in FIG. 18. The waveform of the reproduction RF signal correction level data 210a before sampling is indicated by the solid line, and sample values thereof are indicated by black circle. In this case, there is shown the case where reproduction waveform as indicated by thin line should be primarily obtained at times t4~t9, but reproduction waveform is distorted as indicated by the solid line by the influence such as tangential skew, etc. so that 2T pattern takes place, i.e., the case where the backward edge of the 3T pattern is missing so that 2T pattern results. In this case, when both portions adjoining the portion which looks like 2T pattern, i.e., signal amplitudes at the time t3 and the time t6 are compared with each other, the signal amplitude at the time t6 which is erroneous is smaller. Since there are many instances where error as shown takes place from a view point of probability, signal amplitudes of both adjoining portions of the 2T pattern are compared with each other to carry out, under the judgment where smaller signal amplitude is considered to be erroneous, inversion of polarity thereof, whereby the possibility that corresponding data can be decoded as correct data becomes high.

Delay outputs 233a~233c from the shift register 233, which are delay signals of the code bit 210b and the edge pulse 231a, are respectively as shown in FIG. 18. From these outputs, 2T detection pulse 234b is generated as shown in FIG. 18.

On the other hand, reproduction RF signal absolute value data 235a, outputs 272a, 275a of the D-type flip-flops 272, 275 which are delay signals thereof, and comparison result signal 236a therebetween are respectively as shown in FIG. 18. When delay of the circuit is taken into consideration, the time point when the comparison result signal 236a indicates the comparison result of the signal amplitude before and after 2T is the time point of the time t8. This coincides with the time when the 2T detection pulse is outputted.

From facts as described above, the minimum run length correction bit position detecting section 237 outputs only 237a (control output) as the correction position signal at time t8. This correction position signal 237a is delivered to the bit data inversion correcting section 232. Ultimately, inversion corrected output 232a is obtained. As is clear from FIG. 18, after undergone delay of 6 bit clock, 2T is precisely corrected so that 3T is provided. The corrected signal thus obtained is outputted.

Figure 19:
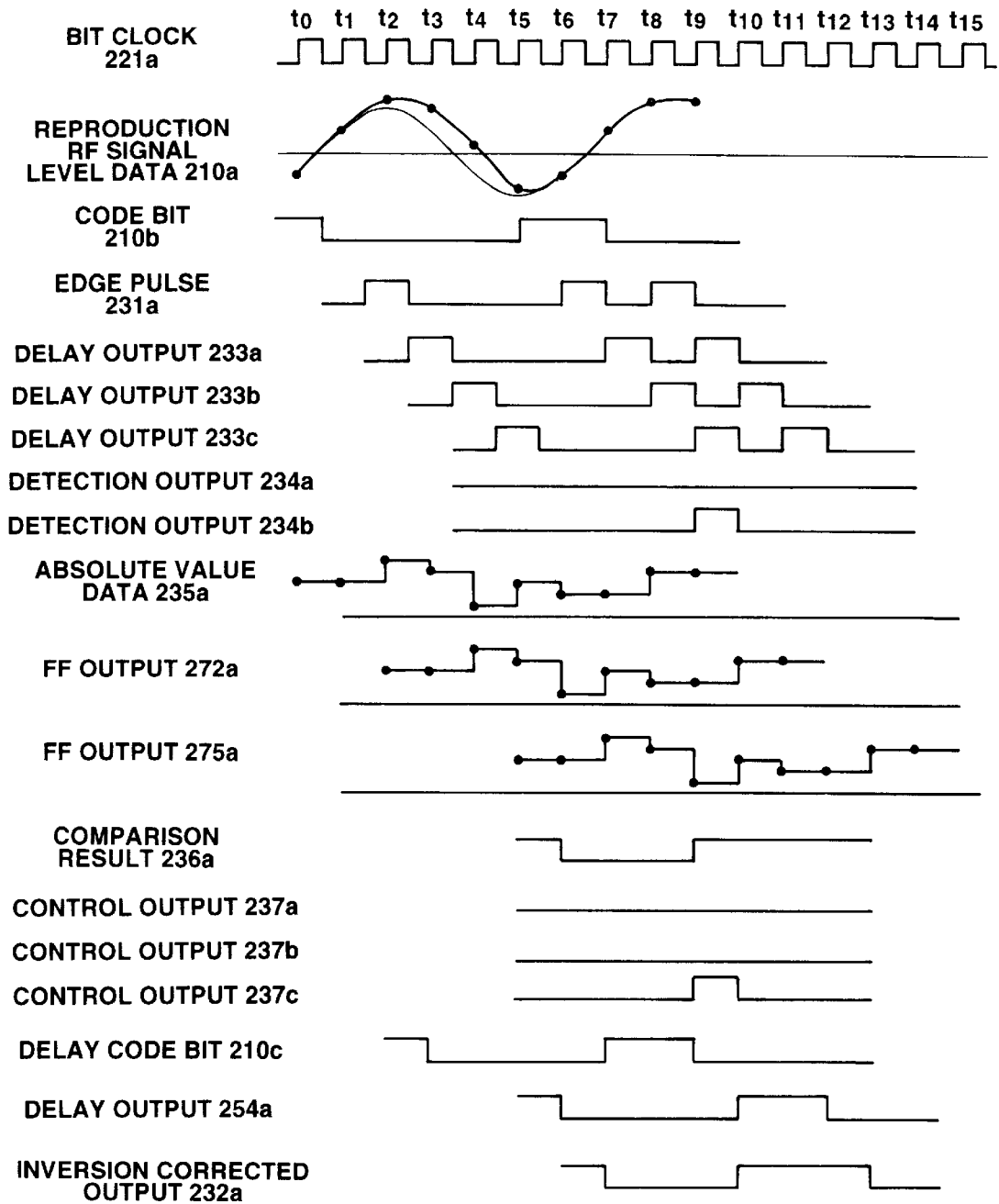
FIG. 19 is a timing chart showing the operation in the case where another pattern to be discriminated as 2T is inputted with respect to reproduction RF signal correction level data in the data decoding apparatus shown in FIG. 11.

Let consider another case where such a pattern to be discriminated as 2T is inputted with respect to the reproduction RF signal correction level data 210a. The timing chart of waveforms of respective portions in this case is shown in FIG. 19. In this example, there is shown the case where reproduction waveform as indicated by thin line should be primarily obtained at the times t1~t6, but reproduction waveform is distorted as indicated by solid line by the influence such as tangential skew, etc., so 2T pattern takes place, i.e., the case where the front edge of 3T pattern is missing so that there results 2T pattern.

Similarly to the case shown in FIG. 18, detection of 2T pattern and comparison of amplitude are carried out. Thus, correct waveform is outputted as inversion corrected output 232a.

Figure 20:
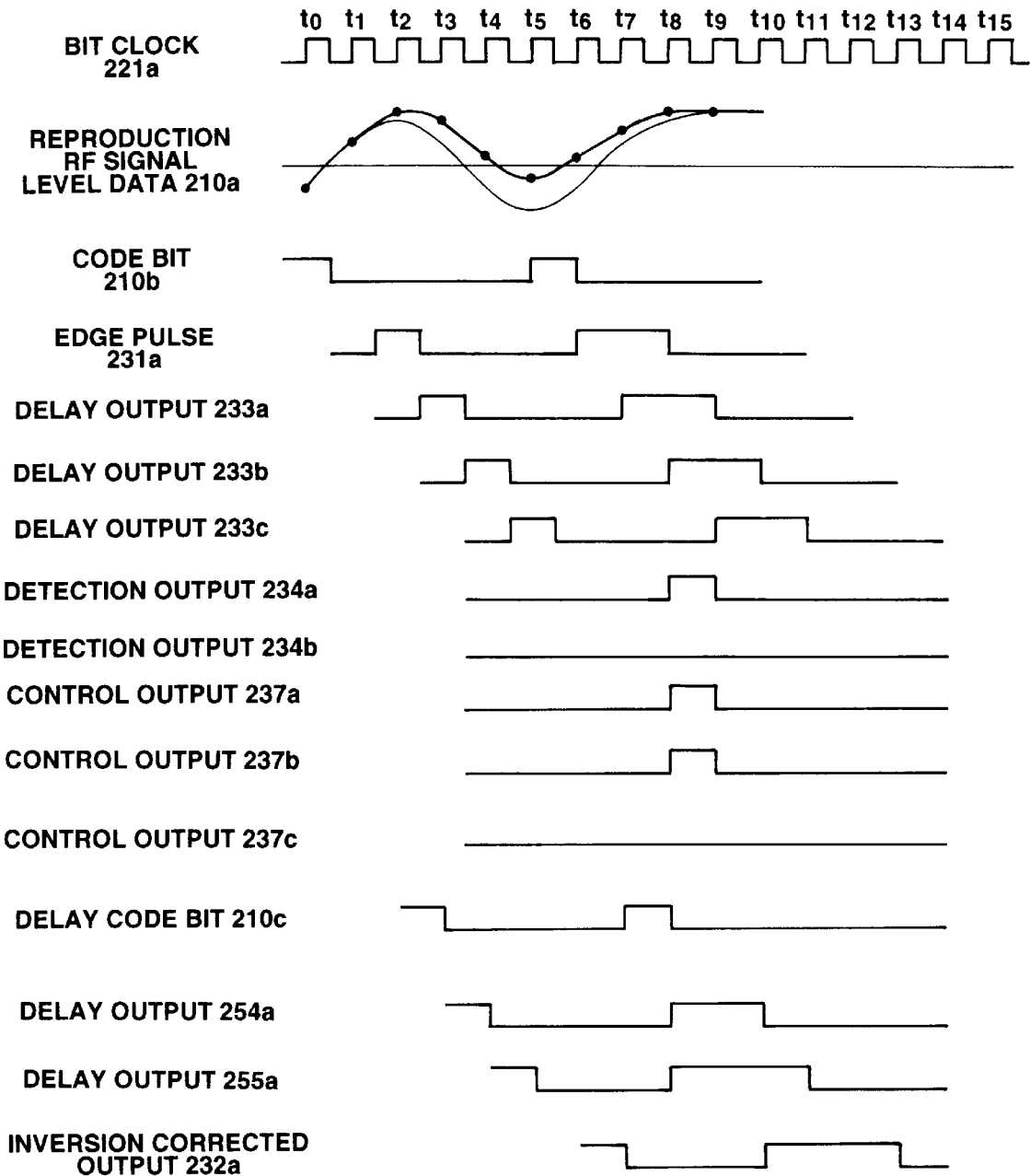
FIG. 20 is a timing chart showing the operation in the case where such a pattern to be discriminated as 1T is inputted with respect to reproduction RF signal correction level data in the data decoding apparatus shown in FIG. 11.

Let now consider a further case where such a pattern to be discriminated as 1T is inputted with respect to the reproduction RF signal correction level data 210a. The timing chart of waveforms of respective portions in this case is shown in FIG. 20. In this example, there is shown the case where reproduction waveform as indicated by thin line should be primarily obtained at the times t1~t8, but reproduction waveform is distorted as indicated by solid line so that 1T pattern takes place, i.e., the case where the front edge and the backward edge of the 3T pattern are missing so that 1T pattern results. Since an error as shown takes place to much degree from a viewpoint of probability, in the case where the 1T pattern is detected, both adjoining portions are considered to be erroneous to carry out polarity inversion. Thus, the probability that corresponding data can be decoded as correct data becomes high.

In accordance with delay outputs 233a~233c from the shift register 233, 1T detection pulse 234a is outputted.

Thus, the minimum run length correction bit position detecting section 237 outputs 237a, 237b (control output) as the correction position signal at the time t8. These correction position signals are delivered to the bit data inversion correcting section 232. Ultimately, inversion corrected output 232a is obtained. As is clear from FIG. 20, after undergone delay of 6 bit clock, 1T is precisely corrected so that 3T is provided. The corrected signal thus obtained is outputted.

Figure 21:
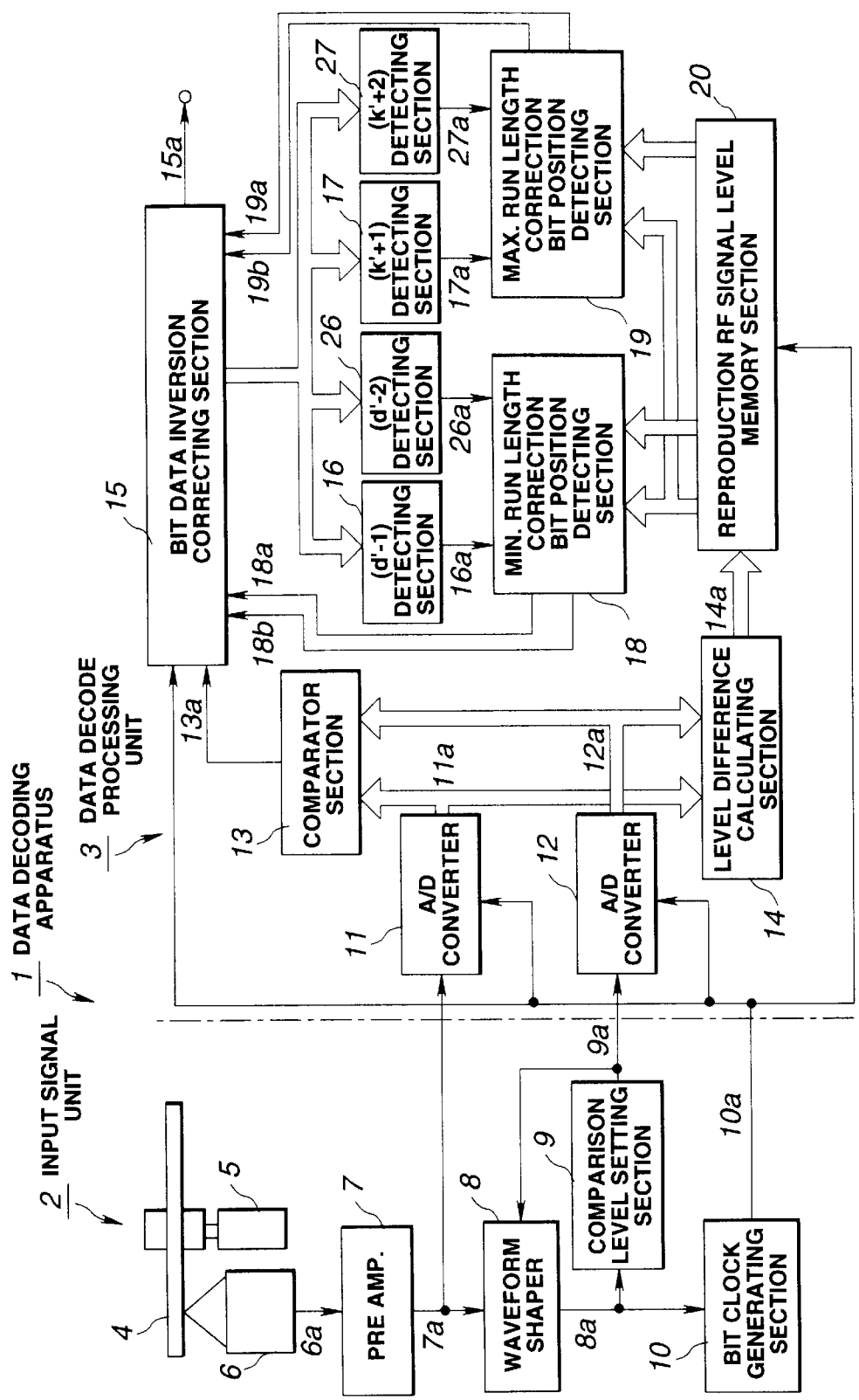
FIG. 21 is a block diagram showing a still further configuration of the data decoding apparatus to which this invention is applied.

Further, FIG. 21 is a block diagram showing the configuration of a further embodiment of the data decoding apparatus of this invention.

The data decoding apparatus shown in the FIG. 21 mentioned above is directed to the improvement in the above-described data decoding apparatus shown in FIG. 1, wherein a (d'−2) detecting section 26 is provided in association with the (d'−1) detecting section 16, and a (k'+2) detecting section 27 is provided in association with the (k'+1) detecting section 17. It is to be noted that the same reference numerals are respectively attached in the drawings with respect to other same components, and the detailed explanation thereof is omitted.

The (d'−2) detecting section 26 serves to detect the portion where the minimum inverting interval $T_{min}$ is erroneous with respect to binary signal (channel bit data) 13a generated by comparing reproduction RF signal level data 11a which has been undergone A/D conversion by the A/D converter 11 into binary level of 0 or 1 with the center level being as the boundary at the comparator section 13. For example, if (d, k) code is EFM code, when bit interval of the recording waveform train is assumed to be T, the portion in which 3T which is the minimum inverting interval $T_{min}$ is erroneously decoded into 1T is detected. Then, the bit data inversion correcting section 15 carries out correction of edge position in the channel bit data train.

Figure 22:
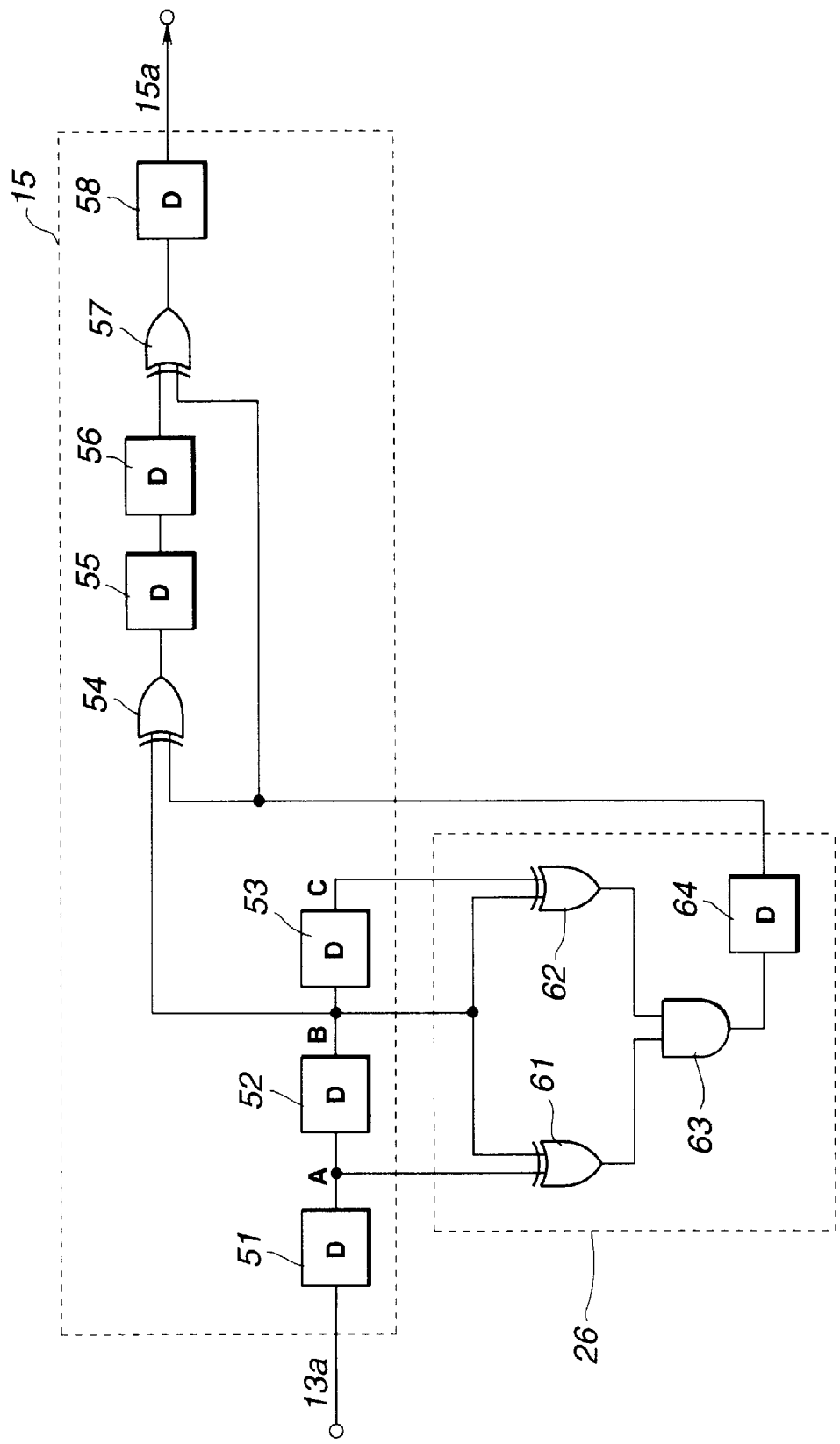
FIG. 22 is a circuit diagram showing the configuration of the essential part of (d'-2) detecting section and bit data inversion correcting section corresponding to the (d'-2) detecting section in the data decoding apparatus shown in FIG. 21.

A more practical example of the configuration of the essential part of the (d'−2) detecting section 26 and bit data inversion correcting section 15 corresponding to the (d'−2) detecting section 26 is shown in FIG. 22. In the more practical example of the configuration shown in the FIG. 22 mentioned above, EFM code (2, 10; 8, 17; 1) is used to correct decode data which has taken 1T when bit interval of the recording waveform train is assumed to be T so that 3(=2+1)T which is the minimum inverting interval $T_{min}$ is provided.

Namely, in the case of the EFM, three delay circuits 51, 52, 53 are used to carry out bit shift. Since data when data at output points A, B, C of the respective delay circuits 51, 52, 53 respectively take (1, 0, 1) or (0, 1, 0) correspond to decode data of 1T, e.g., (d'−2) detecting section 26 constituted by two Exclusive logical sum circuits 61, 62 and a logical product circuit 63 is used to detect the above-mentioned decode data.

Then, detection output by the (d'−2) detecting section 26 is delivered to the bit data inversion correcting section 15 through a latch circuit 64 for timing control.

The bit data inversion correcting section 15 comprises two Exclusive logical sum circuits 54, 57 supplied with detection output by the (d'−2) detecting section 26, wherein these Exclusive logical sum circuits 54, 57 are provided at input/output stages of two delay circuits 55, 56 supplied with decode data from the output point B of the delay circuit 52.

Figure 23:
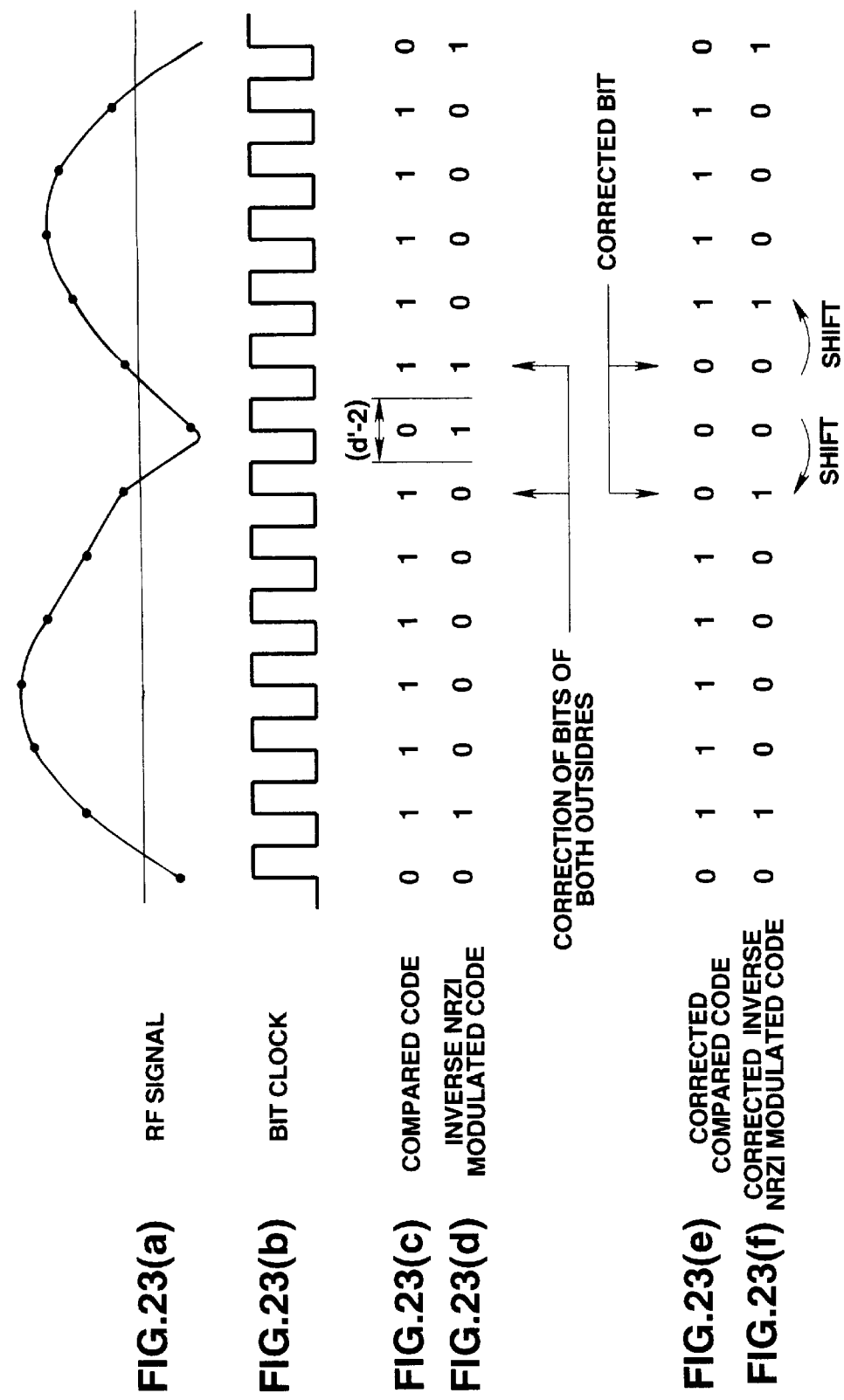
FIGS. 23a–23f are timing charts for explaining the operation of the bit data inversion correcting section in the data decoding apparatus shown in FIG. 21.

This bit data inversion correcting section 15 is operative as indicated by the timing chart of FIG. 23 so that when decode data of 1T is detected by the (d'−2) detecting section 26, it inverts edges of both sides with respect to the decode data of 1T by the Exclusive logical sum circuits 54, 57. Then, channel bit data train in which the 1T portion has been corrected so that 3T is provided in a manner as described above is outputted through a latch circuit 58 for timing control. It is to be noted that, in place of inverting edges of both sides with respect to the decode data of 1T, sample points may be shifted to the outside.

As described above, in the data decoding apparatus in the data reproducing equipment for the recording medium on which there are recorded recording codes in which the minimum run length of the same symbols after recording codes which satisfy d≧2 of recording codes in which the minimum run length of "0" falling (assigned) between successive "1" within the code series is d are subjected to NRZI modulation is expressed as d'=d+1, correction processing is carried out at the bit data inversion correcting section 15 with respect to cannel bit data in which the run length of the same symbols is (d'−2) detected by the (d'−2) detecting section 26 which detects channel bit data in which the run length of the same symbols is (d'−2) so that the run length of the same symbols becomes equal to d' to thereby reduce data decode (decoding) error in the vicinity of the minimum inverting interval $T_{min}$, thus making it possible to improve the bit error rate.

It is to be noted that in a data decoding apparatus in a data reproducing equipment for a recording medium on which there are recorded recording codes in which the minimum run length of the same symbols after recording codes which satisfy d≧2 of recording codes in which the minimum run length of "0" falling (assigned) between successive "1" within the code series is d are subjected to NRZI modulation is expressed as d'=d+1, correction processing may be also carried out at the bit data inversion correcting section 15 with respect to channel bit data in which the run length of "0" is (d−2) detected by the (d−2) detecting section which detects channel bit data in which the run length of "0" after undergone inverse NRZI modulation is (d−2) so that the run length of "0" becomes equal to d to thereby reduce data decode (decoding) error in the vicinity of the minimum inverting interval $T_{min}$, thus making it possible to improve the bit error rate.

Further, the (d'+2) detecting section 27 serves to detect the portion where the maximum inverting interval $T_{max}$ is erroneous with respect to binary signal (channel bit data) generated by comparing reproduction RF signal level data which has been caused to undergo A/D conversion by the A/D converter 11 into binary level of 1 or 0 with the center level being as the boundary at the comparator section 13, and if, e.g., (d, k) code is EFM code, it detects the portion in which 11T which is the maximum inverting interval $T_{max}$ when the bit interval of the recording waveform train is assumed to be T is erroneously decoded into 13T. Then, correction of the edge position in the channel bit data train is carried out at the bit data inversion correcting section 15.

Figure 24:
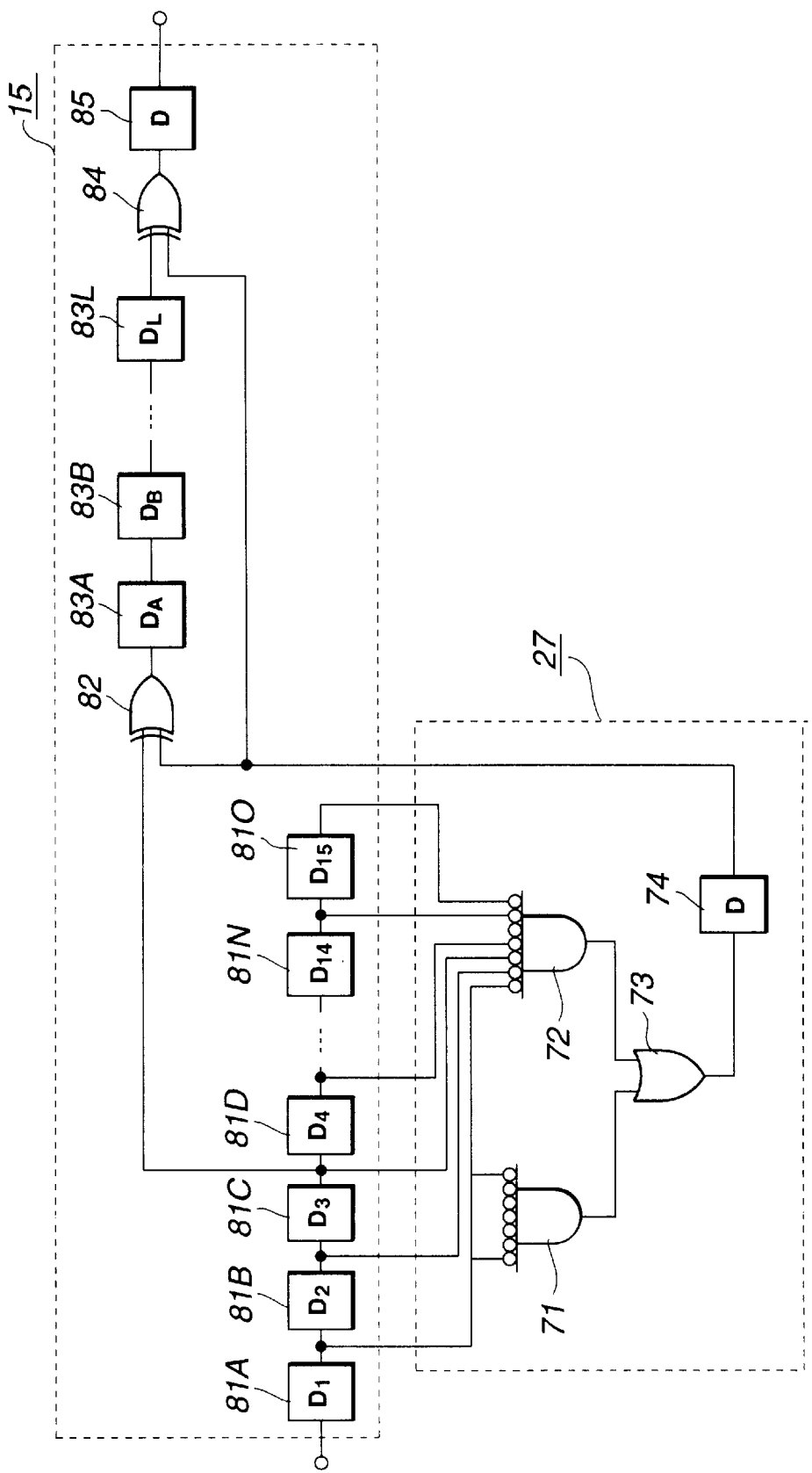
FIG. 24 is a circuit diagram showing the configuration of the essential part of (k'+2) detecting section and bit data inversion correcting section corresponding to the (k'+2) detecting section in the data decoding apparatus shown in FIG. 21.

A more practical example of the configuration of the essential part of the (k+2) detecting section 27 and bit data inversion correcting section 15 corresponding to the (k+2) detecting section 27 is shown in FIG. 24. In the more practical example of the configuration shown in the FIG. 24 mentioned above, EFM code (2, 10; 8, 17; 1) is used to correct decode data which has taken 13T when the bit interval of the recording waveform train is assumed to be T so that 11(=10+1)T which is the maximum inverting interval $T_{max}$ is provided.

Namely, in the case the EFM, fifteen delay circuits 81A~81O are used to carry out bit shift (data delay). Since data when data at output points of respective delay circuits 81A~81O respectively take (1, 0, 0 . . . 0, 1) or (0, 1, 1 . . . 1, 0) correspond to decode data of 13T, e.g., (k'+2) detecting section 27 constituted by two logical product circuits 71, 72, and a logical sum circuit 73 is used to detect such decode data.

Moreover, the bit data inversion correcting section 15 comprises two Exclusive logical sum circuits 82, 84 supplied with detection output by the (k'+2) detecting section 27, wherein the Exclusive logical sum circuits 82, 84 are provided at the input/output stages of twelve delay circuits 83A~83L supplied with decode data from the output point of the delay circuit 81C.

This bit data inversion correcting section 15 is operative as shown in the timing chart of FIG. 25 so that when decode data of 13T is detected by the (k'+2) detecting section 27, it inverts edges of both sides by the Exclusive logical sum circuits 82, 84 with respect to the decode data of 13T. Then, the channel bit data train in which the 13T portion is corrected so that 11T is provided as stated above is outputted through a latch circuit 85 for timing control. In place of inverting edges of both sides with respect to the decode data of 13T, sample points may be shifted to the inside.

As described above, in the data decoding apparatus in the data reproducing equipment for the recording medium on which there are recorded recording codes in which the maximum run length of the same symbols after recording codes in which the maximum run length of "0" falling (assigned) between successive "1" within the code series is k are subjected to NRZI modulation is expressed as k'=k+1, correction processing is carried out at the bit data inversion correcting section 15 with respect to channel bit data in which the run length of the same symbols is (k'+2) detected by the (k'+2) detecting section 27 which detects channel bit data in which the run length of the same symbols is (k'+2) so that the run length of the same symbols becomes equal to k' to thereby decrease data decode error in the vicinity of the maximum inverting interval $T_{max}$, thus making it possible to improve the bit error rate.

Further, in a data decoding apparatus in a data reproducing equipment for a recording medium on which there are recorded recording codes in which the maximum run length of the same symbols after recording codes in which the maximum run length of "0" falling (assigned) between successive "1" within the code series is k are subjected to NRZI modulation is expressed as k'=k+1, correction processing may be also carried out at the bit data inversion correcting section 15 with respect to channel bit data in which run length of "0" is (k+2) detected by the (k+2) detecting section which detects channel bit data in which the run length of "0" after undergone inverse NRZI modulation is (k+2) so that the run length of "0" becomes equal to k to thereby decrease data decode error in the vicinity of the maximum inverting interval $T_{max}$, thus making it possible to improve the bit error rate.

In this case, in the data decoding apparatus shown in FIG. 8 adapted for generating channel bit data from reproduction RF signal by the above-described comparator section 113 having comparison levels L1, L2, there may be employed a configuration in which (d−2) detecting section is provided in association with the (d−1) detecting section 116 to thereby further decrease data decode error in the vicinity of the minimum inverting interval $T_{min}$, and (k+2) detecting section is provided in association with the (k+1) detecting section 117 to thereby further decrease data decode error in the vicinity of the maximum inverting interval $T_{max}$, thus making it possible to improve the bit error rate.

It is to be noted that the data decoding apparatus according to this invention can be utilized not only for the reproducing equipment using optical disc as the recording medium, but also for the reproducing equipment for various discs such as magneto-optical disc, etc. on which data are recorded by using (d, k) codes. In addition, the data decoding apparatus according to this invention is effective not only for ensuring skew margin, but also for reduction of reading error of the minimum inverting interval $T_{min}$ followed by improvement in the linear recording density.

In this case, as the result of the fact that a reproducing equipment having the optical system of wavelength of 634 nm and NA 0.52 and using optical disc of which thickness is 1.2 mm as the recording medium is used to reproduce EFM codes to measure error rates at respective skew angles of 0°, ±0.66° in the tangential direction and ±0.76° in the radial direction, evaluation result as indicated by the following Table 4 was obtained.

TABLE 4

| SKEW ANGLE | ERROR RATE | CORRECTION CONTENT |
|---|---|---|
| 0° | LESS THAN $3.8 \times 10^{-6}$ | NO CORRECTION |
| TANGENTIAL DIRECTION +0.66° | $2.4 \times 10^{-3}$ $5.7 \times 10^{-4}$ | 2T, 12T CORRECTION 1T, 13T CORRECTION |
| TANGENTIAL DIRECTION −66° | $4.1 \times 10^{-3}$ $1.8 \times 10^{-3}$ | 2T, 12T CORRECTION 1T, 13T CORRECTION |
| RADIAL DIRECTION +0.76° | $2.2 \times 10^{-3}$ $1.6 \times 10^{-3}$ | 2T, 12T CORRECTION 1T, 13T CORRECTION |
| RADIAL DIRECTION +0.76° | $2.2 \times 10^{-3}$ $1.8 \times 10^{-3}$ | 2T, 12T CORRECTION 1T, 13T CORRECTION |

As is clear from this Table 4, the 1T, 13T corrections are effective for improving the error rate in the case where the skew angle is large in the tangential direction.

INDUSTRIAL APPLICABILITY

In this invention, in the data decoding apparatus in the data reproducing equipment for the recording medium on which there are recorded recording codes in which the minimum run length of the same symbols after recording codes in which the minimum run length of "0" falling (assigned) between successive "1" within the code series is d are subjected to NRZI modulation is expressed as d'=d+1, correction processing is carried out at the data correcting section on the basis of the correction bit position designation signal from the correction bit position detecting section with respect to channel bit data in which run length of the same symbols is (d'−1) detected by the (d'−1) detecting section which detects channel bit data in which the run length of the same symbols is (d'−1) so that the run length of the same symbols becomes equal to d' to thereby decrease data decode error in the vicinity of the minimum inverting interval $T_{min}$. Thus, the bit error rate can be improved.

In the data decoding apparatus according to this invention, the correction bit position detecting section outputs, e.g., a correction bit position designation signal to designate correction bit position selected on the basis of the magnitude relationship between channel bit data immediately before the (d'−1) period and channel bit data immediately after the (d'−1) period when (d'−1)≧1 to thereby carry out correction processing on the basis of the above-mentioned correction bit position designation signal at the data correcting section so that the run length of the same symbols becomes equal to d' to decrease data decode error in the vicinity of the minimum inverting interval $T_{min}$. Thus, the bit error rate can be improved.

Moreover, in the data decoding apparatus according to this invention, the correction bit position detecting section outputs, e.g., a correction bit position designation signal to designate, as correction bit position, smaller side of difference between reproduction RF signal level and comparison level at the time of level judgment of channel bit data immediately before the (d'−1) period and difference between reproduction RF signal level and the comparison level at the time of level judgment of channel bit data immediately after the (d'−1) period when (d'−1)≧1 to thereby carry out correction processing on the basis of the correction bit position designation signal at the data correcting section so that the run length of the same symbols becomes equal to d' to decrease data decode error in the vicinity of the minimum inverting interval $T_{min}$, thus making it possible to improve the bit error rate.

Further, in the data decoding apparatus according to this invention, the correction bit position detecting section outputs, e.g., a correction bit position designation signal to designate correction bit position selected on the basis of the magnitude relationship between reproduction RF signal level at the time of judgment of channel bit data immediately before the (d'−1) period and reproduction RF signal level at the time of level judgment of channel bit data immediately after the (d'−1) period when (d'−1)≧1 to thereby carry out correction processing on the basis of the correction bit position designation signal at the data correcting section so that the run length of the same symbols becomes equal to d' to decrease data decode error in the vicinity of the minimum inverting interval $T_{min}$, thus making it possible to improve the bit error rate.

Further, in the data decoding apparatus according to this invention, the correction bit position detecting section outputs, e.g., a correction bit position designation signal to designate correction bit position selected on the basis of the magnitude relationship between the leading channel bit data within the (d'−1) period and the last channel bit data within the (d'−1) period when (d'−1)≧2 to thereby carry out correction processing on the basis of the correction bit position designation signal at the data correcting section so that the run length of the same symbols becomes equal to d' to decrease data decode error in the vicinity of the minimum inverting interval $T_{min}$, thus making it possible to improve the bit error rate.

Further, in the data decoding apparatus according to this invention, the correction bit position detecting section outputs, e.g., a correction bit position designation signal to designate, as the correction bit position, larger side of difference between reproduction RF signal level and comparison level at the time of level judgment of the leading channel bit data within the (d'−1) period and difference between reproduction RF signal level and the comparison level at the time of level judgment of the last channel bit data within the (d'−1) period when (d'−1)≧2 to thereby carry out correction processing on the basis of the correction bit position designation signal at the data correcting section so that the run length of the same symbols becomes equal to d' to decrease data decode error in the vicinity of the minimum inverting interval $T_{min}$, thus making it possible to improve the bit error rate.

Further, in the data decoding apparatus according to this invention, the correction bit position detecting section outputs, e.g., a correction bit position designation signal to designate correction bit position selected on the basis of the magnitude relationship between reproduction RF signal level at the time of level judgment of the leading channel bit data within the (d'−1) period and reproduction RF signal level at the time of level judgment of the last channel bit data within the (d'−1) period when (d'−1)≧2 to thereby carry out correction processing on the basis of the correction bit position designation signal at the data correcting section so that the run length of the same symbols becomes equal to d' to decrease data decode error in the vicinity of the minimum inverting interval $T_{min}$, thus making it possible to improve the bit error rate.

Further, in the data decoding apparatus according to this invention, at the data correcting section, e.g., logic level of data at bit position designated by the correction bit position designation signal from the correction bit position detecting section to thereby carry out correction processing to decrease data decode error in the vicinity of the minimum inverting interval $T_{min}$, thus making it possible to improve the bit error rate.

Further, in this invention, in the data decoding apparatus in the data reproducing equipment for the recording medium on which there are recorded recording codes in which the minimum run length of the same symbols after recording codes in which the minimum run length of "0" falling (assigned) between successive "1" within the code series is d are subjected to NRZI modulation is expressed as d'=d+1, correction processing is carried out on the basis of correction bit position designation signal from the correction bit position detecting section with respect to channel bit data in which run length of "0" is (d−1) detected by the (d−1) detecting section which detects channel bit data in which the run length of "0" after undergone inverse NRZI modulation is (d−1) so that the run length of "0" becomes equal to d to thereby decrease data decode error in the vicinity of the minimum inverting interval $T_{min}$, thus making it possible to improve the bit error rate.

In the data decoding apparatus according to this invention, the correction bit position detecting section outputs, e.g., a correction bit position designation signal to designate correction bit position selected on the basis of the magnitude relationship between channel bit data immediately before the (d−1) period and channel bit data immediately after the (d−1) period when (d−1)≧0 to thereby carry out correction processing on the basis of the correction bit position designation signal at the data correcting section so that the run length of "0" becomes equal to d to decrease data decode error in the vicinity of the minimum inverting interval $T_{min}$, thus making it possible to improve the bit error rate.

Further, in the data decoding apparatus according to this invention, the correction bit position detecting section outputs, e.g., a correction bit position designation signal to designate, as correction bit position, smaller side of difference between reproduction RF signal level and comparison level at the time of level judgment of channel bit data immediately before the (d−1) period and difference between reproduction RF signal level and the comparison level at the time of level judgment of channel bit data immediately after the (d−1) period when (d−1)≧0 to thereby carry out correction processing on the basis of the correction bit position designation signal at the data correcting section so that the run length of "0" becomes equal to d to decrease data decode error in the vicinity of the minimum inverting interval $T_{min}$, thus making it possible to improve the bit error rate.

Further, in the data decoding apparatus according to this invention, the correction bit position detecting section outputs, e.g., a correction bit position designation signal to designate correction bit position selected on the basis of the magnitude relationship between reproduction RF signal level at the time of level judgment of channel bit data immediately before the (d−1) period and reproduction RF signal level at the time of level judgment of channel bit data immediately after the (d−1) period when (d−1)≧0 to thereby carry out correction processing on the basis of the correction bit position designation signal at the data correcting section so that the run length of "0" becomes equal to d to decrease data decode error in the vicinity of the minimum inverting interval $T_{min}$, thus making it possible to improve the bit error rate.

Further, in the data decoding apparatus according to this invention, the correction bit position detecting section outputs, e.g., a correction bit position designation signal to designate correction bit position selected on the basis of the magnitude relationship between the leading channel bit data within the (d−1) period and the last channel bit data within the (d−1) period when (d−1)≧2 to thereby carry out correction processing on the basis of the correction bit position designation signal at the data correcting section so that the run length of "0" becomes equal to d to decrease data decode error in the vicinity of the minimum inverting interval $T_{min}$, thus making it possible to improve the bit error rate.

Further, in the data decoding apparatus according to this invention, the correction bit position detecting section outputs, e.g., a correction bit position designation signal to designate, as correction bit position, larger side of difference between reproduction RF signal level and comparison level at the time of level judgment of the leading channel bit data within the (d−1) period and difference between reproduction RF signal level and the comparison level at the time of level judgment of the last channel bit data within the (d−1) period when (d−1)≧2 to thereby carry out correction processing on the basis of the correction bit position designation signal at the data correcting section so that the run length of "0" becomes equal to d to decrease data decode error in the vicinity of the minimum inverting interval $T_{min}$, thus making it possible to improve the bit error rate.

Further, in the data decoding apparatus according to this invention, the correction bit position detecting section outputs, e.g., a correction bit position designation signal to designate correction bit position selected on the basis of the magnitude relationship between reproduction RF signal level at the time of level judgment of the leading channel bit data within the (d−1) period and reproduction RF signal level at the time of level judgment of the last channel bit data within the (d−1) period when (d−1)≧2 to thereby carry out correction processing on the basis of the correction bit position designation signal at the data correcting section so that the run length of "0" becomes equal to d to decrease data decode error in the vicinity of the minimum inverting interval $T_{min}$, thus making it possible to improve the bit error rate.

Further, in the data decoding apparatus according to this invention, at the data correcting section, e.g., logic level of data at bit position designated on the basis of the correction bit position designation signal. from the correction bit position detecting section to further invert logic level of data at bit position at the outside of the (d−1) period at the designated bit position to thereby carry out correction processing to decrease data decode error in the vicinity of the minimum inverting interval $T_{min}$, thus making it possible to improve the bit error rate.

Further, in the data decoding apparatus according to this invention, at the data correcting section, e.g., data of "1" at bit position designated on the basis of the correction bit position designation signal from the correction bit position detecting section is shifted to data at the outside of the (d−1) period to thereby carry out correction processing to decrease data decode error in the vicinity of the minimum inverting interval $T_{min}$, thus making it possible to improve the bit error rate.

Further, in this invention, in the data decoding apparatus in the data reproducing equipment for the recording medium on which there are recorded recording codes in which the maximum run length of the same symbols after recording codes in which the maximum run length of "0" falling (assigned) between successive "1" within the code series is k are subjected to NRZI modulation is expressed as k'=k+1, correction processing is carried out, at the data correcting section, on the basis of the correction bit position designation signal from the correction bit position detecting section with respect to channel bit data in which run length of the same symbols is (k'+1) detected by the (k'+1) detecting section which detects channel bit data in which the run length of the same symbols is (k'+1) so that the run length of the same symbols becomes equal to k' to thereby decrease data decode error in the vicinity of the maximum inverting interval $T_{max}$, thus making it possible to improve the bit error rate.

In the data decoding apparatus according to this invention, the correction bit position detecting section outputs, e.g., a correction bit position designation signal to designate correction bit position selected on the basis of the magnitude relationship between channel bit data immediately before the (k'+1) period and channel bit data immediately after the (k'+1) period to thereby carry out correction processing on the basis of the correction bit position designation signal at the data correcting section so that the run length of the same symbols becomes equal to k' to decrease data decode error in the vicinity of the maximum inverting interval $T_{max}$, thus making it possible to improve the bit error rate.

Further, in the data decoding apparatus according to this invention, the correction bit position detecting section outputs, e.g., a correction bit position designation signal to designate, as correction bit position, larger side of difference between reproduction RF signal level and comparison level at the time of level judgment of channel bit data immediately before the (k'+1) period and difference between reproduction RF signal level and the comparison level at the time of level judgment of channel bit data immediately after the (k'+1) period to thereby carry out correction processing on the basis of the correction bit position designation signal at the data correcting section so that the run length of the same symbols becomes equal to k' to decrease data decode error in the vicinity of the maximum inverting interval $T_{max}$, thus making it possible to improve the bit error rate.

Further, in the data decoding apparatus according to this invention, the correction bit position detecting section outputs, e.g., a correction bit position designation signal to designate correction bit position selected on the basis of the magnitude relationship between reproduction RF signal level at the time of level judgment of channel bit data immediately before the (k'+1) period and reproduction RF signal level at the time of level judgment of channel bit data immediately after the (k'+1) period to thereby carry out correction processing on the basis of the correction bit position designation signal at the data correcting section so that the run length of the same symbols becomes equal to k' to decrease data decode error in the vicinity of the maximum inverting interval $T_{max}$, thus making it possible to improve the bit error rate.

Further, in the data decoding apparatus according to this invention, the correction bit position detecting section outputs, e.g., a correction bit position designation signal to designate correction bit position selected on the basis of the magnitude relationship between the leading channel bit data within the (k'+1) period and the last channel bit data within the (k'+1) period to thereby carry out correction processing on the basis of the correction bit position designation signal at the data correcting section so that the run length of the same symbols becomes equal to k' to decrease data decode error in the vicinity of the maximum inverting interval $T_{max}$, thus making it possible to improve the bit error rate.

Further, in the data decoding apparatus according to this invention, the correction bit position detecting section outputs, e.g., a correction bit position designation signal to designate, as correction bit position, smaller side of difference between reproduction RF signal level and comparison level at the time of level judgment of the leading channel bit data within the (k'+1) period and difference between reproduction RF signal level and the comparison level at the time of level judgment of the last channel bit data within the (k'+1) period to thereby carry out correction processing on the basis of the correction bit position designation signal at the data correcting section so that the run length of the same symbols becomes equal to k' to decrease data decode error in the vicinity of the maximum inverting interval $T_{max}$, thus making it possible to improve the bit error rate.

Further, in the data decoding apparatus according to this invention, the correction bit position detecting section outputs, e.g., a correction bit position designation signal to designate correction bit position selected on the basis of the magnitude relationship between reproduction RF signal level at the time of level judgment of the leading channel bit data within the (k'+1) period and reproduction RF signal level at the time of level judgment of the last channel bit data within the (k'+1) period to thereby carry out correction processing on the basis of the correction bit position designation signal at the data correcting section so that the run length of the same symbols becomes equal to k' to decrease data decode error in the vicinity of the maximum inverting interval $T_{max}$, thus making it possible to improve the bit error rate.

Further, in the data decoding apparatus according to this invention, at the data correcting section, logic level of data at bit position designated on the basis of the correction bit position designation signal from the correction bit position detecting section is inverted to thereby carry out correction processing to decrease data decode error in the vicinity of the maximum inverting interval $T_{max}$, thus making it possible to improve the bit error rate.

Further, in this invention, in the data decoding apparatus in the data reproducing equipment for the recording medium on which there are recorded recording codes in which the maximum run length of the same symbols after recording codes in which the maximum run length of "0" falling (assigned) between successive "1" within the code series is k are subjected to NRZI modulation is expressed as k'=k+1, correction processing is carried out, at the data correcting section, on the basis of correction bit position designation signal from the correction bit position detecting section with respect to channel bit data in which run length of "0" is (k+1) detected by the (k+1) detecting section which detects channel bit data in which the run length of "0" after undergone inverse NRZI modulation is (k+1) so that the run length of "0" becomes equal to k to thereby decrease data decode error in the vicinity of the maximum inverting interval $T_{max}$, thus making it possible to improve the bit error rate.

In the data decoding apparatus according to this invention, the correction bit position detecting section outputs, e.g., a correction bit position designation signal to designate correction bit position selected on the basis of the magnitude relationship between channel bit data immediately before the (k+1) period and channel bit data immediately after the (k+1) period to thereby carry out correction processing on the basis of the correction bit position designation signal at the data correcting section so that the run length of "0" becomes equal to k to decrease data decode error in the vicinity of the maximum inverting interval $T_{max}$, thus making it possible to improve the bit error rate.

Further, in the data decoding apparatus according to this invention, the correction bit position detecting section outputs, e.g., a correction bit position designation signal to designate, as correction bit position, larger side of difference between reproduction RF signal level and comparison level at the time of level judgment of channel bit data immediately before the (k+1) period and difference between reproduction RF signal level and the comparison level at the time of level judgment of channel bit data immediately after the (k+1) period to thereby carry out correction processing on the basis of the correction bit position designation signal at the data correcting section so that the run length of "0" becomes equal to k to decrease data decode error in the vicinity of the maximum inverting interval $T_{max}$, thus making it possible to improve the bit error rate.

Further, in the data decoding apparatus according to this invention, the correction bit position detecting section outputs, e.g., a correction bit position designation signal to designate correction bit position selected on the basis of the magnitude relationship between reproduction RF signal level at the time of level judgment of channel bit data immediately before the (k+1) period and reproduction RF signal level at the time of level judgment of channel bit data immediately after the (k+1) period to thereby carry out correction processing on the basis of the correction bit position designation signal at the data correcting section so that the run length of "0" becomes equal to k to decrease data decode error in the vicinity of the maximum inverting interval $T_{max}$, thus making it possible to improve the bit error rate.

Further, in the data decoding apparatus according to this invention, the correction bit position detecting section outputs, e.g., a correction bit position designation signal to designate correction bit position selected on the basis of the magnitude relationship between the leading channel bit data within the (k+1) period and the last channel bit data within the (k+1) period when (k+1)≧2 to thereby carry out correction processing on the basis of the correction bit position designation signal at the data correcting section so that the run length of "0" becomes equal to k to decrease data decode error in the vicinity of the maximum inverting interval $T_{max}$, thus making it possible to improve the bit error rate.

Further, in the data decoding apparatus according to this invention, the correction bit position detecting section outputs, e.g., a correction bit position designation signal to designate, as correction bit position, smaller side of difference between reproduction RF signal level and comparison level at the time of level judgment of the leading channel bit data within the (k+1) period and difference between reproduction RF signal level and the comparison level at the time of level judgment of the last channel bit data within the (k+1) period when (k+1)≧2 to thereby carry out correction processing on the basis of the correction bit position designation signal at the data correcting section so that the run length of "0" becomes equal to k to decrease data decode error in the vicinity of the maximum inverting interval $T_{max}$, thus making it possible to improve the bit error rate.

Further, in the data decoding apparatus according to this invention, the correction bit position detecting section outputs, e.g., a correction bit position designation signal to designate correction bit position selected on the basis of the magnitude relationship between reproduction RF signal level at the time of level judgment of the leading channel bit data within the (k+1) period and reproduction RF signal level at the time of level judgment of the last channel bit data within the (k+1) period when (k+1)≧2 to thereby carry out correction processing on the basis of the correction bit position designation signal at the data correcting section so that the run length of "0" becomes equal to k to decrease data decode error in the vicinity of the maximum inverting interval $T_{max}$, thus making it possible to improve the bit error rate.

Further, in the data decoding apparatus according to this invention, at the data correcting section, e.g., logic level of data at bit position designated on the basis of correction bit position designation signal from the correction bit position detecting section is inverted to further invert logic level of data at bit position at the outside of the (k+1) period at the designated bit position to thereby carry out correction processing to decrease data decode error in the vicinity of the maximum inverting interval $T_{max}$, thus making it possible to improve the bit error rate.

Further, in the data decoding apparatus according to this invention, at the data correcting section, e.g., data of "1" at bit position designated on the basis of the correction bit position designation signal from the correction bit position detecting section is shifted to data at the outside of the (k+1) period to thereby carry out correction processing to decrease data decode error in the vicinity of the maximum inverting interval $T_{max}$, thus making it possible to improve the bit error rate.

Further, in this invention, in the data decoding apparatus in the data reproducing equipment for the recording medium on which there are recorded recording codes in which the minimum run length of the same symbols after recording codes which satisfy d≧2 of recording codes in which the minimum run length of "0" falling (assigned) between successive "1" within the code series is d are subjected to NRZI modulation is expressed as d'=d+1, correction processing is carried out, at the data correcting section, on the basis of the correction bit position designation signal from the correction bit position detecting section with respect to channel bit data in which run length of the same symbols is (d'−2) detected by the (d'−2) detecting section which detects channel bit data in which the run length of the same symbols is (d'−2) so that the run length of the same symbols becomes equal to d' to thereby decrease data decode error in the vicinity of the minimum inverting interval $T_{min}$, thus making it possible to improve the bit error rate.

Further, in the data decoding apparatus according to this invention, the correction bit position detecting section outputs, e.g., a correction bit position designation signal to designate, as correction bit position, bit immediately before the (d'−2) period and bit immediately after the (d'−2) period to thereby carry out correction processing on the basis of the correction bit position designation signal at the data correcting section so that run length of the same symbols becomes equal to d' to decrease data decode error in the vicinity of the minimum inverting interval $T_{min}$, thus making it possible to output the bit error rate.

Further, in the data decoding apparatus according to this invention, at the data correcting section, e.g., logic level of bit is inverted to thereby carry out correction processing to decrease data decode error in the vicinity of the minimum inverting interval $T_{min}$, thus making it possible to improve the bit error rate.

Further, in this invention, in the data decoding apparatus in the data reproducing equipment for the recording medium on which there are recorded recording codes in which the minimum run length of the same symbols after recording codes which satisfy d≧2 of recording codes in which the minimum run length of "0" falling (assigned) between successive "1" within the code series is d are subjected to NRZI modulation is expressed as d'=d+1, correction processing is carried out, at the data correcting section, on the basis of the correction bit position designation signal from the correction bit position detecting section with respect to channel bit data in which run length of "0" is (d−2) detected by the (d−2) detecting section which detects channel bit data in which the run length of "0" after undergone inverse NRZI modulation is (d−2) so that the run length of "0" becomes equal to d to thereby decrease data decode error in the vicinity of the minimum inverting interval $T_{min}$, thus making it possible to improve the bit error rate.

Further, in the data decoding apparatus according to this invention, the correction bit position detecting section outputs, e.g., a correction bit position designation signal to designate, as correction bit position, bits immediately before and immediately after the (d−2) period to thereby carry out correction processing on the basis of the correction bit position designation signal at the data correcting section so that run length of the same symbols becomes equal to d' to decrease data decode error in the vicinity of the minimum inverting interval $T_{min}$, thus making it possible to improve the bit error rate.

Further, in the data decoding apparatus according to this invention, at the data correcting section, e.g., logic level of bit that the correction bit position detecting section designates is inverted to further invert logic level of bits at both sides adjacent thereto to thereby carry out correction processing to decrease data decode error in the vicinity of the minimum inverting interval $T_{min}$, thus making it possible to improve the bit error rate.

Further, in this invention, in the data decoding apparatus in the data reproducing equipment for the recording medium on which there are recorded recording codes in which the maximum run length of the same symbols after recording codes in which the maximum run length of "0" falling (assigned) between successive "1" within the code series is k are subjected to NRZI modulation is expressed as k'=k+1, correcting processing is carried out on the basis of the correction bit position designation signal from the correction bit position detecting section with respect to channel bit data in which run length of the same symbols is (k'+2) detected by the (k'+2) detecting section which detects channel bit data in which the run length of the same symbols is (k'+2) so that the run length of the same symbols becomes equal to k' to thereby decrease data decode error in the vicinity of the maximum inverting interval $T_{max}$, thus making it possible to improve the bit error rate.

Further, in the data decoding apparatus according to this invention, the correction bit position detecting section outputs, e.g., a correction bit position designation signal to designate, as correction bit position, the leading bit and the last bit of the (k'+2) period to thereby carry out correction processing on the basis of the correction bit position designation signal at the data correcting section so that the run length of the same symbols becomes equal to k' to decrease data decode error in the vicinity of the maximum inverting interval $T_{max}$, thus making it possible to improve the bit error rate.

Further, in the data decoding apparatus according to this invention, the data correcting section inverts logic level of bit that the correction bit position detecting section designates to thereby carry out correction processing to decrease data decode error in the vicinity of the maximum inverting interval $T_{max}$, thus making it possible to improve the bit error rate.

Further, in this invention, in the data decoding apparatus in the data reproducing equipment for the recording medium on which there are recorded recording codes in which the maximum run length of the same symbols after recording codes in which the maximum run length of "0" falling (assigned) between successive "1" within the code series is k are subjected to NRZI modulation is expressed as k'=k+1, correction processing is carried out on the basis of the correction bit position designation signal from the correction bit position detecting section with respect to channel bit data in which run length of "0" is (k+2) detected by the (k+2) detecting section which detects channel bit data in which the run length of "0" after undergone inverse NRZI modulation is (k+2) so that the run length of "0" becomes equal to k to thereby decrease data decode error in the vicinity of the maximum inverting interval $T_{max}$, thus making it possible it improve the bit error rate.

Further, in the data decoding apparatus according to this invention, the correction bit position detecting section outputs, e.g., a correction bit position designation signal to designate, as correction bit position, the leading bit and the last bit of the (k+2) period to thereby carry out correction processing on the basis of the correction bit position designation signal at the data correcting section so that the run length of the same symbols becomes equal to k' to decrease data decode error in the vicinity of the maximum inverting interval $T_{max}$, thus making it possible to improve the bit error rate.

Further, in the data decoding apparatus according to this invention, the data correcting section inverts, e.g., logic level of bit that the correction bit position detecting section designates to further invert logic levels of bits at the both sides thereof to thereby carry out correction processing to decrease data decode error in the vicinity of the maximum inverting interval $T_{max}$, thus making it possible to improve the bit error rate.

By using the data decoding apparatus according to this invention, margin with respect to skew and margin with respect to defocus can be increased. In addition, the data decoding apparatus according to this invention is effective also for reduction of reading error of the minimum inverting interval $T_{min}$ and the maximum inverting interval $T_{max}$ followed by improvement in the linear recording density.

We claim:

1. A data decoding apparatus in a data reproducing equipment for a recording medium on which recording codes in which the minimum run length of the same symbols after recording codes in which the minimum run length of "0" falling (assigned) between successive "1" within the code series is d are subjected to NRZI modulation is expressed as d'=d+1,
the apparatus comprising:
a (d'-1) detecting section for detecting channel bit data in which run length of the same symbols is (d'-1);
a correction bit position detecting section for outputting a correction bit position designation signal to designate correction position of channel bit data in which the run length of the same symbols is (d'-1) detected by the (d'-1) detecting section; and
a data correcting section for carrying out, on the basis of the correction bit position designation signal from the correction bit position detecting section, correction processing of the channel bit data in which the run length of the same symbols is (d'-1) detected by the (d'-1) detecting section so that the run length of the same symbols becomes equal to d'.

2. A data decoding apparatus as set forth in claim 1, wherein a reproduction RF signal which has been read out from the recording medium is decoded by at least one comparison level to output channel bit data.

3. A data decoding apparatus as set forth in claim 2, wherein the correction bit position detecting section outputs a correction bit position designation signal to designate correction bit position selected on the basis of the magnitude relationship between channel bit data immediately before a (d'-1) period and channel bit data immediately after the a period of (d'-1) when (d'-1) $\geq 1$.

4. A data decoding apparatus as set forth in claim 3, wherein the correction bit position detecting section outputs a correction bit position designation signal to designate, as correction bit position, smaller side of difference between reproduction RF signal level and comparison level at the time of level judgment of channel bit data immediately before the (d'-1) period and difference between reproduction RF signal level and the comparison level at the time of level judgment of channel bit data immediately after the (d'-1) period.

5. A data decoding apparatus as set forth in claim 2, wherein the correction bit position detecting section outputs a correction bit position designation signal to designate correction bit position selected on the basis of the magnitude relationship between reproduction RF signal level at the time of level judgment of channel bit data immediately before a period of (d'-1) and reproduction RF signal level at the time of level judgment of channel bit data immediately after the (d'-1) period when (d'-1)$\geq 1$.

6. A data decoding apparatus as set forth in claim 2, wherein the correction bit position detecting section outputs a correction bit position designation signal to designate correction bit position selected on the basis of the magnitude relationship between the leading channel bit data within a period of (d'-1) and the last channel bit data within the (d'-1) period when (d'-1)$\geq 2$.

7. A data decoding apparatus as set forth in claim 6, wherein the correction bit position detecting section outputs a correction bit position designation signal to designate, as correction bit position, larger side of difference between reproduction RF signal level and comparison level at the time of level judgment of the leading channel bit data within the (d'-1) period and difference between reproduction RF signal level and the comparison level at the time of level judgment of the last channel bit data within the (d'-1) period.

8. A data decoding apparatus as set forth in claim 2, wherein the correction bit position detecting section outputs a correction bit position designation signal to designate correction bit position selected on the basis of the magnitude relationship between reproduction RF signal level at the time of level judgment of the leading channel bit data within a period of (d'-1) and reproduction RF signal level at the time of level judgment of the last channel bit data within the (d'-1) period when (d'-1)$\geq 2$.

9. A data decoding apparatus as set forth in claim 1, wherein the data correcting section inverts logic level of data at bit position designated by the correction bit position designation signal from the correction bit position detecting section to thereby carry out correction processing.

10. A data decoding apparatus in a data reproducing equipment for a recording medium on which there are recorded recording codes in which the minimum run length of the same symbols after recording codes in which the minimum run length of "0" falling (assigned) between successive "1" within code series is d are subjected to NRZI modulation is expressed as d'=d+1,
the apparatus comprising:
a (d-1) detecting section for detecting channel bit data in which run length of "0" after undergone inverse NRZI modulation is (d-1);

a correction bit position detecting section for outputting a correction bit position designation signal to designate correction position of channel bit data in which the run length of "0" is (d−1) detected by the (d−1) detecting section; and a data correcting section for carrying out, on the basis of the correction bit position designation signal from the correction bit position detecting section, correction processing of the channel bit data in which the run length of "0" is (d−1) detected by the (d−1) detecting section so that the run length of "0" becomes equal to d.

11. A data decoding apparatus as set forth in claim 10, wherein a reproduction RF signal which has been read out from the recording medium is decoded by at least one comparison level to output channel bit data in which the minimum run length of "0" falling (assigned) between successive "1" within the code series is d.

12. A data decoding apparatus as set forth in claim 11, wherein the correction bit position detecting section outputs a correction bit position designation signal to designate correction bit position selected on the basis of the magnitude relationship between channel bit data immediately before a period of (d−1) and channel bit data immediately after the (d−1) period when (d−1)≧0.

13. A data decoding apparatus as set forth in claim 12, wherein the correction bit position detecting section outputs a correction bit position designation signal to designate, as correction bit position, smaller side of difference between reproduction RF signal level and comparison level at the time of level judgment of channel bit data immediately before the (d−1) period and difference between reproduction RF signal level and the comparison level at the time of level judgment of channel bit data immediately after the (d−1) period.

14. A data decoding apparatus as set forth in claim 11, wherein the correction bit position detecting section outputs a correction bit position designation signal to designate correction bit position selected on the basis of the magnitude relationship between reproduction RF signal level at the time of level judgment of channel bit data immediately before a pair of (d−1) and reproduction RF signal level at the time of level judgment of channel bit data immediately after the (d−1) period when (d−1)≧2.

15. A data decoding apparatus as set forth in claim 11, wherein the correction bit position detecting section outputs a correction bit position designation signal to designate correction bit position selected on the basis of the magnitude relationship between the leading channel bit data within a pair of (d−1) and the last channel bit data within the (d−1) period when (d−1)≧2.

16. A data decoding apparatus as set forth in claim 15, wherein the correction bit position detecting section outputs a correction bit position designation signal to designate, as correction bit position, larger side of difference between reproduction RF signal level and comparison level at the time of level judgment of the leading channel bit data within the (d−1) period and difference between reproduction RF signal level and the comparison level at the time of level judgment of the last channel bit data within the (d−1) period.

17. A data decoding apparatus as set forth in claim 11, wherein the correction bit position detecting section outputs a correction bit position designation signal to designate correction bit position selected on the basis of the magnitude relationship between reproduction RF signal level at the time of level judgment of the leading channel bit data within a pair of (d−1) and reproduction RF signal level at the time of level judgment of the last channel bit data within the (d−1) period when (d−1)≧2.

18. A data decoding apparatus as set forth in claim 10, wherein the data correcting section inverts logic level of data at bit position designated on the basis of the correction bit position designation signal from the correction bit position detecting section to further invert logic level of data at bit position at the outside of a pair of period (d−1) at the designated bit position to thereby carry out correction processing.

19. A data decoding apparatus as set forth in claim 10, wherein the data correcting section shifts data of "1" at bit position designated on the basis of the correction bit position designation signal from the correction bit position detecting section to data at the outside of a pair of (d−1) to thereby carry out correction processing.

20. A data decoding apparatus in a data reproducing equipment for a recording medium on which there are recorded recording codes in which the maximum run length of the same symbols after recording codes in which the maximum run length of "0" falling (assigned) between successive "1" within code series is k are subjected to NRZI modulation is expressed as k'=k+1, the apparatus comprising:

a (k'+1) detecting section for detecting channel bit data in which run length of the same symbols is (k'+1);

a correction bit position detecting section for outputting a correction bit position designation signal to designate correction position of channel bit data in which the run length of the same symbols is (k'+1) detected by the (k'+1) detecting section; and a data correcting section for carrying out, on the basis of the correction bit position designation signal from the correction bit position detecting section, correction processing of the channel bit data in which the run length of the same symbols is (k'+1) detected by the (k'+1) detecting section so that the run length of the same symbols becomes equal to k'.

21. A data decoding apparatus as set forth in claim 20, wherein a reproduction RF signal which has been read out from the recording medium is decoded by at least one comparison level to output channel bit data.

22. A data decoding apparatus as set forth in claim 21, wherein the correction bit position detecting section outputs a correction bit position designation signal to designate correction bit position selected on the basis of the magnitude relationship between channel bit data immediately before a pair of (k'+1) and channel bit data immediately after the (k'+1) period.

23. A data decoding apparatus as set forth in claim 22, wherein the correction bit position detecting section outputs a correction bit position designation signal to designate, as correction bit position, larger side of difference between reproduction RF signal level and comparison level at the time of level judgment of channel bit data immediately before the (k'+1) period and difference between reproduction RF signal level and the comparison level at the time of level judgment of channel bit data immediately after the (k'+1) period.

24. A data decoding apparatus as set forth in claim 21, wherein the correction bit position detecting section outputs a correction bit position designation signal to designate correction bit position selected on the basis of the magnitude relationship between reproduction RF signal level at the time of level judgment of channel bit data immediately before a pair of (k'+1) and reproduction RF signal level at the time of level judgment of channel bit data immediately after the (k'+1) period.

25. A data decoding apparatus as set forth in claim 21, wherein the correction bit position detecting section outputs a correction bit position designation signal to designate correction bit position selected on the basis of the magnitude relationship between the leading channel bit data within a pair of (k'+1) period and the last channel bit data within the (k'+1) period.

26. A data decoding apparatus as set forth in claim 25, wherein the correction bit position detecting section outputs a correction bit position designation signal to designate, as correction bit position, smaller side of difference between reproduction RF signal level and comparison level at the time of level judgment of the leading channel bit data within the (k'+1) period and difference between reproduction RF signal level and the comparison level at the time of level judgment of the last channel bit data within the (k'+1) period.

27. A data decoding apparatus as set forth in claim 21, wherein the correction bit position detecting section outputs a correction bit position designation signal to designate correction bit position selected on the basis of the magnitude relationship between reproduction RF signal level at the time of level judgment of the leading channel bit data within a pair of (k'+1) and reproduction RF signal level at the time of level judgment of the last channel bit data within the (k'+1) period.

28. A data decoding apparatus as set forth in claim 20, wherein the data correcting section inverts logic level of data at bit position designated on the basis of the correction bit position designation signal from the correction bit position detecting section to thereby carry out correction processing.

29. A data decoding apparatus in a data reproducing equipment for a recording medium on which there are recorded recording codes in which the maximum run length of the same symbols after recording codes in which the maximum run length of "0" falling (assigned) between successive "1" within code series is k are subjected to NRZI modulation is expressed as k'=k+1, the apparatus comprising:
a (k+1) detecting section for detecting channel bit data in which run length of "0" after undergone inverse NRZI modulation is (k+1);
a correction bit position detecting section for outputting a correction bit position designation signal to designate correction position of channel bit data in which the run length of "0" is (k+1) detected by the (k+1) detecting section; and
a data correcting section for carrying out, on the basis of the correction bit position designation signal from the correction bit position detecting section, correction processing of the channel bit data in which the run length of "0" is (k+1) detected by the (k+1) detecting section so that the run length of "0" becomes equal to k.

30. A data decoding apparatus as set forth in claim 29, wherein a reproduction RF signal which has been read out from the recording medium is decoded by at least one comparison level to output channel bit data in which the maximum run length of "0" falling (assigned) between successive "1" within the code series is k.

31. A data decoding apparatus as set forth in claim 30, wherein the correction bit position detecting section outputs a correction bit position designation signal to designate correction bit position selected on the basis of the magnitude relationship between channel bit data immediately before a pair of (k+1) and channel bit data immediately after the (k+1) period.

32. A data decoding apparatus as set forth in claim 31, wherein the correction bit position detecting section outputs a correction bit position designation signal to designate, as correction bit position, larger side of difference between reproduction RF signal level and comparison level at the time of level judgment of channel bit data immediately before the (k+1) period and difference between reproduction RF signal level and the comparison level at the time of level judgment of channel bit data immediately after the (k+1) period.

33. A data decoding apparatus as set forth in claim 30, wherein the correction bit position detecting section outputs a correction bit position designation signal to designate correction bit position selected on the basis of the magnitude relationship between reproduction RF signal level at the time of level judgment of channel bit data immediately before a pair of (k+1) and reproduction RF signal level at the time of level judgment of channel bit data immediately after the (k+1) period.

34. A data decoding apparatus as set forth in claim 30, wherein the correction bit position detecting section outputs a correction bit position designation signal to designate correction bit position selected on the basis of the magnitude relationship between the leading channel bit data within a pair of (k+1) and the last channel bit data within the (k+1) period when (k+1)≧2.

35. A data decoding apparatus as set forth in claim 34, wherein the correction bit position detecting section outputs a correction bit position designation signal to designate, as correction bit position, smaller side of difference between reproduction RF signal level and comparison level at the time of level judgment of the leading channel bit data within the (k+1) period and difference between reproduction RF signal level and the comparison level at the time of level judgment of the last channel bit data within the (k+1) period.

36. A data decoding apparatus as set forth in claim 30, wherein the correction bit position detecting section outputs a correction bit position designation signal to designate correction bit position selected on the basis of the magnitude relationship between reproduction RF signal level at the time of level judgment of the leading channel bit data within a pair of (k+1) and reproduction RF signal level at the time of level judgment of the last channel bit data within the (k+1) period when (k+1)≧2.

37. A data decoding apparatus as set forth in claim 29, wherein the data correcting section inverts logic level of data at bit position designated on the basis of the correction bit position designation signal from the correction bit position detecting section to further invert logic level of data at bit position at the outside of a period of (k+1) at the designated bit position to thereby carry out correction processing.

38. A data decoding apparatus as set forth in claim 29, wherein the data correcting section shifts data of "1" at bit position designated on the basis of the correction bit position designation signal from the correction bit position detecting section to data at the outside of a period of (k+1) to thereby carry out correction processing.

39. A data decoding apparatus in a data reproducing equipment for a recording medium on which there are recorded recording codes in which the minimum run length of the same symbols after recording codes which satisfy d≧2 of recording codes in which the minimum run length of "0" falling (assigned) between successive "1" within code series is d are subjected to NRZI modulation is expressed as d'=d+1, the apparatus comprising:
a (d'−2) detecting section for detecting channel bit data in which run length of the same symbols is (d'−2);
a correction bit position detecting section for outputting a correction bit position designation signal to designate correction position of channel bit data in which the run length of the same symbols is (d'−2) detected by the (d'−2) detecting section; and a data correcting section for carrying out, on the basis of the correction bit position designation signal from the correction bit position detecting section, correction processing of the channel bit data in which the run length of the same symbols is (d'−2) detected by the (d'−2) detecting section so that the run length of the same symbols becomes equal to d'.

40. A data decoding apparatus as set forth in claim 39, wherein a reproduction RF signal which has been read out from the recording medium is decoded by at least one comparison level to output channel bit data.

41. A data decoding apparatus as set forth in claim 40, wherein the correction bit position detecting section outputs a correction bit position designation signal to designate, as correction bit position, bit immediately before a period of (d'−2) and bit immediately after the (d'−2) period.

42. A data decoding apparatus as set forth in claim 41, wherein the data correcting section carries out correction processing to invert logic level of bit.

43. A data decoding apparatus in a data reproducing equipment for a recording medium on which there are recorded recording codes in which the minimum run length of the same symbols after recording codes which satisfy d≧2 of recording codes in which the minimum run length of "0" falling (assigned) between successive "1" within code series is d are subjected to NRZI modulation is expressed as d'=d+1, the apparatus comprising:
a (d−2) detecting section for detecting channel bit data in which run length of "0" after undergone inverse NRZI modulation is (d−2);
a correction bit position detecting section for outputting a correction bit position designation signal to designate correction position of channel bit data in which the run length of "0" is (d−2) detected by the (d−2) detecting section; and
a data correcting section for carrying out, on the basis of the correction bit position designation signal from the correction bit position detecting section, correction processing of the channel bit data in which the run length of "0" is (d−2) detected by the (d−2) detecting section so that the run length of "0" becomes equal to d.

44. A data decoding apparatus as set forth in claim 43, wherein a reproduction RF signal which has been read out from the the recording medium is decoded by at least one comparison level to output channel bit data.

45. A data decoding apparatus as set forth in claim 44, wherein the correction bit position detecting section outputs a correction bit position designation signal to designate, as correction bit position, bits immediately before and immediately after a period of (d−2).

46. A data decoding apparatus as set forth in claim 45, wherein the data correcting section inverts logic level of bit that the correction bit position detecting section designates to further invert logic levels of bits at both sides adjacent thereto.

47. A data decoding apparatus in a data reproducing equipment for a recording medium on which there are recorded recording codes in which the maximum run length of the same symbols after recording codes in which the maximum run length of "0" falling (assigned) between successive "1" within code series is k are subjected to NRZI modulation is expressed as k'=k+1, the apparatus comprising:
a (k'+2) detecting section for detecting channel bit data in which run length of the same symbols is (k'+2);
a correction bit position detecting section for outputting a correction bit position designation signal to designate correction position of channel bit data in which the run length of the same symbols is (k'+2) detected by the (k'+2) detecting section; and
a data correcting section for carrying out, on the basis of the correction bit position designation signal from the correction bit position detecting section, correction processing of the channel bit data in which the run length of the same symbols is (k'+2) detected by the (k'+2) detecting section so that the run length of the same symbols becomes equal to k'.

48. A data decoding apparatus as set forth in claim 47, wherein a reproduction RF signal which has been read out from the recording medium is decoded by at least one comparison level to output channel bit data.

49. A data decoding apparatus as set forth in claim 48, wherein the correction bit position detecting section outputs a correction bit position designation signal to designate, as correction bit position, the leading bit and the last bit of a period of (k'+2).

50. A data decoding apparatus as set forth in claim 49, wherein the data correcting section inverts logic level of bit that the correction bit position detecting section designates.

51. A data decoding apparatus in a data reproducing equipment for a recording medium on which there are recorded recording codes in which the maximum run length of the same symbols after the maximum run length of "0" falling (assigned) between successive "1" within code series is k are subjected to NRZI modulation is expressed as k'=k+1, the apparatus comprising:
a (k+2) detecting section for detecting channel bit data in which run length of "0" after undergone inverse NRZI modulation is (k+2);
a correction bit position detecting section for outputting a correction bit position designation signal to designate correction position of channel bit data in which the run length of "0" is (k+2) detected by the (k+2) detecting section; and
a data correcting section for carrying out, on the basis of the correction bit position designation signal from the correction bit position detecting section, correction processing of the channel bit data in which the run length of "0" is (k+2) detected by the (k+2) detecting section.

52. A data decoding apparatus as set forth in claim 51, wherein a reproduction RF signal which has been read out from the recording medium is decoded by at least one comparison level to output channel bit data.

53. A data decoding apparatus as set forth in claim 52, wherein the correction bit position detecting section outputs a correction bit position designation signal to designate, as correction bit position, the leading bit and the last bit of a period of (k+2).

54. A data decoding apparatus as set forth in claim 53, wherein the data correcting section inverts logic level of bit that the correction bit position detecting section designates to further invert logic levels of bits at both sides thereof.

* * * * *